United States Patent
Asai et al.

(10) Patent No.: US 6,272,737 B1
(45) Date of Patent: *Aug. 14, 2001

(54) CIRCUIT COMPONENT MOUNTING SYSTEM

(75) Inventors: Koichi Asai, Nagoya; Shinsuke Suhara, Kariya, both of (JP)

(73) Assignee: Fuji Machine Mfg. Co., Ltd., Chiryu (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/025,575

(22) Filed: Feb. 18, 1998

(30) Foreign Application Priority Data

| Feb. 24, 1997 | (JP) | 9-038842 |
| Nov. 7, 1997 | (JP) | 9-306163 |

(51) Int. Cl.⁷ ........................... H05K 3/30
(52) U.S. Cl. ............... 29/740; 29/739; 29/742; 29/783; 29/786; 29/791; 29/793; 29/794; 29/832; 29/834; 29/822; 198/369.1; 198/890.1
(58) Field of Search ............... 29/739, 740, 741, 29/742, 832, 834, 793, 794, 786, 783, 791, 822; 198/369.1, 890.1

(56) References Cited

U.S. PATENT DOCUMENTS

| 4,744,139 | * | 5/1988 | Shinano et al. | 29/740 X |
| 5,495,661 | * | 3/1996 | Gromer et al. | 29/740 |
| 5,661,090 | * | 8/1997 | Otani | 29/740 X |
| 5,680,936 | * | 10/1997 | Beers | 209/564 |
| 5,850,689 | * | 12/1998 | Mogi et al. | 29/740 X |

FOREIGN PATENT DOCUMENTS

| 61-140412 | 6/1986 | (JP) . |
| 63-61133 | 11/1988 | (JP) . |
| 2-49560 | 10/1990 | (JP) . |

* cited by examiner

*Primary Examiner*—Lee Young
*Assistant Examiner*—Rick Kiltae Chang
(74) *Attorney, Agent, or Firm*—Oliff & Berridge, PLC.

(57) ABSTRACT

A system for mounting circuit components on a circuit substrate, including a circuit-substrate supporting device which supports the circuit substrate, a circuit-component mounting device which mounts, at a circuit-component mounting position, the circuit components on the circuit substrate supported by the circuit-substrate supporting device, and a circuit-substrate carry-out device which carries out the circuit substrate on which the circuit components have been mounted, the circuit-substrate carry-out device comprising a removing device which removes the circuit substrate from the circuit-substrate supporting device, and a parallel-direction carry-out device which receives the circuit substrate from the removing device and carries out the circuit substrate in a parallel direction substantially parallel to a plane of the circuit substrate, the circuit substrate being transferred from the circuit-substrate supporting device to the removing device in a first direction substantially perpendicular to the plane of the circuit substrate, and is transferred from the removing device to the parallel-direction carry-out device in a second direction opposite to the first direction.

19 Claims, 45 Drawing Sheets

CIRCUIT COMPONENT MOUNTING SYSTEM

BACKGROUND OF THE INVENTION

1. Field of the Invention

The present invention relates to a system and a method for mounting circuit components ("CCs") on a circuit substrate ("CS").

2. Related Art Statement

FIG. 45 shows a known CC mounting system 900 including a CS supporting device 912 which supports a CS 920, 921; a CC mounting device (not shown) which mounts, at a CC mounting position, CCs on the CS 920, 921 supported by the CS supporting device 912; a CS carry-in device 914 which carries in the CS 920, 921 and transfers the CS 920, 921 to the CS supporting device 912; and a CS carry-out device 916 which receives, from the CS supporting device 912, the CS 920, 921 on which the CCs have been mounted, and carries out the CS 920, 921. The CS carry-in and carry-out devices 914, 916 are provided along a CS carrying route on which the CS 920, 921 is carried, and the CC mounting device is provided at the CC mounting position offset from the CS carrying route. The CC supporting device 912 includes a main holding device 918 which holds the CS 920, 921, and a main-holding-device moving device which moves the main holding device 918 horizontally and vertically. Thus, the CS 920, 921 held by the main holding portion 918 is horizontally moved between the CC mounting position where the CCs are mounted on the CS 920, 921 by the CC mounting device and a CS transferring position where the CS 920, 921 is transferred from the CS carry-in device 914 and to the CS supporting device 912, and is transferred from the CS supporting device 912 to the CS carry-out device 916, and where the CS 920, 921 is vertically moved between a movement height position where the CS 920, 921 is moved for the CCs to be mounted thereon and a transferring height position where the CS 920, 921 is transferred between the CS supporting device 912 and the CS carry-in and carry-out devices 914, 916.

In the first step shown in FIG. 45, the CS 920 is carried in by the CS carry-in device 914; and, in the second step, the CS 920 is transferred to, and held by, the main holding device 918 being positioned at the CS transferring position and the transferring height position, while the CS 920 is moved in a direction (i.e., horizontal direction) substantially parallel to the plane of the CS 920. In the third step, the main holding device 918 holding the CS 920 is lowered to the movement height position and then is horizontally moved to the CC mounting position where the CCs are mounted on the CS 920. In the second step, the CS 921 on which the CCs have been mounted is transferred, at the CS transferring position and the transferring height position, to the CS carry-out device 916, while the CS 921 is moved in the horizontal direction. Thus, the CS 920 is transferred from the CS carry-in device 914 to the CS supporting device 912, while the CS 921 is concurrently transferred from the CS supporting device 912 to the CS carry-out device 916. This CS transferring operation (i.e., the transferring of the CS 920 onto the CS supporting device 912 and the transferring of the CS 921 from the same 912) needs a long time of about 5 seconds, as illustrated in FIG. 46. In particular, it is difficult to accelerate the transferring of the CS 921 from the CS supporting device 912 to the CS carry-out device 916. Meanwhile, if the acceleration and/or deceleration of movement of the CS 921 are/is increased to solve this problem, the CCs mounted on the CS 921 might move because the CCs have only temporarily been fixed to the CS 921 with solder paste or uncured adhesive.

SUMMARY OF THE INVENTION

It is therefore an object of the present invention to provide a circuit component mounting system which enjoys improved operation efficiency.

It is another object of the present invention to provide a circuit component mounting method which enjoys improved operation efficiency.

The present invention provides a circuit component mounting system and a circuit component mounting method which have one or more of the technical features which are described below in respective paragraphs given parenthesized sequential numbers (1) to (18). Any technical feature which includes another technical feature shall do so by referring, at the beginning, to the parenthesized sequential number given to that technical feature. Thus, two or more of the following technical features may be combined, if appropriate. Each technical feature may be accompanied by a supplemental explanation, as needed.

(1) According to a first feature of the present invention, there is provided a system for mounting circuit components on a circuit substrate, comprising a circuit-substrate supporting device which supports the circuit substrate; a circuit-component mounting device which mounts, at a circuit-component mounting position, the circuit components on the circuit substrate supported by the circuit-substrate supporting device; and a circuit-substrate carry-out device which carries out the circuit substrate on which the circuit components have been mounted, the circuit-substrate carry-out device comprising a removing device which removes the circuit substrate from the circuit-substrate supporting device, and a parallel-direction carry-out device which receives the circuit substrate from the removing device and carries out the circuit substrate in a parallel direction substantially parallel to a plane of the circuit substrate, wherein the circuit substrate is transferred from the circuit-substrate supporting device to the removing device in a first direction substantially perpendicular to the plane of the circuit substrate, and is transferred from the removing device to the parallel-direction carry-out device in a second direction opposite to the first direction. In the present circuit-component mounting system, the CS (circuit substrate) which is supported by the CS supporting device and on which the CCs (circuit components) have been mounted is removed in the first direction by the removing device, and the removed CS is transferred in the second direction to the parallel-direction carry-out device. The CS transferred to the parallel-direction carry-out device is carried out by being moved in the parallel direction. Thus, in the present system, the removing of the CS from the CS supporting device and the transferring of the CS to the parallel-direction carry-out device are performed in the first and second directions, respectively, each of which is perpendicular to the plane of the CS. In the case where the removing device comprises a holding device which holds the CS, the holding device is only required to be able to remove and transfer the CS in the first and second directions each perpendicular to the plane of the CS, and is not required to be able to remove the CS in the first direction and transfer the CS in the parallel direction. Accordingly, the holding device enjoys a simple construction, which leads to reducing the production cost of the present system. In the case where each of the CS supporting device, the removing device, and the parallel-direction carry-out device comprises a holding device which holds the CS, the respective holding devices of the CS supporting device and the removing device, or the respective holding devices of the removing device and the parallel-direction carry-out device are required to face each other in a state in which the CS can be transferred between the two holding devices. However, if in this state one of the two holding devices is moved in the parallel direction, the other holding device may interfere with the parallel-direction movement of the one holding device. Accordingly, it is desirable that the two holding devices be separated from each other before one of them is moved in the parallel direction. In other words, it is desirable that the CS be transferred between the two holding devices in the first or second direction, in a state in which the holding devices are nearer to each other than they are when one of them is moved in the parallel direction. To this end, it is possible that both of the two holding devices be moved in the first or second direction, or that one of them be fixed and the other be movable in the first or second direction.

(2) According to a second feature of the present invention which includes the first feature (1), the circuit-component mounting system further comprises a parallel-direction carry-in device which carries in the circuit substrate in the parallel direction; and a mounting device which mounts, on the circuit-substrate supporting device, the circuit substrate carried in by the parallel-direction carry-in device, wherein the circuit substrate is transferred from the parallel-direction carry-in device to the mounting device in the first direction, and is transferred from the mounting device to the circuit-substrate supporting device in the second direction. In the present CC mounting system, the transferring of the CS from the parallel-direction carry-out device to the mounting device and the mounting of the CS by the mounting device on the CS supporting device are performed in the first and second directions, respectively, each of which is perpendicular to the plane of the CS. In the case where the mounting device comprises a holding device which holds the CS, the mounting device is only required to be able to receive and mount the CS in the first and second directions each perpendicular to the plane of the CS, and is not required to be able to receive the CS in the parallel direction and mount the CS in the second direction. Accordingly, the holding device enjoys a simple construction. In the case where the CS supporting device comprises a main holding device which holds the CS, the mounting device comprises a holding device which holds the CS, and the main holding device is moved toward the holding device of the mounting device when the CS is mounted by the mounting device on the CS supporting device, it is possible to regard a device which moves the main holding device, as an element of the mounting device.

(3) According to a third feature of the present invention which includes the second feature (2), at least one of the removing device and the mounting device comprises a holding device which holds the circuit substrate; and a holding-device moving device which moves the holding device in the parallel direction. The transferring of the CS from the CS supporting device to the removing device and the transferring of the CS from the removing device to the parallel-direction carry-out device may he performed in the first and second directions, respectively, in such a manner that at a CS removing position, the CS on the CS supporting device is held by a holding device of the removing device and is removed in the first direction and, at a CS transferring position, the CS is transferred from the holding device to the parallel-direction carry-out device. In the case where the CS removing position and the CS transferring position are distant from each other in the parallel direction, the holding-device moving device moves the holding device in the parallel direction between the CS removing and transferring positions. Similarly, the transferring of the CS from the parallel-direction carry-in device to the mounting device and the transferring of the CS from the mounting device to the CS supporting device may be performed in the first and second directions, respectively, in such a manner that at a CS receiving position, the CS is transferred in the first direction from the parallel-direction carry-in device to a holding device of the mounting device and, at a CS mounting position, the CS is mounted in the second direction from the holding device of the mounting device onto the CS supporting device. In the case where the CS receiving position and the CS mounting position are distant from each other in the parallel direction, the holding-device moving device moves the holding device in the parallel direction between the CS receiving and mounting positions.

(4) According to a fourth feature of the present invention which includes the third feature (3), the holding-device moving device comprises a speed control device which controls a speed of the parallel-direction movement of the holding device. The holding-device moving device moves the holding device which may, or may not, be holding the CS. It is preferred that when the holding device is holding the CS, the parallel-direction movement of the holding device be controlled at a low speed and, when the holding device is not holding the CS, the parallel-direction movement be controlled at a high speed.

(5) According to a fifth feature of the present invention which includes any one of the second to fourth features (2) to (4), at least one of the removing device and the mounting device comprises a holding device which comprises (a) at least one main member, (b) a first holding member and a second holding member which include respective holding portions and which are supported by the at least one main member such that the first and second holding members are opposed to each other and at least one of the first and second holding members is movable relative to the other holding member, and (c) a holding-member moving device which moves the at least one of the first and second holding members relative to the other holding member such that the holding portion of the one holding member is moved toward, and away from, the other holding member in a movement direction in which the first and second holding members are opposed to each other, and wherein the respective holding portions of the first and second holding members have respective circuit-substrate supporting surfaces which are positioned away from opposite end portions of the circuit substrate, respectively, in the movement direction, in a state in which the first and second holding members are positioned away from each other, and are positioned below the opposite end portions of the circuit substrate, respectively, in a state in which the first and second holding members are positioned near to each other. In the state in which the first and second holding members are positioned near to each other, the respective CS supporting surfaces thereof are positioned below the opposite end portions of the CS, respectively, so that those CS supporting surfaces cooperate with each other to support a lower surface of the CS. Meanwhile, in the state in which the first and second holding members are positioned away from each other, the CS supporting surfaces are positioned away from the opposite end portions of the CS, respectively, in the movement direction, so that those CS supporting surfaces cannot support the lower surface of the CS. Thus, the holding device can receive and transfer the CS in the first and second directions, respectively, which are perpendicular to the plane of the CS, and is not required to be able to receiver or transfer the CS in the parallel direction. Accordingly, the present holding device does not need any of a plurality of rotatable support members and a rotatable-support-member rotating device which cooperate with each other to transfer a CS in the parallel direction.

(6) According to a sixth feature of the present invention which includes the fifth feature (5), the respective holding portions of the first and second holding members additionally have respective circuit-substrate positioning surfaces which cooperate with each other to position the circuit substrate in the movement direction, by contacting opposite side surfaces of the circuit substrate, respectively, in the state in which the first and second holding members are positioned near to each other. Small spaces may be left between the two positioning surfaces and the corresponding side surfaces of the CS. In this case, too, the two positioning surfaces can substantially position the CS by limiting the movement of the CS in the movement direction. Thus, it is not essentially required that the two positioning surfaces completely sandwich the CS. In the present system, the first and second holding members can support the lower surface of the CS while positioning the CS in the movement direction.

(7) According to a seventh feature of the present invention which includes the fifth or sixth feature (5) or (6), the holding portion of the first holding member includes a plurality of first holding claws which are arranged in an array in a perpendicular direction perpendicular to the movement direction, and the holding portion of the second holding member includes a plurality of second holding claws which are arranged in an array in the perpendicular direction. In the case where another or second holding device which receives the CS from, or transfers the CS to, the present or first holding device, comprises two holding members similar to the present first and second holding members having the first and second arrays of holding claws, the first and second holding devices may hold the CS such that the first holding claws of the first holding device are alternate with those of the second holding device on the CS and the second holding claws of the first holding device are alternate with those of the second holding device on the CS. In the last case, the CS can be transferred between the first and second holding devices, while the two holding devices are prevented from interfering with each other.

(8) According to an eighth feature of the present invention which includes any one of the fifth to seventh features (5) to (7), the first and second holding members comprise respective pivotable holding members which are supported by the at least one main member such that each of the pivotable holding members is pivotable about an axis line parallel to the plane of the circuit substrate. In this case, the pivotable holding members can be supported by the at least one main member, using a simple mechanism. The present holding device can be said as a pivot-type holding device.

(9) According to a ninth feature of the present invention which includes the eighth feature (8), the holding device further comprises at least one pivoting device which pivots the pivotable holding members to a holding position thereof where the pivotable holding members cooperate with each other to hold the circuit substrate and to a releasing position thereof where the pivotable holding members release the circuit substrate, and wherein the at least one pivoting device comprises (a) at least one fluid-operated cylinder device which includes a housing and a piston axially movable relative to the housing, and (b) at least one motion converting device which converts the axial movement of the piston into rotation and transmits the rotation to each of the pivotable holding members. In the present CC mounting system, the axial movement of the piston of the at least one fluid-operated cylinder device is converted, by the at least one motion converting device, into rotation, which is transmitted to each of the pivotable holding members. The pivotal movement of the pivotable holding members switches the holding device between its holding state and its releasing state. Each motion converting device may comprise a cam mechanism including a cam and a cam follower. For example, a semi-circular member and a stick-like member are employed as the cam and the cam follower, respectively. A tip end of the stick-like member has a semi-cylindrical or semi-spherical surface, or supports a rotatable roller or ball, which engages an outer circumferential surface of the semi-circular member. A portion of the semi-circular member which corresponds to the center of the semi-circle is attached to each of the pivotable holding members such that the semi-circular member is not rotatable relative to the each holding member. When the piston is moved, the sticklike member is axially moved, so that the semi-circular member is pivoted and accordingly the each holding member is pivoted. Thus, the stick-like member as the cam follower functions as a driver, and the semi-circular member as the cam functions as a follower. However, the motion converting device may be provided by a mechanism other than the cam mechanism, such as a link mechanism. The at least one pivoting device may be provided on either the at least one main member of the holding device, or at least one main member of the removing device or the mounting device, or otherwise may be divided into a plurality of portions one of which is provided on the at least one main member of the holding device and the other or another of which is provided on the at least one main member of the removing device or the mounting device. For example, the at least one fluid-operated cylinder device is provided on the at least one main member of the removing device or the mounting device, and at least a portion of the at least one motion converting device is provided on the at least one main member of the holding device. In the case where the holding device is moved in the parallel direction by the holding-device moving device according to the third feature (3), a portion of the at least one pivoting device which is provided on the at least one main member of the holding device is moved with the holding device in the parallel direction. If the entirety of the pivoting device is provided on the main member of the holding device, the entirety of the pivoting device is moved with the holding device in the parallel direction. Meanwhile, if a portion, or the entirety of, the pivoting device is provided on the main member of the removing or mounting device, that portion or the entirety of the pivoting device is not moved with the holding device. For example, in the case where the at least one fluid-operated cylinder device is provided on the at least one main member of the removing or mounting device, and at least a portion of the at least one motion converting device is provided on the at least one main member of the holding device, only that portion, or the entirety of, the motion converting device is moved with the holding device. In this case, the at least one fluid-operated cylinder device may consist of a single fluid-operated cylinder device which actuates the at least one motion converting device wherever the at least one main member of the holding device may be positioned, or may comprise a plurality of fluid-operated cylinder devices which are provided at a plurality of positions (operative positions), respectively, to which the main member of the holding device is moved. In the case where the entirety of the pivoting device is provided on the main member of the holding device, the present system enjoys a simplified construction, though the mass which is moved with the holding device is increased. In the case where the entirety of the pivoting device is provided on the main member of the removing or mounting device, the present system can reduce the mass which is moved with the holding device, though the construction thereof is complicated because, for example, the cam of the motion converting device is required to be able to engage and disengage from each pivotable holding member of the holding device, while permitting the parallel-direction movement of the holding device. And, in the case where the pivoting device is divided into a plurality of portions one of which is provided on the main member of the holding device and the other of which is provided on the main member of the removing or mounting device, for example, a plurality of fluid-operated cylinder devices are provided on the main member of the removing or mounting device, and the at least one motion converting device including the above-described cam mechanism is provided on the at least one main member of the holding device. In the last case, though the holding device is movable in the parallel direction, the holding device can be easily switched between its CS holding and releasing states, by positioning the cam mechanism relative to each of the cylinder devices such that a piston rod of the each cylinder device is opposed to the stick-like member of the cam mechanism, so that when the piston rod is axially moved, the stick-like member is also axially moved. Thus, the construction of the present system is not complicated so much, and the mass which is moved with the holding device is not increased so much.

(10) According to a tenth feature of the present invention which includes any one of the third to ninth features (3) to (9), the holding device comprises at least one pressing member which presses an upper surface of the circuit substrate, and at least one supporting device which supports the at least one pressing member such that the pressing member is movable upward and downward. In the present CC mounting system, the holding device may sandwich the CS between the at least one pressing member and at least one holding projection. Since the pressing member is supported such that the pressing member is movable downward toward, and upward away from, the holding projection, the pressing member can appropriately press each of CSs having different thickness values. In addition, when the holding device is moved in the parallel direction, the pressing member prevents the CS from being moved out of position in the parallel direction. The at least one supporting device may comprise a spring member which biases the at least one pressing member downward toward the at least one holding projection. In the last case, the biasing force of the spring member causes the CS to be pressed downward, which assures that the CS is received and transferred stably and quickly.

(11) According to an eleventh feature of the present invention which includes any one of the second to tenth features (2) to (10), at least one of the parallel-direction carry-out device and the parallel-direction carry-in device comprises a pair of main members having respective inside surfaces opposed to each other; a pair of first circuit-substrate supporting members which are attached to the respective inside surfaces of the pair of main members and which support, for the parallel-direction movement of the circuit substrate, opposite end portions of the circuit substrate, respectively, which extend parallel to a circuit-substrate carrying direction in which the circuit substrate is carried; at least one second circuit-substrate supporting member which is provided between the pair of first circuit-substrate supporting members, and which is movable upward and downward relative to the pair of main members; and at least one elevating and lowering device which moves the second circuit-substrate supporting member upward and downward. In the present CC mounting system, the CS is moved upward and downward when the second CS supporting member is moved upward and downward. Since the second CS supporting member is provided between the first CS supporting members, an intermediate portion of the CS between the opposite end portions thereof is supported by the second CS supporting device. Thus, the second CS supporting member is separate from the first CS supporting members. Accordingly, the state in which the CS is supported by the first CS supporting members is quickly switchable to, and from, the state in which the CS is supported by the second CS supporting member. In the case where the removing device or the mounting device comprises a holding device of a type which holds opposite end portions of each CS, the second CS supporting device does not interfere with the transferring of the CS from the parallel-direction carry-in device to the mounting device in the first direction or the transferring of the CS from the removing device to the parallel-direction carry-out device in the second direction. Thus, the CS can easily be transferred. The parallel-direction carry-in device may comprise the second CS supporting member, and the mounting device may comprise a holding device which holds the CS. In this case, when the mounting device receives the CS from the carry-in device, the second CS supporting member which is holding the CS is moved upward, so that the holding device of the mounting device holds respective lower surfaces of opposite end portions of the CS. Subsequently, the second CS supporting member is moved downward, and the CS is held by the mounting device. It is desirable that the second CS supporting member be provided in a downstream-side portion of the parallel-direction carry-in device. The parallel-direction carry-out device may comprise the second CS supporting member. In this case, when the CS is transferred from the removing device to the parallel-direction carry-out device, the second CS supporting member is moved upward toward the CS whose opposite end portions are held by the removing device. After the second CS supporting device contacts the lower surface of the CS, the removing device releases the CS, so that the CS is supported on the second CS supporting member. After the second CS supporting member is moved downward to a position where the upper surface of the second CS supporting member is lower than those of the first CS supporting members, the CS is held by the first CS supporting members. It is desirable that the second CS supporting member be provided in an upstream-side portion of the parallel-direction carry-out device. Thus, in the present CC mounting system, the transferring of the CS from from the parallel-direction carry-in device to the mounting device in the first direction and the transferring of the CS from the removing device to the parallel-direction carry-out device in the second direction can be easily performed. In the case where the mounting device comprises a holding device which includes at least one pressing member according to the tenth feature (10), and at least one pressing-member supporting device comprising at least one spring member, the CS is transferred from the parallel-direction carry-in device to the mounting device, as follows: In the case where the parallel-direction carry-in device comprises the second CS supporting member, the second CS supporting member which is holding the CS is moved upward, so that the upper surface of the CS contacts the pressing member and moves the pressing member upward against the biasing force of the spring member. After the pivotable holding members of the holding device are pivoted and accordingly the holding device is switched to its holding state, the second CS supporting member is moved downward, so that because of the biasing force of the spring member, the CS is pressed against the CS supporting surfaces of the pivotable holding members and is stably sandwiched by the holding claws and pressing member. Similarly, in the case where the mounting device comprises a holding device which includes at least one pressing member according to the tenth feature (10), and at least one pressing-member supporting device comprising at least one spring member, the CS is transferred from the removing device to the parallel-direction carry-out device, as follows: In the case where the parallel-direction carry-out device comprises the second CS supporting member, the second CS supporting member is moved upward, so that the upper surface of the second CS supporting member contacts the lower surface of the CS, and moves the pressing member upward against the biasing force of the spring member. Thus, the CS is pressed against the second CS supporting member. In this state, if the pivotable holding members of the holding device are pivoted and accordingly the holding device is switched to its releasing state, the CS is released from the removing device. Therefore, when the second CS supporting member is moved downward, the CS is moved downward, so that the CS is supported on the first CS supporting members of the parallel-direction carry-out device. For example, the two first CS supporting members may be provided by a pair of conveyor belts, and the second CS supporting member may be provided by a CS support plate. The CS support plate may be one having a shape which assures that the CS support plate supports substantially the entire lower surface of the CS except the respective lower surfaces of the opposite end portions thereof. So long as the CS support plate can keep its horizontal attitude when moving the CS upward and downward, the CS support plate may be provided by either a single plate member or a plurality of separate plate members.

(12) According to a twelfth feature of the present invention which includes the eleventh feature (11), the at least one elevating and lowering device comprises a speed control device which controls a speed of the upward and downward movement of the at least one second circuit-substrate supporting member. The second CS supporting member is moved upward and downward while supporting the CS, or while not supporting a CS. The speed control device may control the speed of the upward and downward movement of the second CS supporting member such that while the second CS supporting member supports the CS, the speed is low and, while the second CS supporting member does not support a CS, the speed is high. In the case where the CS is transferred between the mounting or removing device comprising the at least one pressing member and the parallel-direction carry-in or carry-out device, it is desirable that the speed of upward movement of the second CS supporting member be low, so that the pressing member may contact the CS at the low speed.

(13) According to a thirteenth feature of the present invention which includes any one of the second to twelfth features (2) to (12), at least one of the parallel-direction carry-out device and the parallel-direction carry-in device comprises at least one stopping device which stops the parallel-direction movement of the circuit substrate, and the at least one stopping device comprises (a) an intermediate stopper which is provided between an upstream end and a downstream end of a circuit-substrate carrying route on which the circuit substrate is carried, and which stops the parallel-direction movement of the circuit substrate, (b) a stopper supporting member which supports the intermediate stopper such that the intermediate stopper is movable to an operative position thereof where the stopper can stop the circuit substrate and to an inoperative position thereof where the stopper cannot stop the circuit substrate, and (c) a stopper moving device which moves the intermediate stopper relative to the stopper supporting member and thereby moves the intermediate stopper to each of the operative and inoperative positions thereof. The intermediate stopper is used for stopping the parallel-direction movement of the CS at an intermediate position between the upstream and downstream ends of the CS carrying route, and keeping the CS at the intermediate position. If it is needed to stop the CS at the intermediate position corresponding to the intermediate stopper, the stopper is moved to its operative position and, if not, the stopper is moved to its inoperative position. Whether the stopper should be moved to its operative or inoperative position depends on the dimension of the CS in the CS carrying direction, etc. For example, in the case where the parallel-direction carry-out device comprises the above-described first CS supporting members and the first CS supporting members comprise a pair of conveyor belts, a plurality of CSs may be transferred from the removing device to the carry-out device, so that the plurality of CSs are supported on the conveyor belts with an appropriate distance being left therebetween in the CS carrying direction. In this state, when an intermediate stopper provided between adjacent two CSs is moved to its operative position and the conveyor belts are activated, only the more or most downstream CS is moved in the parallel direction while one or more upstream CSs are kept still by one or more intermediate stoppers, respectively. In the case where two or more upstream CSs are stopped by two or more intermediate stoppers, those upstream CSs are kept still with respective appropriate distances being left between each pair of adjacent CSs, e.g., at a regular interval of distance. Subsequently, when the more or most downstream intermediate stopper is moved to its inoperative position, the CS which has been stopped by that stopper is carried out. In this way, all the upstream CSs that have been stopped are carried out one by one in the order from the most downstream one of them toward the most upstream one. Since one or more intermediate stoppers are movable to its or their operative and inoperative position, the stopper or stoppers can be called as a movable stopper or stoppers. Meanwhile, in the case where the parallel-direction carry-in device comprises the above-described first CS supporting members and the first CS supporting members comprise a pair of conveyor belts, a plurality of CSs may be carried in by being moved in the parallel direction on the conveyor belts. In this case, the first CS is stopped by the more or most downstream intermediate stopper being at its operative position, or a downstream-end stopper fixed at a downstream end of a CS carrying route. Subsequently, another or second intermediate stopper positioned on an upstream side of the first CS being stopped is moved from its inoperative position to to its operative position, and the conveyor belts are activated, so that the second CS is carried in and is stopped by the second intermediate stopper. During this step, the first CS remains stopped. In this way, the CSs are carried in one by one so that the CSs are supported on the conveyor belts with respective appropriate distances being left between each pair of adjacent CSs, e.g., at a regular interval of distance. It is desirable that the parallel-direction carry-in device comprise the above-described downstream-end stopper. The downstream-end stopper can be called as a fixed stopper.

(14) According to a fourteenth feature of the present invention which includes the thirteenth feature (13), the at least one of the parallel-direction carry-out device and the parallel-direction carry-in device further comprises at least one main member, and wherein the at least one stopper supporting member of the at least one stopping device is attached to the at least one main member such that a position where the stopper supporting member is attached to the main member is changeable along the circuit-substrate carrying route. In this case, since the position where the stopper supporting member is attached to the main member can be changed along the CS carrying route, the intermediate stopper can be moved to its operative position, at a desirable position along the CS carrying route, so that the CS may be stopped at a position corresponding to that desired position. The position of attachment of the stopper supporting member may be determined depending upon the dimension of the CS in the CS carrying direction, etc. The parallel-direction carry-out or carry-in device may comprise at least one elongate hole which is formed in the at least one main member thereof and extends in the CS carrying direction; and at least one attaching device which attaches the stopper supporting member to the elongate hole. In the last case, the elongate hole and the attaching device cooperate with each other to an adjusting device which adjusts the position of attachment of the stopper supporting member.

(15) According to a fifteenth feature of the present invention which includes any one of the first to fourteenth features (1) to (14), the circuit-substrate supporting device comprises at least one main member; a main holding device which includes (a) at least one axis member supported by the at least one main member such that the at least one axis member is rotatable about an axis line parallel to the plane of the circuit substrate, and (b) a plurality of clamping members which are provided on the at least one axis member such that the clamping members are not rotatable relative to the axis member and each of which includes a clamping claw; and at least one rotating device which rotates the at least one axis member to a clamping position thereof where the respective clamping claws of the clamping members clamp the circuit substrate and a non-clamping position thereof where the clamping claws do not clamp the circuit substrate. When the axis member is rotated by the rotating device, the main holding device is selectively switched to its clamping state in which the clamping claws clamp the CS and to its non-clamping state in which the clamping claws do not clamp the CS.

(16) According to a sixteenth feature of the present invention which includes the fifteenth feature (15), the at least one rotating device comprises at least one fluid-operated cylinder device which is supported by the at least one main member such that the at least one fluid-operated cylinder device is rotatable relative to the main member and which includes a piston rod; and at least one drive lever which is rotatably connected at one end portion thereof to the piston rod of the fluid-operated cylinder device and is engaged at the other end portion thereof to an end portion of the at least one axis member. When the piston rod of the fluid-operated cylinder device is extended or advanced out of a housing thereof, the drive lever is rotated about the other end portion thereof engaged with the end portion of the axis member, so that the axis member is rotated. Since the cylinder device is rotatably supported by the main member of the CS supporting device, the piston rod can be smoothly extended out of the housing and accordingly the drive lever can be smoothly rotated. The rotating device may be regarded as part of the main holding device.

(17) According to a seventeenth feature of the present invention, there is provided a system for mounting circuit components on a circuit substrate, comprising a circuit-substrate supporting device which supports the circuit substrate; a circuit-component mounting device which mounts, at a circuit-component mounting position, the circuit components on the circuit substrate supported by the circuit-substrate supporting device; a circuit-substrate carry-in device which carries in the circuit substrate and transfers the circuit substrate to the circuit-substrate supporting device; and a circuit-substrate carry-out device which carries out the circuit substrate on which the circuit components have been mounted, the circuit-substrate carry-in device comprising (A) a parallel-direction carry-in device which carries in the circuit substrate in a parallel direction substantially parallel to a plane of the circuit substrate, and (B) a mounting device including (b1) first holding device which holds the circuit substrate in a state in which the circuit substrate can be transferred in each of a first direction perpendicular to the plane of the circuit substrate and a second direction opposite to the first direction, and (b2) a first-holding-device moving device which moves the first holding device in the parallel direction, wherein the first holding device receives, at a circuit-substrate receiving position, the circuit substrate carried in by the parallel-direction carry-in device, in the first direction, and mounts the circuit substrate on the circuit-substrate supporting device, in the second direction, at a circuit-substrate mounting position distant from the circuit-substrate receiving position in the parallel direction, the circuit-substrate carry-out device comprising (C) a parallel-direction carry-out device which carries out the circuit substrate on which the circuit components have been mounted, by moving the circuit substrate in the parallel direction, and (D) a removing device including (d1) a second holding device which holds the circuit substrate in a state in which the circuit substrate can be transferred in each of the first and second directions, and (d2) a second-holding-device moving device which moves the second holding device in the parallel direction, wherein the second holding device removes, at a circuit-substrate removing position, the circuit substrate from the circuit-substrate supporting device, in the first direction, and transfers the circuit substrate to the parallel-direction carry-out device, in the second direction, at a circuit-substrate transferring position distant from the circuit-substrate removing position in the parallel direction, wherein the first-holding-device moving device and the second-holding-device moving device comprise a common drive source which produces a drive force to move each of the first holding device and the second holding device. In the present CC mounting system, the first and second holding devices are moved in the parallel direction by the common drive source. Since the two holding devices do not need respective exclusive drive sources, the production cost of the present system can be reduced as such. The first and second holding devices may be provided by an integral holding device, which is driven by the common drive source. In the case where the integral holding device is employed in place of two separate holding devices as the first and second holding devices, and is moved in the parallel direction to each of the CS receiving position, the CS mounting position, the CS removing position, and the CS transferring position, the overall distance of movement of the integral holding device exceeds the sum of respective overall movement distances of the two separate holding devices, because the integral holding device has to do additional movements. However, those additional movements can be done while the CCs are mounted on the CS. Thus, the operation efficiency of the present CC mounting system is not adversely influenced. Meanwhile, in the case where the first and second holding devices are provided by two separate holding devices, it is possible to employ a drive-force transmitting device which is selectively switchable to one of a first state in which the transmitting device transmits the drive force of the common drive source to both the two holding devices, a second state in which the transmitting device transmits the drive force to only one of the two holding devices, and a third state in which the transmitting device transmits the drive force to only the other holding device. In the last case, it is possible that the two holding devices be simultaneously moved, and that one of the two holding devices be moved while the other holding device remains stopped.

(18) According to an eighteenth feature of the present invention, there is provided a method of mounting circuit components on a circuit substrate, comprising the steps of mounting the circuit components on the circuit substrate supported by a circuit-substrate supporting device, removing the circuit substrate on which the circuit components have been mounted, from the circuit-substrate supporting device, in a first direction substantially perpendicular to a plane of the circuit substrate, transferring the removed circuit substrate to a parallel-direction carry-out device in a second direction opposite to the first direction, and carrying out the transferred circuit substrate by moving the circuit substrate whose plane extends substantially horizontally, in a parallel direction substantially parallel to the plane of the circuit substrate. In the present CC mounting method, the CS is removed and transferred in the first and second directions, respectively, both of which are perpendicular to the plane of the CS. Accordingly, the CS can be quickly transferred from the CS supporting device to the parallel-direction carry-out device, which contributes to improving the efficiency of the CC mounting operation. The present CC mounting method may be implemented by the CC mounting system according to any one of the above-described first to seventeenth features (1) to (17).

BRIEF DESCRIPTION OF THE DRAWINGS

The above and optional objects, features, and advantages of the present invention will be better understood by reading the following detailed description of the preferred embodiment of the invention when considered in conjunction with the accompanying drawings, in which.

DETAILED DESCRIPTION OF THE PREFERRED EMBODIMENTS

Figure 1:
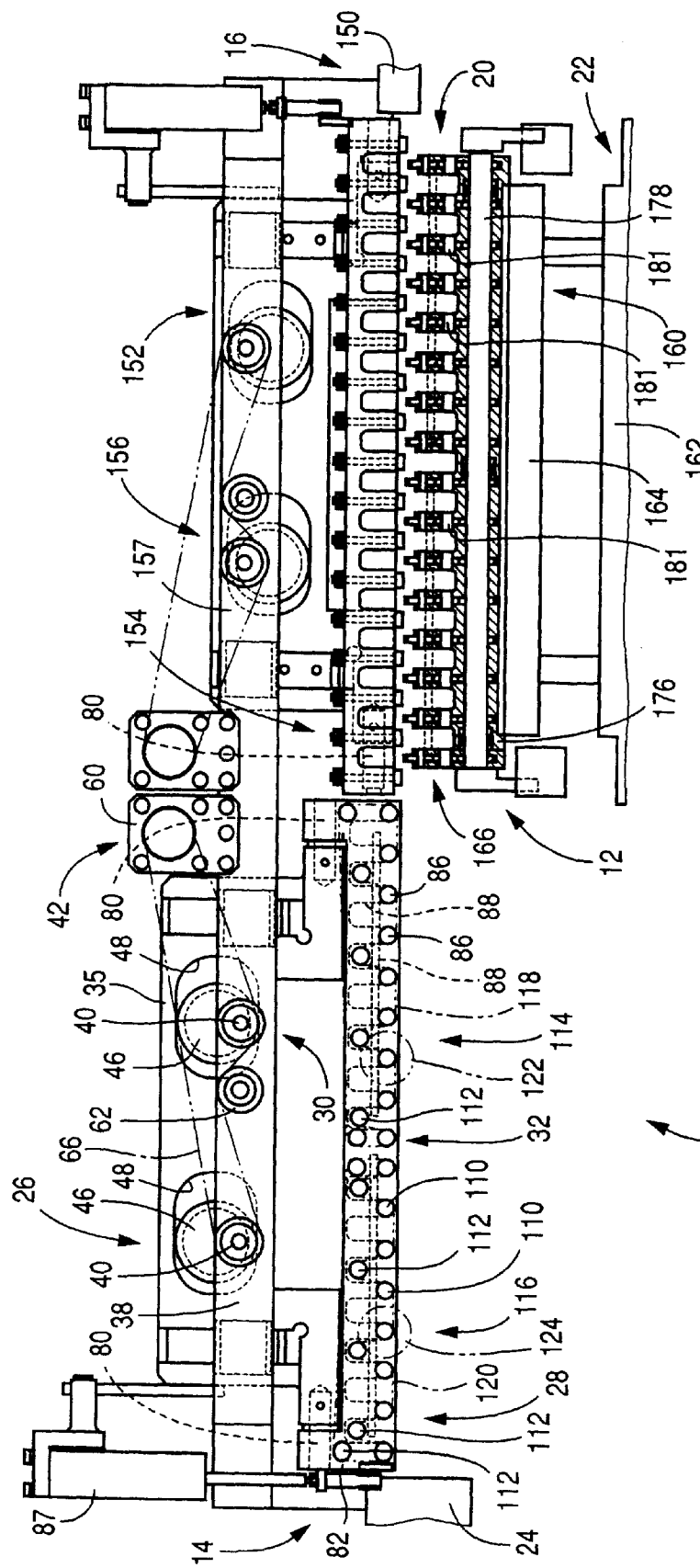
FIG. 1 is a front elevation view of a circuit component ("CC") mounting system to which the present invention is applied.

Referring to the drawings, there will be described a circuit component ("CC") mounting system 8 embodying the present invention. The CC mounting system 8 implements a CC mounting method also embodying the present invention.

Figure 2:
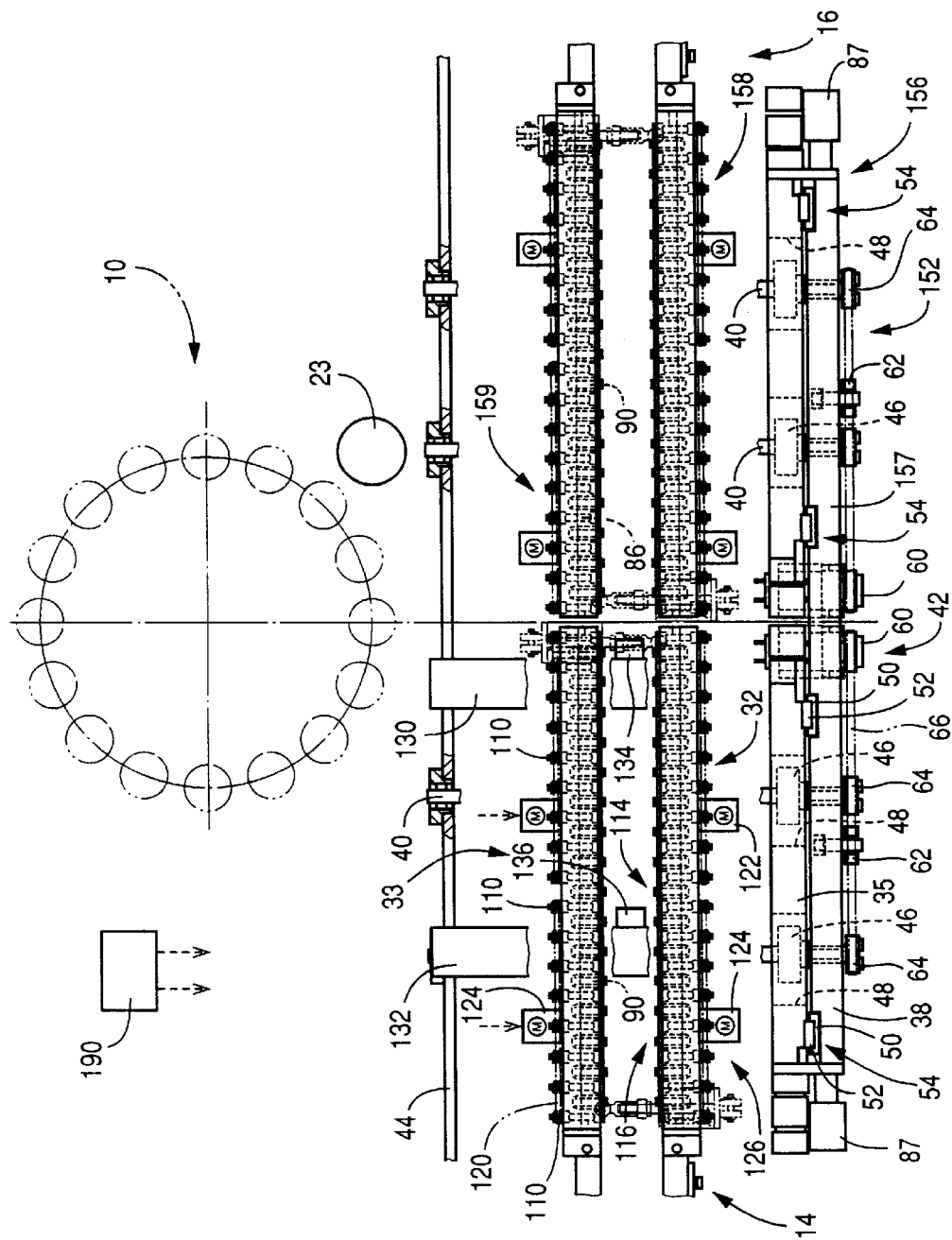
FIG. 2 is a plan view of the CC mounting system of FIG. 1.
Figure 3:
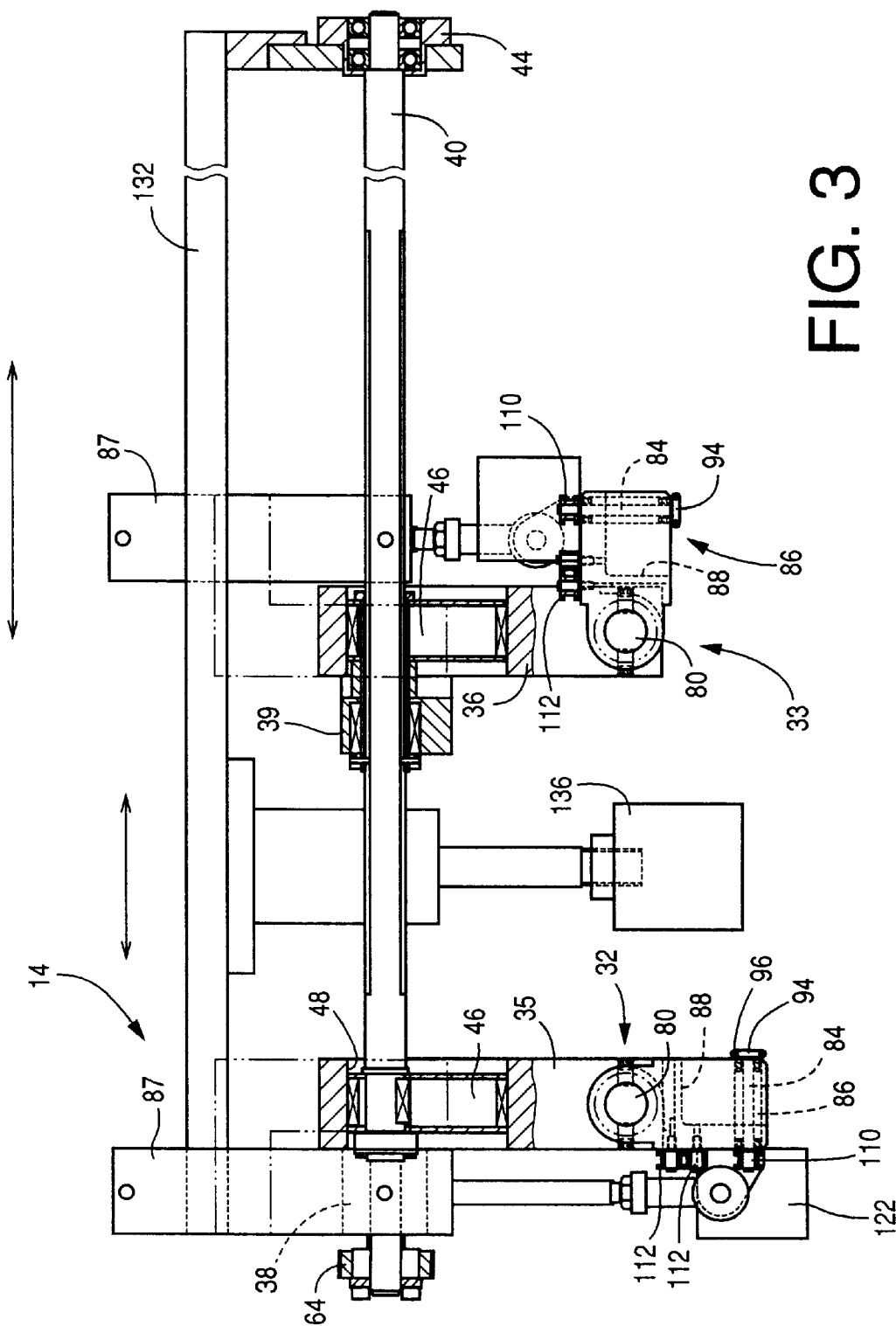
FIG. 3 is a partly cross-sectioned, side elevation view of a circuit substrate ("CS") carry-in device of the CC mounting system of FIG. 1.

As shown in FIGS. 1, 2, and 3, the CC mounting system 8 includes a CC mounting device 10 (FIG. 2) which mounts, at a CC mounting position, CCs on a circuit substrate ("CS"); a CS supporting device 12 which supports the CS at at least the CC mounting position; a CS carry-in device 14 which carries in the CS and transfers the CS to the CS supporting device 12; and a CS carry-out device 16 which receives, from the CS supporting device 12, the CS on which the CCs have been mounted, and carries out the CS. The CS carry-in and carry-out devices 14, 16 are provided adjacent to each other on a CS carrying route on which the CS is carried, and the CC mounting device 10 is provided at the CC mounting position offset from the CS carrying route. The CC supporting device 12 includes a main CS-holding device 20 which holds the CS, and a main-holding-device moving device 22 which moves, in a horizontal plane, the main CS-holding device 20 to the CC mounting position, a CS mounting position where the CS is mounted on the CS supporting device 12 by the CS carry-in device 14, and a CS removing position where the CS is removed from the CS supporting device 12 by the CS carry-out device 16.

The CS carried in by the CS carry-in device 14 is mounted on the CS supporting device 12 at the CS mounting position, and the mounted CS is moved to the CC mounting position in an X direction and a Y direction normal to the X direction in the horizontal plane. At the CC mounting position, a camera 23 reads fiducial marks provided on the CS and subsequently the CC mounting device 10 mounts CCs on the CS. The CS on which the CCs have been mounted is moved to the CS removing position where the CS is removed by the CS carry-out device 16, which then carries out the CS.

The CS carry-in device 14 includes a CS horizontal-carry-in ("HCI") device 24 and a CS mounting device 26. The CS HCI device 24 carries in a CS supplied from a CS supplying device (not shown), in a horizontal direction, and transfers the CS to the CS mounting device 26 in the horizontal direction. The CS HCI device 24 includes a conveyor device (not shown) including a pair of conveyor belts and a drive device for moving the conveyor belts and thereby moving the CS in the horizontal direction.

The CS mounting device 26 receives, in the horizontal direction, the CS moved to the CS mounting position, holds the CS, and mounts the CS on the CS supporting device 12 in a vertically downward direction substantially perpendicular to the plane of the CS. The CS mounting device 26 includes a CS holding device 28, and an elevating and lowering device 30 which elevates and lowers the CS holding device 28 in a Z direction perpendicular to the X and Y directions. The CS holding device 28 includes a pair of pivotable holding portions 32, 33 which are opposed to each other and which are pivotally supported by a pair of elevating and lowering members 35, 36 of the elevating and lowering device 30, respectively.

The elevating and lowering device 30 includes, in addition to the elevating and lowering members 35, 36, two main members 38, 39 which support the two elevating and lowering members 35, 36, respectively, such that the elevating and lowering members 35, 36 are vertically movable; two drive shafts 40; and a drive device 42. The two drive shafts 40 extends through the two elevating and lowering members 35, 36, the two main members 38, 39, and a frame 44 extending in a CS carrying direction, such that the two drive shafts 40 are rotatable relative to the members 35, 36, 38, 39. The first main member 38 and the first elevating and lowering member 35 are attached to the drive shafts 40, such that the two first members 38, 35 are not movable relative to the shafts 40 in an axial direction of the shafts 40; and the second main member 39 and the second elevating and lowering member 36 are attached to the drive shafts 40, such that the two second members 39, 36 are movable relative to the shafts 40 in the axial direction of the shafts 40 and are fixable at a predetermined position to the shafts 40. Thus, the second main member 39 and the second elevating and lowering member 36 are movable toward, and away from, the first main member 38 and the first elevating and lowering member 35. When the second members 39, 36 are moved toward the first members 38, 35, the second pivotable holding portion 33 is moved toward the first pivotable holding portion 32, so that the CS holding device 28 can hold a CS of a sort having a small width; and, when the second members 39, 36 are moved away from the first members 38, 35, the second pivotable holding portion 33 is moved away from the first pivotable holding portion 32, so that the CS holding device 28 can hold a CS of a sort having a great width. Thus, the elevating and lowering device 30 has the function of adjusting the distance between the two pivotable holding portions 32, 33, owing to the movement of the second pivotable holding portion 33 relative to the first pivotable holding portion 32. Thus, the CS mounting device 26 can mount various sorts of CSs having different widths, on the CS supporting device 12. The main members 38, 39 and the frame 44 provide main portions of the CS holding device 28.

Two eccentric cams 46 are fixed to each of the two drive shafts 40, such that the eccentric cams 46 are not rotatable relative to the each drive shaft 40. Each of the two elevating and lowering members 35, 36 has two elliptic holes 48 each of which is elongate in a horizontal direction. Each of the four eccentric cams 46 is engaged with a corresponding one of the four elliptic holes 48 via a needle bearing, such that the each eccentric cam 46 is not movable relative to the corresponding elliptic hole 48 in the Z direction. Each of the two main members 38, 39 has two guide grooves 50 which extend in the Z direction and each of which has a generally U-shaped cross section (however, only the grooves 50 of the main member 38 are shown in FIG. 2). Each of the two elevating and lowering members 35, 36 has two guide projections 52 which are engaged with the two guide grooves 50 of a corresponding one of the two main members 38, 39 (however, only the projections 52 of the elevating and lowering member 35 are shown in FIG. 2). Owing to the guide grooves 50 and the guide projections 52, the elevating and lowering members 35, 36 are moved in the Z direction while being prevented from being moved in the X or Y direction. Thus, each of the four guide grooves 50 and a corresponding one of the four guide projections 52 cooperate with each other to provide a guide device 54.

Figure 4:
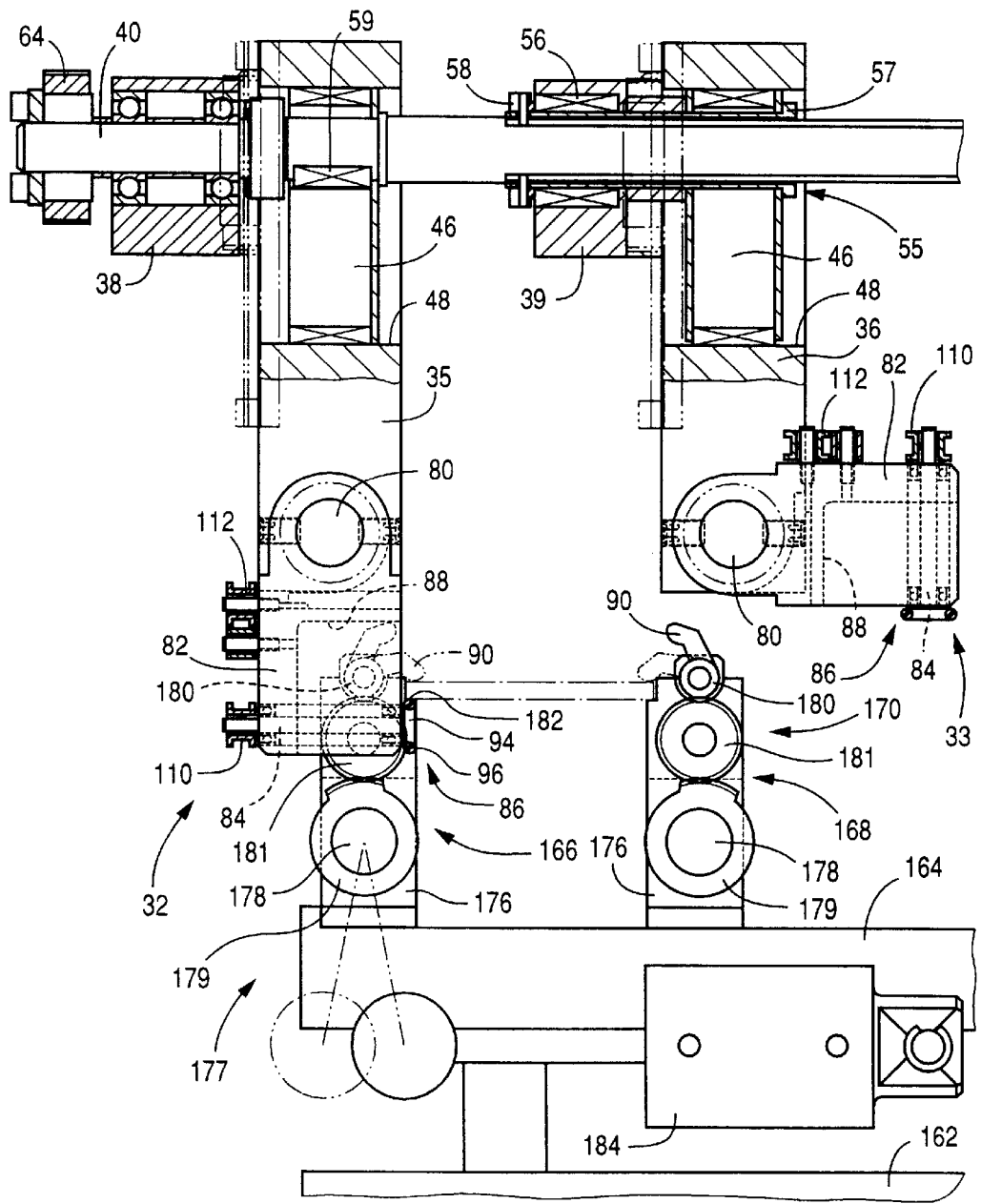
FIG. 4 is an enlarged view of a CS transferring device of the CC mounting system of FIG. 1.

As shown in FIG. 4, each of the drive shafts 40 has a spline groove in which a spacer 55 fits such that the spacer 55 is not rotatable relative to the each drive shaft 40 and is movable in the axial direction thereof relative thereto. The main member 39 is attached to the spacer 55 via a bearing 56 such that the main member 39 is rotatable relative to the spacer 55, and the eccentric cam 46 associated with the elevating and lowering member 36 is attached to the spacer 55 via a key (not shown) such that the cam 46 is not rotatable relative to the spacer 55. The spacer 55 has a flange 57 at one of axially opposite end portions thereof, and has a plurality of radial holes formed in an outer circumferential surface of the other axial end portion thereof. A spline pin 58 fits in each of the radial holes. Thus, the main member 39 and the eccentric cam 46 are sandwiched by the spline pins 58 and the flange 57 in the axial direction of the spacer 55, and is fixed relative to the spacer 55 in the axial direction thereof. A spacer which is provided between the main member 39 and the eccentric cam 46, cooperates with the flange 57 to position the cam 46 in the axial direction of the drive shaft 40. Thus, the main member 39, the elevating and lowering member 36, and the spacer 55 are moved as a unit in the axial direction of the drive shaft 40. When the drive shaft 40 is rotated, the spacer 55 is rotated with the shaft 40, and the rotation of the spacer 55 is transmitted to the eccentric cam 46 via the key. However, the rotation of the spacer 55 is not transmitted to the main member 39.

The main member 38 and the elevating and lowering member 35 are attached to the drive shaft 40 such that those members 38, 35 are not movable relative to the drive shaft 40 in the axial direction thereof. The main member 38 is attached to the drive shaft 40 via a bearing such that the main member 38 is rotatable relative to the drive shaft 40, and the eccentric cam 46 is attached to the drive shaft 40 via a key 59 such that the cam 46 is not rotatable relative to the shaft 40.

The drive device 42 includes an electric motor 60, a guide pulley 62, the two drive shafts 40, two timing pulleys 64 associated with the two drive shafts 40, respectively, and a belt 66 wound on the guide pulley 62 and the timing pulleys 64. The rotation of the electric motor 60 is transmitted to the drive shafts 40 via the belt 66 and, the rotation of the drive shafts 40 causes the rotation of the eccentric cams 46. Thus, the elevating and lowering members 35, 36 are elevated and lowered while being guided by the guide devices 54. Each time the eccentric cams 46 are rotated by 180 degrees, the elevating and lowering members 35, 36 are elevated from their lowermost position to their uppermost position, or are lowered from their uppermost position to their lowermost position.

As the speed of rotation of the drive shafts 40 increases, the speed of upward and downward movement of the elevating and lowering members 35, 36 increases. However, since the upward and downward movement of the elevating and lowering members 35, 36 is caused by the rotation of the eccentric cams 46, the speed of upward and downward movement of the members 35, 36 becomes substantially zero in the vicinity of their uppermost and lowermost positions, even if the speed of rotation of the drive shafts 40 may be constant. Thus, the speed of upward and downward movement of the members 35, 36 smoothly changes between their uppermost and lowermost positions. Thus, the upward and downward movement of the CS can be started and ended at a low acceleration and/or a low deceleration, which contributes to reducing the impact exerted to the CS and thereby preventing the CCs from being moved out of position on the CS. In addition, the elevating and lowering members 35, 36 can be moved to their uppermost and lowermost positions with high accuracy. Moreover, this arrangement contributes to reducing the vibration and/or noise produced by the CS mounting device 26.

The two pivotable holding portions 32, 33 are pivotally attached to the two elevating and lowering members 35, 36, respectively. When the members 35, 36 are elevated and lowered, the holding portions 32, 33 are elevated and lowered between a CS-receiving height position where the holding portions 32, 33 receive, from the CS HCI device 24, the CS in the horizontal direction parallel to the plane of the CS, and a CS-mounting height position where the holding portions 32, 33 mount the CS on the CS supporting device 12. Thus, the elevating and lowering members 35, 36 also function as main portions of the CS holding device 28.

Next, there will be described the construction of the pivotable holding portion 32 as a representative of the two pivotable holding portions 32, 33 that have an identical construction. As shown in FIG. 4, the holding portion 32 includes a pivotable member 82, and a plurality of rotatable support members 86. The pivotable member 82 is pivotally attached to a horizontal axis member 80 which extends in the CS carrying direction along the elevating and lowering member 35. The rotatable support members 86 are attached to the pivotable member 82 such that the support members 86 are rotatable relative to the pivotable member 82 about respective axis members 84 perpendicular to the axis member 80. The pivotable member 82 is pivoted between its CS holding position where the rotatable support members 82 take their horizontal attitudes, and its CS releasing position where the support members 82 take their vertical attitudes. Thus, the pivotable holding portion 32 can be switched between its CS holding state and its CS releasing state.

The CS is supported by the two pivotable holding portions 32, 33 such that width-wise opposite end portions of the CS are supported on the rotatable support members 86 of the two holding portions 32, 33, respectively. The respective pivotable members 82 of the holding portions 32, 33 are pivoted about the respective axis members 80 by respective air-operated cylinder devices 87.

The pivotable member 82 of the pivotable holding portion 32 supports the plurality of rotatable support members 86 such that the support members 86 are equidistant from one another at an appropriate regular interval of distance along a horizontal straight line. A recess 88 is formed between each pair of adjacent rotatable support members 86. Thus, the support members 86 and the recesses 88 are alternately provided. In a state in which the pivotable member 82 takes its CS holding position, each recess 88 opens in a bottom surface of the pivotable member 82 and an inner surface of the same 82 which is opposed to that of the pivotable member 82 of the other pivotable holding portion 33. Thus, each recess 88 can accommodate a clamp member 90 of the main CS-holding device 20 of the CS supporting device 12, as will be described later.

A support roller 94 is attached to one axial end portion of each of the rotatable support members 86 which portion is to contact or engage the CS. A friction ring 96 covers an outer circumferential surface of the support roller 94. Owing to the friction rings 96, a great friction force is produced between the support members 86 and the CS. Thus, the rotations of the support members 86 can be transmitted to the CS with reliability.

A driven pulley 110 is attached to the other axial end portion of each of the rotatable support members 86 which portion is remote from the support roller 94. A plurality of guide pulleys 112 are rotatably attached to the pivotable member 82 such that the driven pulleys 110 and the guide pulleys 112 are positioned in the same plane. As shown in FIGS. 1 and 2, the driven pulleys 110 and the guide pulleys 112 are grouped into an upstream-side group 114 and a downstream-side group 116 in the CS marrying direction, and a belt 118 is wound on the driven pulleys 110 and the guide pulleys 112 of the upstream-side group 114 and a belt 120 is wound on the pulleys 110, 112 of the downstream-side group 116. The belt 118 is driven by a drive motor 122, and the belt 120 is driven by a drive motor 124. The respective rotations of the two drive motors 122, 124 are synchronized with each other.

In the present embodiment, each of the driven pulleys 110 is a flanged pulley, and some of the guide pulleys 112 are flanged pulleys and the other guide pulleys 112 are non-flanged pulleys. Thus, the belts 118, 120 are easily wound on the pulleys 110, 112 and simultaneously are effectively prevented from coming off the pulleys 110, 112. The driven pulleys 110, the guide pulleys 112, the belts 118, 120, and the drive motors 122, 124 cooperate with one another to provide a rotating device 126 which rotates the rotatable support members 86. When the support members 86 are rotated, the CS supported on the members 86 are moved in the horizontal direction parallel to the plane of the CS. Accordingly, the rotating device 126 and the support members 86 cooperate with each other to provide a CS moving device which moves the CS in a parallel direction parallel to the plane of the CS.

Two frames 130, 132 bridge between the frame 44 and the main member 38 of the elevating and lowering device 30, over the main member 39 and the elevating and lowering members 35, 36. Two positioning devices 134, 136 are attached to the two frames 130, 132, respectively, such that the positioning devices 134, 136 are movable along guide members in a direction perpendicular to the CS carrying direction, i.e., the width-wise direction of the CS. The positioning devices 134, 136 function as CS-carrying-direction CS-positioning devices each of which stops the CS when the CS is carried in the CS carrying direction. The downstream-side positioning device 134 is not vertically movable but the upstream-side positioning device 136 is vertically movable. The positioning device 136 normally takes its upper, inoperative position and, when the second CS is carried in after the first CS, is lowered to its lower, operative position, as will be described later.

Since the positioning devices 134, 136 are movable in the width-wise direction of CSs, those devices 134, 136 can act on a generally middle portion of each of different sorts of CSs having different widths.

The CS carry-out device 16 includes a CS horizontal-carry-out ("HCO") device 150, and a CS removing device 152. The CS HCO device 150 carries out the CS in a horizontal direction parallel to the plane of the CS. The CS removing device 152 removes the CS on which the CCs have been mounted, in the direction of thickness of the CS, i.e., a vertically upward direction perpendicular to the plane of the CS, and transfers the CS to the CS HCO device 150. The CS removing device 152 includes a CS holding device 154 which removes the CS from the CS supporting device 12 and holds the CS, and an elevating and lowering device 156 which elevates and lowers the CS holding device 154 between a CS-removing height position where the CS holding device 154 removes the CS supported on the CS supporting device 12, and a CS-transferring height position where the CS holding device 154 transfers the removed CS to the CS HCO device 150 in the horizontal direction.

The CS HCO device 150 and the CS removing device 152 have respective constructions similar to those of the CS HCI device 24 and the CS mounting device 26, respectively, and the description of the former devices is omitted. It is however noted that a fixed one 157 of two main members of the elevating and lowering device 156 is integral with the fixed main member 38 of the elevating and lowering device 30, and that the CS-carry-out CS holding device 154 includes a pair of pivotable holding portions 158, 159 like the CS-carry-in CS holding device 28.

The CS supporting device 12 includes, in addition to the previously described main CS-holding device 20 and the main-holding-device moving device 22, an elevating and lowering device 160 which elevates and lowers the main CS-holding device 20 in the Z direction. The moving device 22 includes an X-Y table 162 for moving the main CS-holding device 20 in the X and Y directions in the horizontal plane. The elevating and lowering device 160 includes a Z-direction slider 164, and a device which elevates and lowers the Z-direction slider 164. In the present embodiment, the main CS-holding device 20 is provided on the Z-direction slider 164, and the Z-direction slider 164 is provided on the X-Y table 162. Thus, the CS held by the main CS-holding device 20 can be moved in both the horizontal direction and the vertical direction. The main CS-holding device 20 is vertically movable between a CS-mounting height position where the CS mounting device 26 mounts the CS on the main CS-holding device 20, a CS-removing height position where the CS removing device 152 removes the CS from the main CS-holding device 20, a CC-mounting height position where the CCs are mounted on the CS, and a horizontal-movement height position where the main CS-holding device 20 is moved in the horizontal plane. In the present embodiment, the CS-mounting height position is level with the CS-removing height position.

As shown in FIG. 4, the main CS-holding device 20 includes a pair of CS clamping devices 166, 168 which clamp the CS at the width-wise opposite end portions thereof, respectively. The CS clamping device 166 is fixedly provided, and the CS clamping device 168 is provided such that the device 168 is movable relative to the fixed device 166 in the width-wise direction of the CS. There will be described the construction of the CS clamping device 166 as a representative of the two CS clamping devices 166, 168 which have an identical construction. It is noted that the main CS-holding device 20 cooperates with the CS-carry-in CS holding device 28 to provide a first CS transferring device 170, and cooperates with the CS-carry-out CS holding device 154 to provide a second CS transferring device 170.

The CS clamping device 166 includes the previously described clamp members 90, a comb-like main member 176, and a clamp-member pivoting device 177 which pivots the clamp members 90 to a CS clamping position where the clamp members 90 clamp the CS and a CS releasing position where the clamp members 90 release the CS. The clamp-member pivoting device 177 includes a single rotatable axis member 178 which is provided on the main member 176 such that the axis member 178 is rotatable relative to the main member 176; a plurality of drive gears 179 which are provided on the axis member 178 such that the drive gears 179 are not rotatable relative to the axis member 178; a plurality of sector gears 180 which are provided as respective integral portions of the clamp members 90; and a plurality of intermediate gears 181 which are provided between the drive gears 179 and the corresponding sector gears 180. The drive gears 179, the sector gears 180, and the intermediate gears 181 cooperate with one another to provide a rotation transmitting device which transmits the rotation of the axis member 178 to the clamp members 90.

The clamp members 90 are provided on respective upper surfaces of teeth of the comb-like main member 176. The teeth of the main member 176 have respective inner recesses 182. The clamp members 90 cooperate with the inner recesses 182 to clamp the CS. The intermediate gears 181 are meshed with the drive gears 179, respectively, and are meshed with the sector gears 180, respectively. Therefore, the rotation of the axis member 178 is transmitted to the clamp members 90 via the gears 179, 181, and 180, so that the clamp members 90 are pivoted to their CS clamping and CS releasing positions. The axis member 17B is rotated by an air-operated cylinder device 184.

The present CC mounting system 8 includes a control device 190 (FIG. 2) which is essentially provided by a computer and which controls the electric motors 60, 122, 124, etc.

Next, there will be described the operation of the CC mounting system 8 constructed as described above, by reference to FIGS. 8 and 9.

Figure 8:
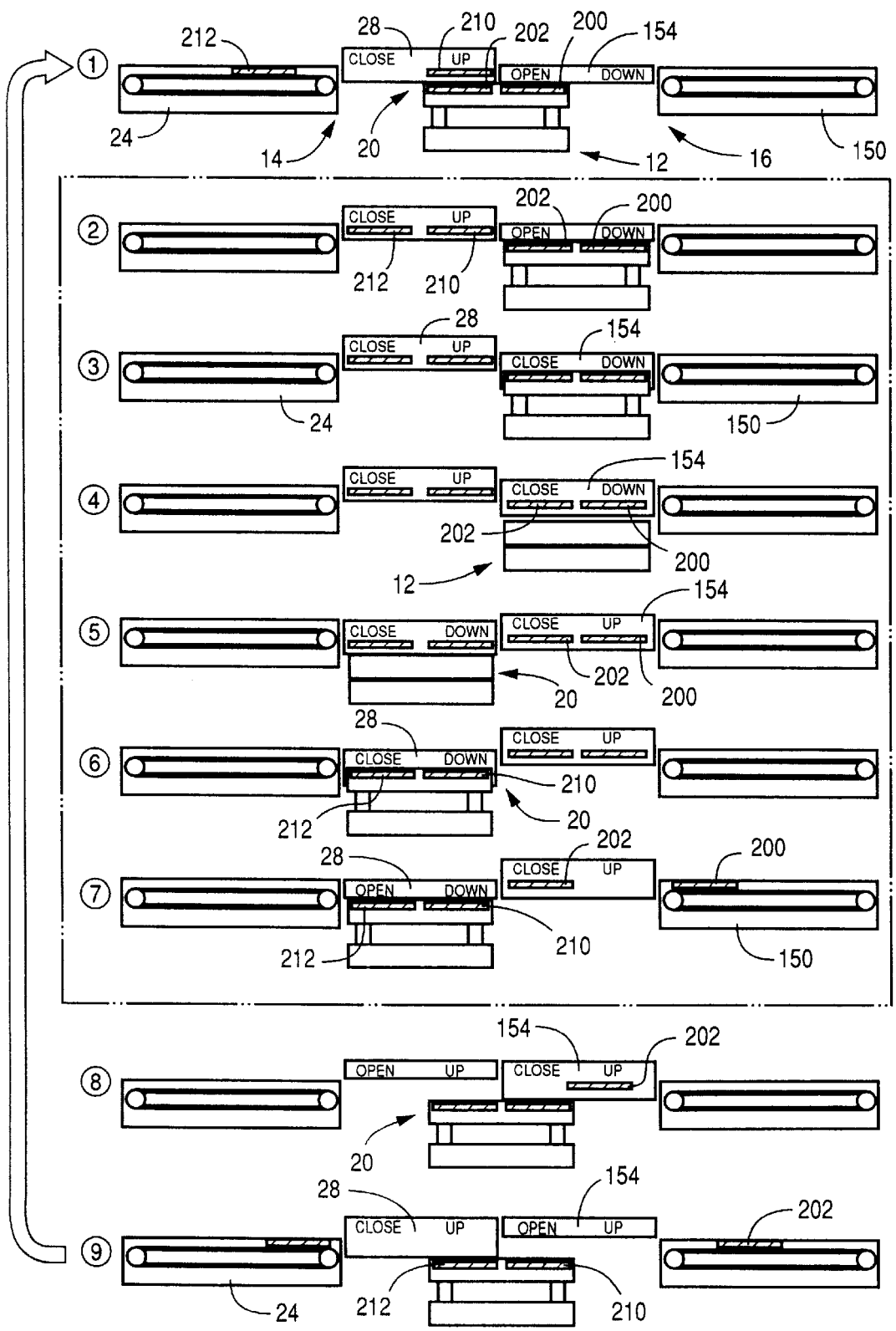
FIG. 8 is a view showing various steps of a CS transferring operation of the CC mounting system of FIG. 1.

The first and second steps illustrated in FIG. 8 are CS carry-in steps. After the CC mounting device 10 finishes mounting CCs on CSs 200, 202, the main CS-holding device 20 which holds the CSs 200, 202 on which the CCs have been mounted is moved, by the main-holding-device moving device 22, from the CC mounting position to the CS removing position in a horizontal direction parallel to the plane of each CS 200, 202. The term "OPEN" used in FIG. 8 indicates that the pair of pivotable members 82 of the CS-carry-in or CS-carry-out CS holding device 28 or 154 take their CS releasing position; the term "CLOSE" indicates that the pair of pivotable members 82 take their CS holding position; the term "UP" indicates that the CS-carry-in or CS-carry-out CS holding device 28 or 154 take their CS receiving or CS transferring height position; and the term "DOWN" indicates that the CS-carry-in or CS-carry-out CS holding device 28 or 154 take their CS mounting or CS removing height position.

Now, the CS-carry-out CS holding device 154 is, at its CS removing position, in a waiting state in which the CS holding device 154 is ready for removing the CSs 200, 202 clamped by the main CS-holding device 20. That is, the CS holding device 154 is at its CS removing height position, and the pivotable members 82 of the CS holding device 154 are at their CS releasing position.

In addition, new CSs 210, 212 are carried in by the CS HCI device 24 in the horizontal direction parallel to the respective planes of the CSs 210, 212, and are transferred to the CS mounting device 26. Both of the drive motors 122, 124 of the CS-carry-in CS holding device 28 are operated, and all the rotatable support members 86 belonging to both the downstream-side and upstream-side groups 114, 116 are rotated. The first CS 210 is moved with the rotation of the support members 86 in the horizontal direction parallel to the plane of the CS 210, until the leading end of the CS 210 butts the downstream-side positioning device 134. In this state, the upstream-side positioning device 136 is at its upper position where the positioning device 136 cannot stop the CS 210. When the CS 210 butts the positioning device 134, the drive motor 122 is stopped and accordingly the CS 210 is stopped there.

Subsequently, the upstream-side positioning device 136 is lowered to its CS positioning height position. Only the drive motor 124 is operated and only the rotatable support members 86 belonging to the upstream-side group 116 are rotated. Since the rotatable support members 86 belonging to the downstream-side group 114 are not rotated, the first CS 210 is prevented from being moved in any direction and accordingly it remains stopped. When the second CS 212 is moved in the horizontal direction parallel to the plane of the CS 212 and the leading end of the CS 212 butts the upstream-side positioning device 136, the drive motor 124 is stopped and the CS 212 is stopped there. Thus, the CS holding device 28 holds the two CSs 210, 212 which have thus been positioned in the CS carrying direction, and waits in this state.

Figure 5:
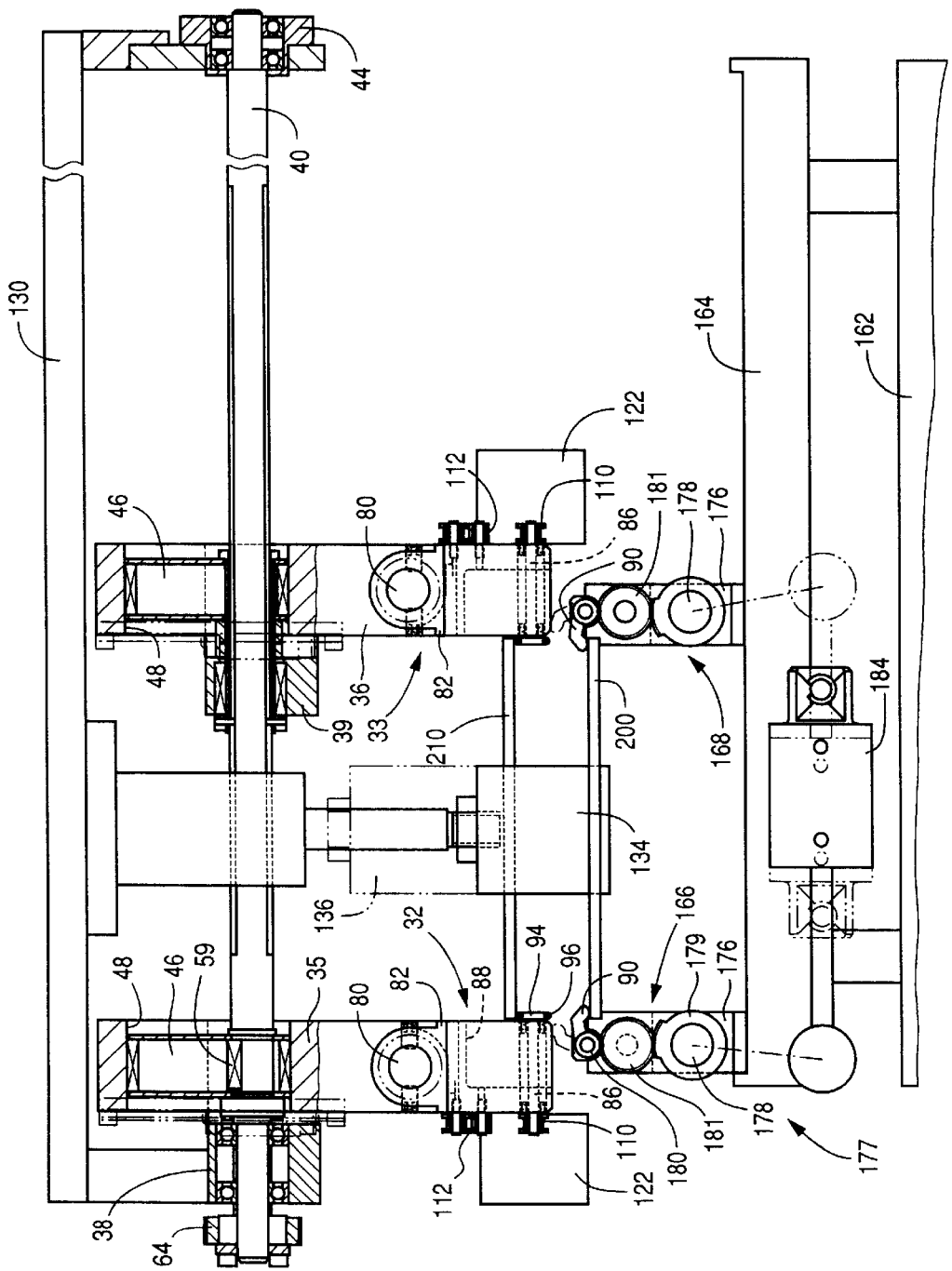
FIG. 5 is a view showing an operation state of the CC mounting system of FIG. 1.

In this way, while CCs are mounted on CSs at the CC mounting position and the CSs on which the CCs have been mounted are moved from the CC mounting position to the CS removing position, new CSs are carried in by the CS HCI device 24 and are transferred to the CS mounting device 26 in the horizontal direction parallel to the planes of the new CSs. Then, the CS holding device 28 waits in this state, as shown in FIG. 5.

Figure 6:
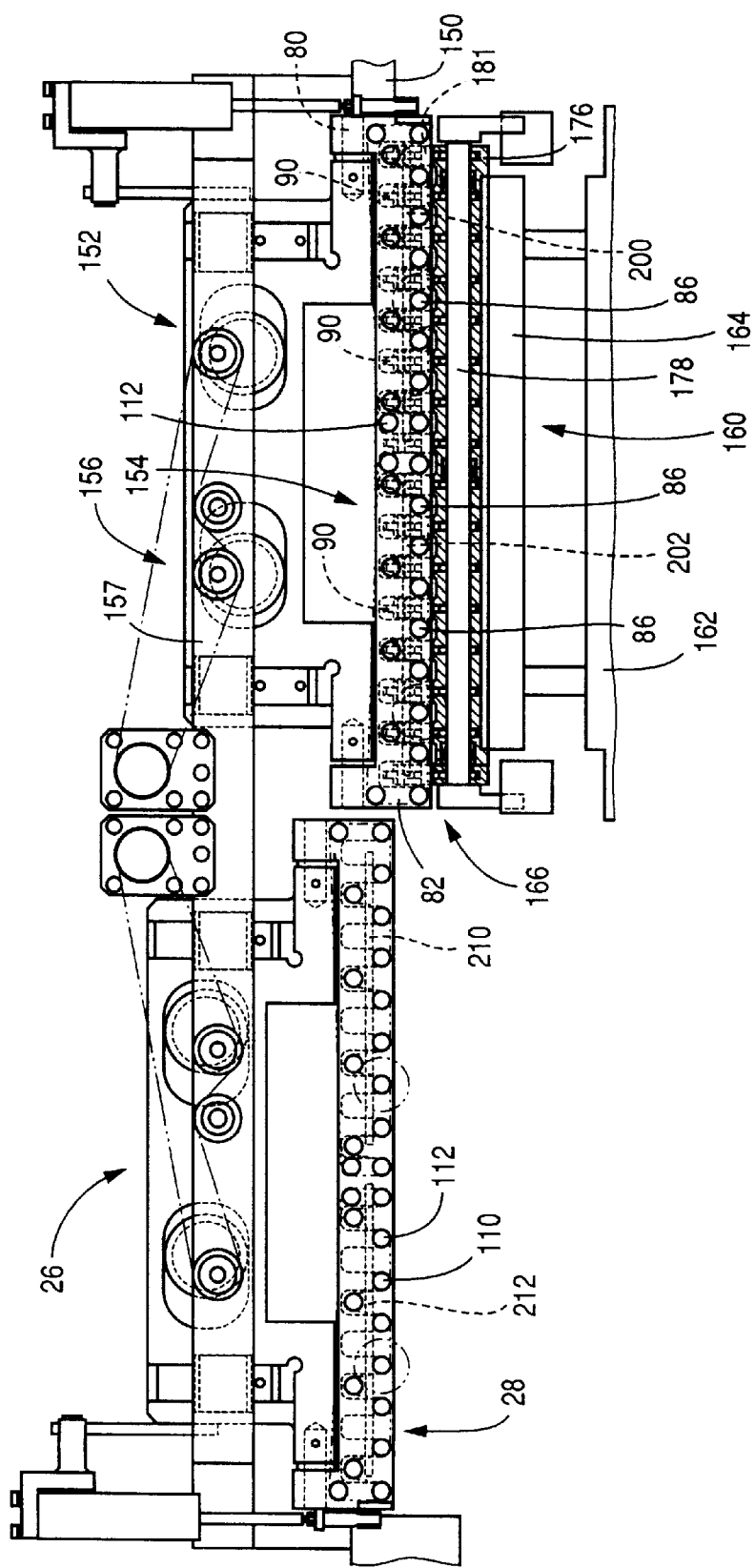
FIG. 6 is a view showing another operation state of the CC mounting system of FIG. 1.

When the main CS-holding device 20 arrives at the CS removing position, the third step shown in FIG. 8, that is, the CS removing step starts. In the CS removing device 152, the pivotable members 82 of the CS-carry-out CS holding device 154 are rotated to their CS holding position and, in the CS supporting device 12, the clamp members 90 are rotated to their CS releasing position. Thus, the two CSs 200, 202 are held by the CS holding device 154 and are simultaneously removed from the CS supporting device 12 in the direction of thickness of each CS 200, 202 perpendicular to the plane of the same 200, 202. While the pivotable members 82 are at their CS holding position, the clamp members 90 are accommodated in the recesses 88, respectively, as shown in FIG. 6. Thus, the clamp members 90 and the rotatable support members 86 are alternate with each other, that is, the CS clamping positions and the CS holding positions are alternate with each other on the CS. Accordingly, the support members 86 and the clamp members 90 do not interfere with each other. Therefore, the clamp members 90 of the main CS-holding device 20 can be rotated between their CS clamping position and their CS releasing position, while simultaneously the pivotable members 82 of the CS-carry-out CS holding device 154 are rotated between their CS releasing position and their CS holding position. Thus, the CS transferring operation can be performed smoothly.

It emerges from the foregoing description that in the present embodiment, when the CSs 200, 202 on which the CCs have been mounted are transferred between the CS supporting device 12 and the CS carry-out device 16, the CSs 200, 202 are not substantially moved, which leads to reducing the impact exerted to the CSs 200, 202 and effectively preventing the CCs from being moved out of position on the CSs 200, 202. In addition, since the CSs 200, 202 are removed in the direction of thickness thereof, the CS removing operation can be finished in a shorter time than that needed when CSs are removed in a direction parallel to the plane of each CS. Moreover, since two CSs 200, 202 can be simultaneously removed, the present system 8 can enjoy improved operation efficiency.

Meanwhile, in the CS mounting device 26, the downward movement of the CS-carry-in CS holding device 28 is started. As previously described, this downward movement is started when the main CS-holding device 20 reaches the CS removing position. After the main CS-holding device 20 reaches the CS mounting position, the main CS-holding device 20 is moved downward to its CS-mounting height position at a low speed, which contributes to reducing the impact exerted to the CSs 200, 202. Although the downward movement of the CS holding device 28 is performed at the low speed, the total time needed for transferring the CSs 200, 202, 210, 212 is not increased, because the downward movement is performed concurrently with the removing of the CSs 200, 202. Since in the present embodiment the CS mounting position and the CS removing position are remote from each other, the operation at the CS mounting position and the operation at the CS removing position can be performed concurrently.

Figure 7:
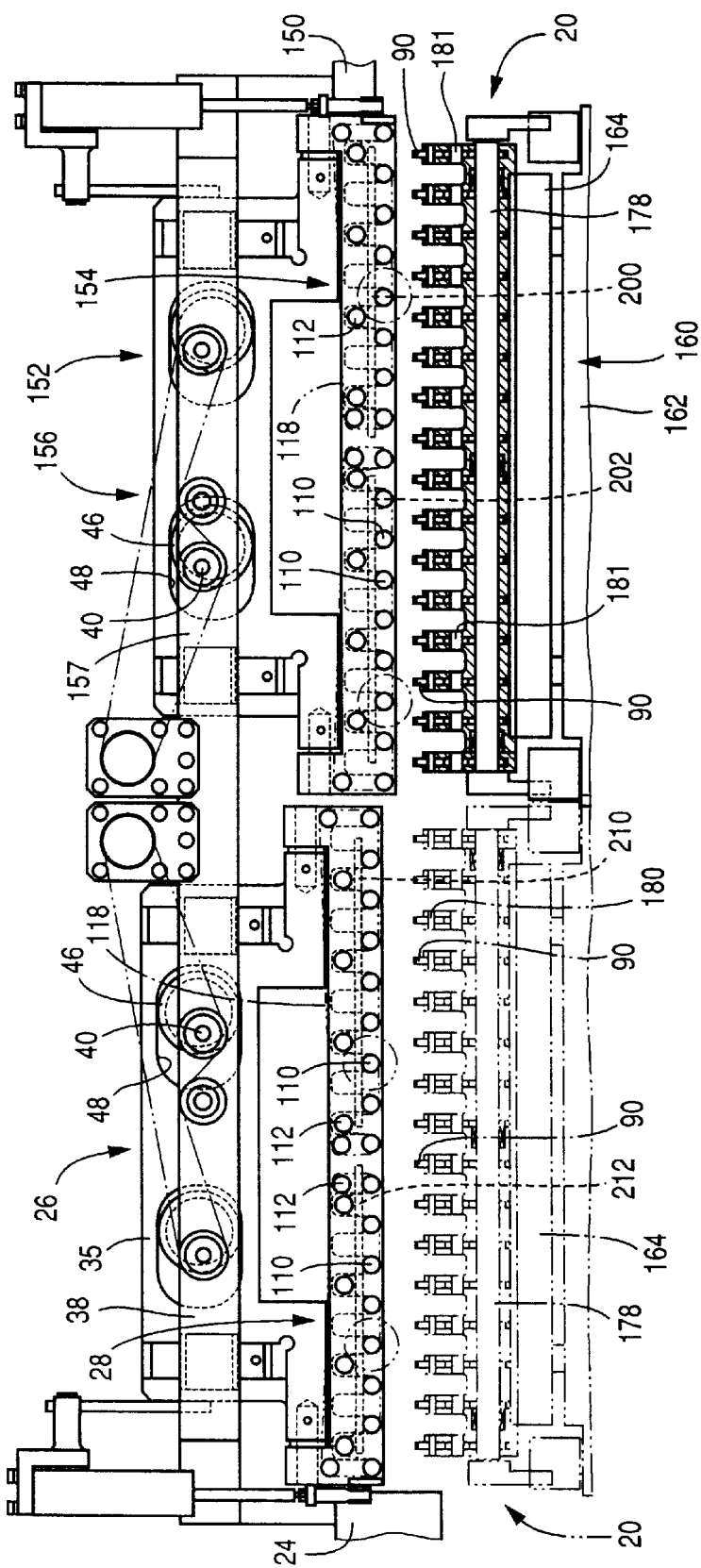
FIG. 7 is a view showing yet another operation state of the CC mounting system of FIG. 1.

At the fourth and fifth steps shown in FIG. 8, the main CS-holding device 20 is lowered to its horizontal-movement height position and then is moved to its CS mounting position in a horizontal direction, as shown in FIG. 7. Since currently the main CS-holding device 20 is not holding any CSs, the downward and horizontal movements of the CS holding device 20 can be quickly performed with an abrupt acceleration and/or an abrupt deceleration. In the known CC mounting system 500 shown in FIG. 14, the main CS-holding portion 518 cannot be moved iii the CS carrying direction. In contrast, in the present CC mounting system 8, the main CS-holding device 20 is moved in the CS carrying direction. Since, however, the CS holding device 20 can be quickly moved in the CS carrying direction as described above, the time needed for the movement of the CS holding device 20 is not increased so much.

The main CS-holding device 20 is lowered before being moved in the horizontal direction, because in the state shown in FIGS. 5 and 6 in which the main CS-holding device 20 and the CS-carry-out CS holding device 154 are at their CS removing positions, the clamp members 90 are accommodated in the recesses 88 of the pivotable members 82 and accordingly interfere with the horizontal movement of the CS holding device 20. In addition, since the CS holding device 154 is holding the CSs 200, 202 and the CS holding device 20 is not holding any CSs, the downward movement of the CS holding device 20 can be performed more quickly than the upward movement of the CS holding device 154, so that the horizontal movement of the CS holding device 20 can be started more rapidly.

After the CSs 200, 202 are removed from the CS supporting device 12, the upward movement of the CS-carry-out CS holding device 154 holding the CSs 200, 202 is started. The CS holding device 154 is moved upward to the CS-transferring height position where the respective lower surfaces of the CSs 200, 202 held thereby are slightly higher than the upper surfaces of the conveyor belts of the CS HCO device 150. Since this upward movement is performed by utilizing the eccentric cams 46, the acceleration and deceleration of the upward movement at the lowermost and uppermost positions of the CS holding device 154 can be made small, which contributes to reducing the impact exerted to the CSs 200, 202 on which the CCs have been mounted, thereby effectively preventing the CCs from being moved out of position on the CSs 200, 202. Since this upward movement is performed concurrently with the horizontal movement of the main CS-holding device 20, the overall time needed for transferring the CSs 200, 202, 210, 212 is not increased although the upward movement is performed at a low speed.

When the main CS-holding device 20 is horizontally moved to its CS mounting position, the sixth step commences, and the main CS-holding device 20 is moved upward to its CS mounting height position. Thus, the clamp members 90 of the main CS-holding device 20 which are at their CS releasing position are accommodated in the recesses 88 of the pivotable members 82 of the CS-carry-in CS holding device 28, and the bottom surfaces of the recesses 182 of the main member 176 of the CS clamping devices 166, 168 engage the lower surfaces of the CSs 210, 212.

The seventh step is the CS mounting and CS carrying-out step. In the CS supporting device 12, the clamp members 90 are pivoted to their CS clamping position and, in the CS-carry-in CS holding device 28, the pivotable members 82 are pivoted to their CS releasing position. Thus, the two CSs 210, 212 are simultaneously mounted on the CS supporting device 12. The CSs 210, 212 are handed smoothly without being moved in the vertical direction, like when the CSs 200, 202 are handed for being removed from the CS supporting device 12. Thus, the impact exerted to the CSs 210, 212 is reduced. Therefore, even if the CSs 210, 212 which are carried in by the CS carry-in device 14 may have some CCs already mounted thereon, those CCs are prevented from being moved out of position on the CSs 210, 212. In addition, since the CSs 210, 212 are mounted on the CS supporting device 12 in the direction of thickness of each CS 210, 212, the time needed for mounting the same 210, 212 can be shortened. Moreover, the two CSs 210, 212 can be simultaneously mounted on the CS supporting device 12 while being positioned in the CS carrying direction.

Meanwhile, the CS removing device 152 starts the transferring of the CSs 200, 202 to the CS HCO device 150 in the horizontal direction parallel to the plane of each CS 200, 202. The drive motor 122 is started to rotate the rotatable support members 86 belonging to the downstream-side group 114, so that the CS 200 is transferred horizontally to the CS HCO device 150. Thereafter, both of the drive motors 124, 122 are operated to rotate all the rotatable support members 86 belonging to the upstream-side and downstream-side groups 116, 114, so that the CS 202 is transferred horizontally to the CS HCO device 150. The two CSs 200, 202 are transferred to the CS HCO device 150 in the order of description. Thus, during this horizontal movement of the CSs 200, 202, the CSs 200, 202 are effectively prevented from riding on each other. Since this horizontal transferring of the CSs 200, 202 are performed without involving the operation of the CS supporting device 12, the horizontal transferring of the CSs 200 202 can be performed concurrently with the mounting of the CSs 210, 212 and/or the mounting of CCs on the CSs 210, 212. The CSs 200, 202 transferred to the CS HCO device 150 are carried out by the same 150 in the horizontal direction parallel to the plane of each CS 200, 202.

The eighth and ninth steps are the CS carrying-out step. The CS-carry-in CS holding device 28 is moved upward, and the main CS-holding device 20 is moved from its CS mounting position to its CC mounting position. Since the CS-carry-in CS holding device 28 is not holding any CSs, the CS holding device 28 can be quickly moved up with an abrupt acceleration and/or an abrupt deceleration. At the CS receiving height position of the CS holding device 28, the pivotable members 82 of the same 28 are rotated to their CS holding position. Thus, the CS holding device 28 waits in a state in which the CS holding device 28 is ready for receiving the CSs carried in by the CS HCI device 24. Meanwhile, at the CS removing height position of the CS removing device 152, the pivotable members 82 of the same 152 are rotated to their CS releasing position. In this state, the CS-carry-out CS holding device 154 waits.

Figure 9:
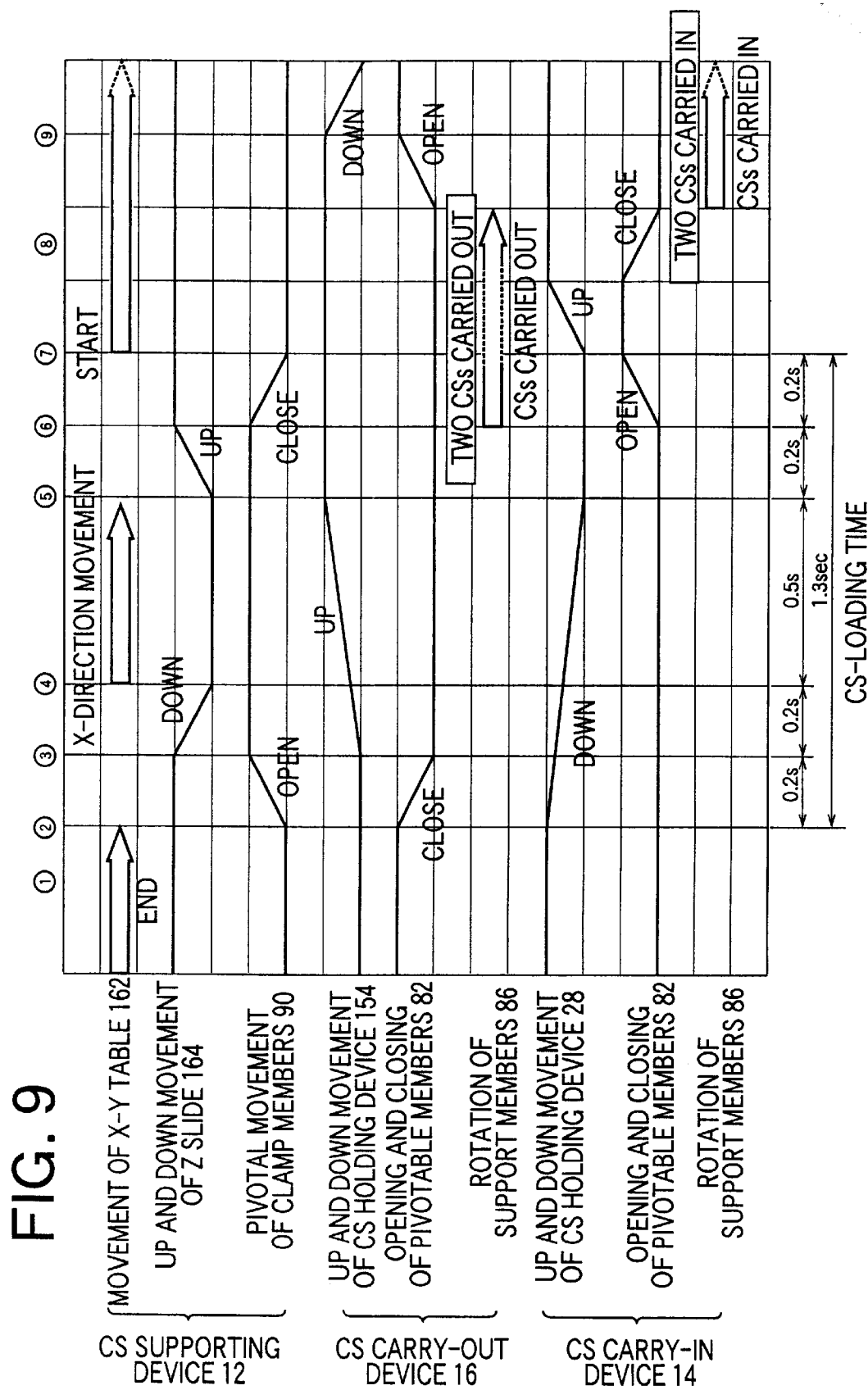
FIG. 9 is a time chart representing the steps of the operation of the CC mounting system of FIG. 1.

The present CC mounting system 8 mounts CCs on the CSs 200, 202, 210, 212 in the above-described manner. FIG. 9 shows that the present system 8 needs only 1.3 second to remove the two CSs 200, 202 from the CS supporting device 12 and mount the two CSs 210, 212 on the CS supporting device 12. Since the removing of the CSs 200, 202 and the mounting of the CSs 210, 212, i.e., the transferring of the CSs 200, 202, 210, 212 are performed in the direction of thickness of each CS 200, 202, 210, 212, the time needed for the transferring of the CSs 200, 202, 210, 212 can be shorter than a time that would be needed when the transferring is performed in the parallel direction parallel to the plane of each CS. Since the CS supporting device 12 can be freely moved during the thus saved time, the device 12 can enjoy improved operation efficiency, which leads to improving the operation efficiency of the present CC mounting system 8.

Recently, CSs which have a small dimension in the CS carrying direction are widely used in portable telephones. The present CC mounting system 8 can simultaneously transfer two CSs which have a small dimension in the CS carrying direction, and accordingly can enjoy improved operation efficiency.

The present CC mounting system 8 can mount CCs on each of various sorts of CSs which have different dimensions in the CS carrying direction and/or their width-wise direction perpendicular to the CS carrying direction. Depending upon the dimensions of the CSs, the distance between the pair of pivotable CS holding devices 32 and 33, or 158 and 159, or the pair of CS clamping devices 166 and 168 is adjustable in the CS mounting device 26, the CS removing device 152, or the main CS-holding device 20, respectively. Meanwhile, in the case where the present system 8 mounts CCs on CSs which have a great dimension in the CS carrying direction, both of the drive motors 122, 124 are constantly operated to rotate all the rotatable support members 86, when each CS is horizontally transferred from the CS HCI device 24 to the CS mounting device 26 and when each CS is horizontally transferred from the CS removing device 152 to the CS HCO device 150. Thus, the CSs which have a great dimension in the CS carrying direction can be transferred in the horizontal direction parallel to the plane of each CS. In this case, the upstream-side positioning device 136 remains kept at its upper or retracted position.

Figure 10:
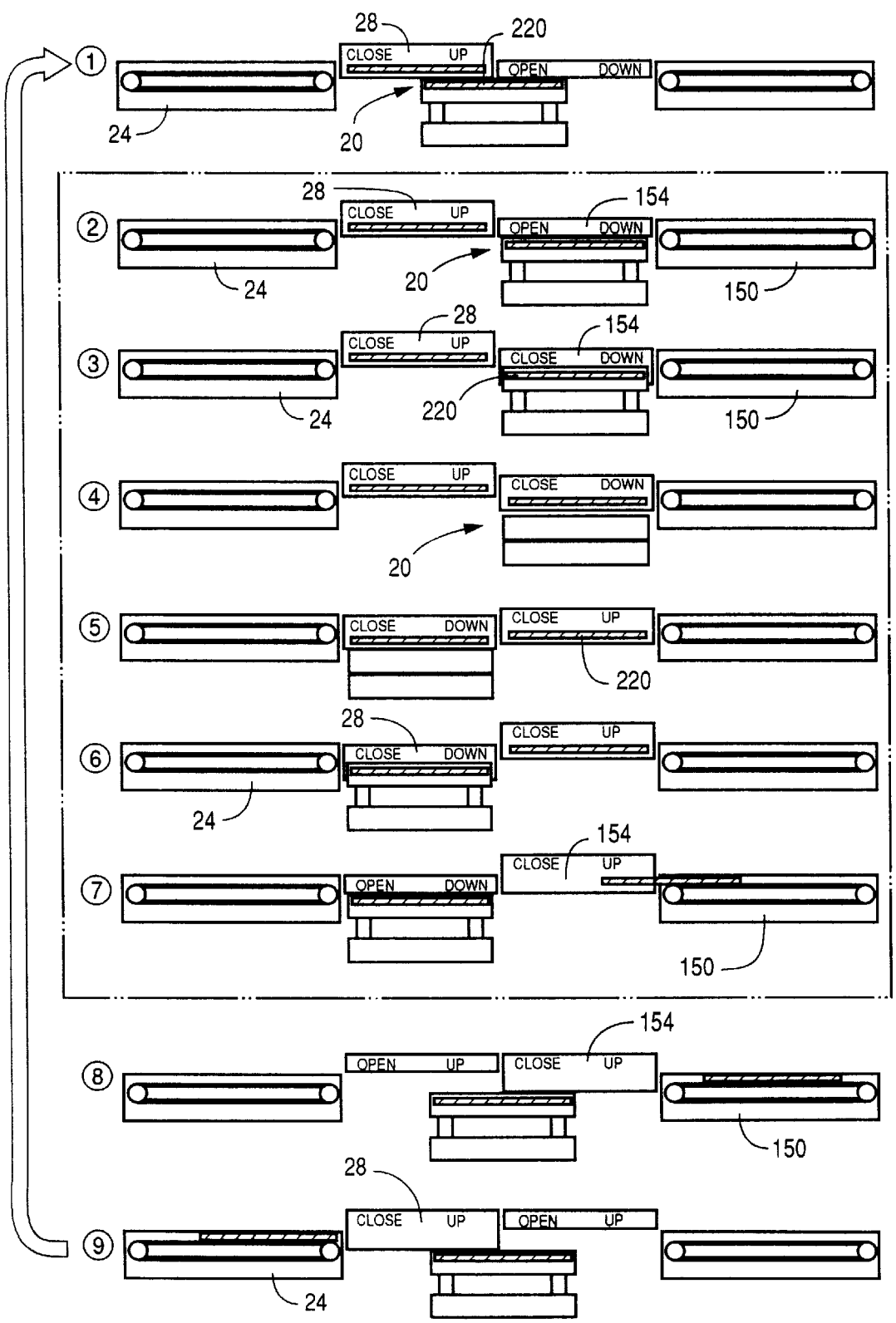
FIG. 10 is a view showing various steps of a different CS transferring operation of the CC mounting system of FIG. 1.
Figure 11:
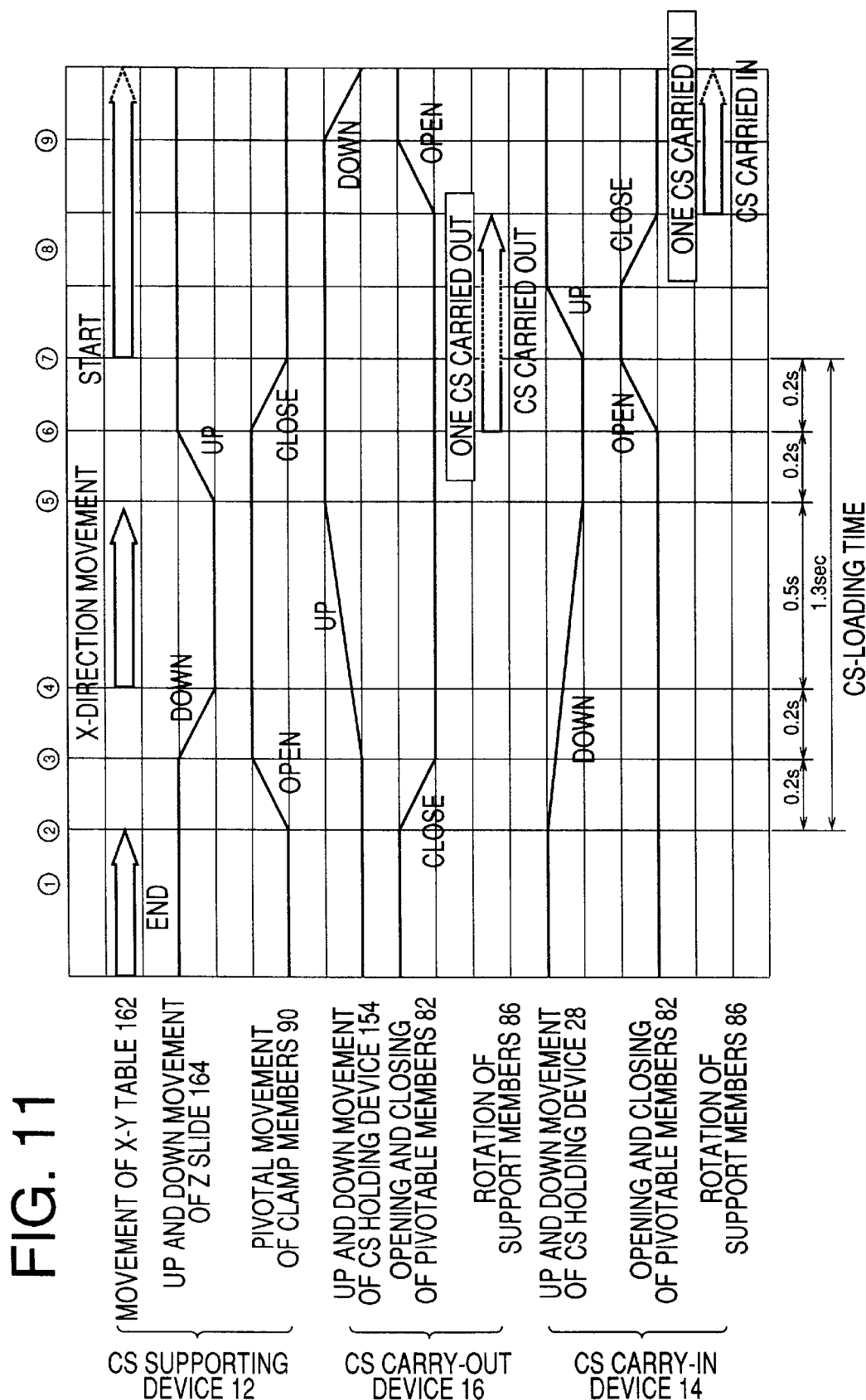
FIG. 11 is a time chart representing the steps of the different operation of the CC mounting system of FIG. 1.
Figure 15:
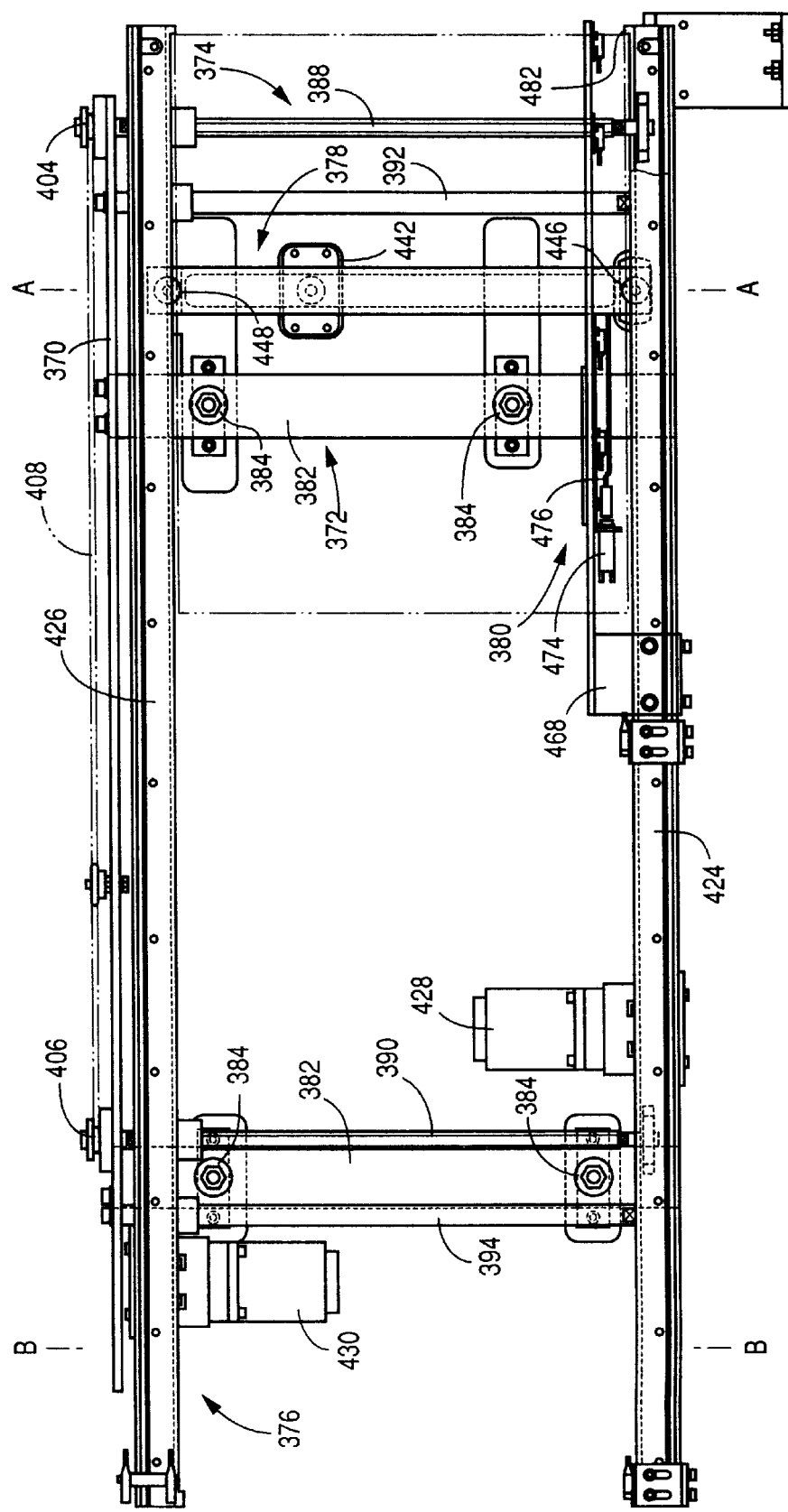
FIG. 15 is a plan view of a CS horizontal-carry-in ("HCI") device of the CC mounting system of FIG. 14.

FIG. 10 shows the steps of the operation for transferring a single CS 220 which have a great dimension in the CS carrying direction, and FIG. 11 shows the time chart of that operation. FIG. 11 indicates that the present CC mounting system 8 needs only 1.3 second to transfer the single CS 220. In contrast, FIG. 15 shows that the known CC mounting system 500 needs 5.0 seconds. Thus, the present system 8 can transfer each CS in about one third of the conventional time.

Figure 12:
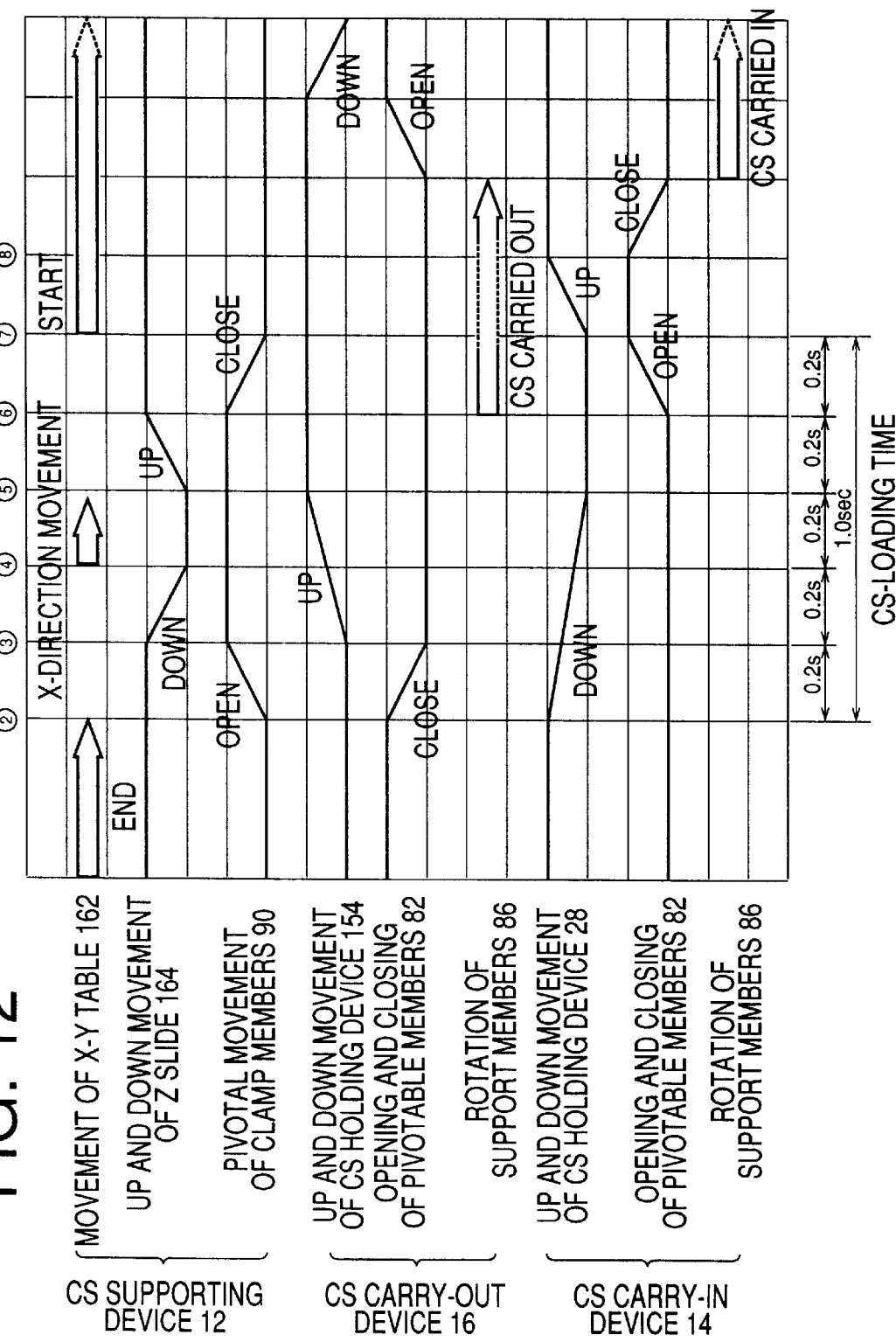
FIG. 12 is a time chart representing various steps of a different CS transferring operation of the CC mounting system of FIG. 1.

FIG. 12 shows the time chart of an operation for transferring a single CS which have a small dimension in the CS carrying direction. Since the CS can be held by any portion of each of the main CS-holding device 20, the CS-carry-in CS holding device 28, and the CS-carry-out CS holding device 154, the distance of horizontal movement of the main CS-holding device 20 can be shortened and accordingly the time needed for the horizontal movement can be shortened. Since the time needed for the horizontal movement can be shortened, the time needed for the downward movement of the CS-carry-in CS holding device 28 holding the CS from its CS receiving height position to its CS mounting height position can be shortened in comparison with the second to seventh steps shown in FIG. 10.

Thus, the present CC mounting system 8 can mount CCs on various sorts of CSs having different dimensions, while reducing the overall time needed for mounting and removing each sort of CS.

It is noted that the CS HCI device 24 and the CS HCO device 150 can be said as fixed or main conveyor devices and that the CS mounting device 26 and the CS removing device 152 can be said as movable or auxiliary conveyor devices.

Figure 14:
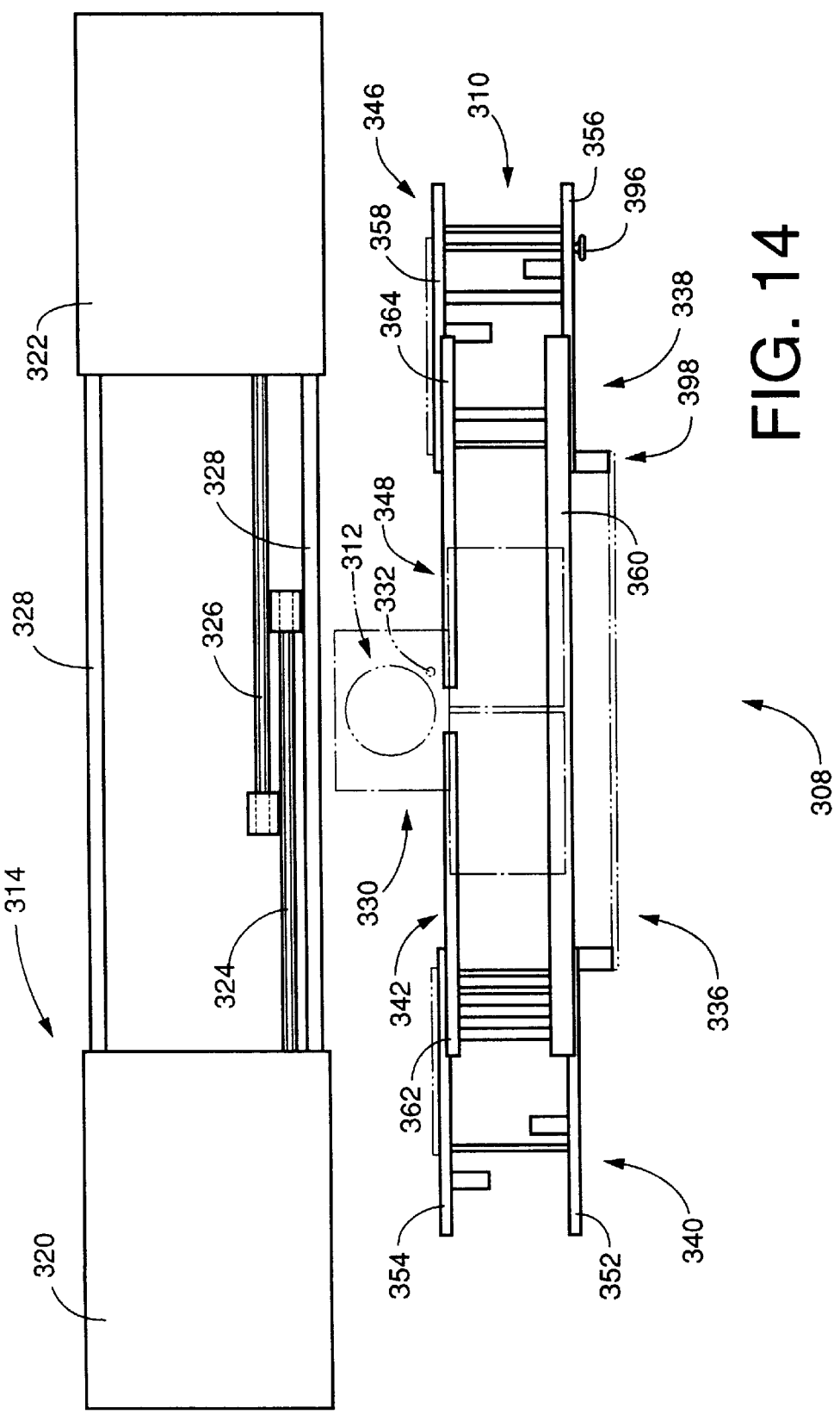
FIG. 14 is a schematic plan view of another CC mounting system as a third embodiment of the present invention.

In the illustrated embodiment, both the removing of one or two CSs from the CS supporting device 12 and the mounting of one or more CSs on the same 12 are performed in the direction of thickness of each CS. However, even in the case where the removing of one or two CSs from the CS supporting device 12 is performed in the direction of thickness of each CS but the mounting of one or more CSs on the same 12 is not performed in the direction of thickness of each CS, the overall time needed for transferring each CS can be shortened because, even in the known CC mounting system as shown in FIG. 14, the speed of horizontal transferring of the CS 520 from the CS carry-in device 514 to the CS supporting device 512 can be increased unlike the speed of horizontal transferring of the CS 521 from the CS supporting device 512 to the CS carry-out device 516, that is, because no CC or only a small number of CCs are mounted on the CS 520 which is transferred from the CS carry-in device 514 to the CS supporting device 512.

In the illustrated embodiment, two CSs are simultaneously mounted or removed. However, three or more CSs can be simultaneously mounted and removed, to further improve the operation efficiency of the CC mounting system 8. In this case, for example, the rotatable support members 86 are divided into three or more groups, so that each of the three or more groups of support members 86 may be rotated independent of the other groups.

In the illustrated embodiment, when the two CSs 200, 202 are transferred from the CS removing device 152 to the CS HCO device 150, the CSs 200, 202 are moved one by one in the horizontal direction. However, this manner is not essentially required. It is possible that the two CSs 200, 202 be simultaneously moved by operating both of the drive motors 122, 124, because it is not necessary to position the CSs 200, 202 in the CS carrying direction unlike in the case where the CSs 210, 212 are carried in. In the case where the two CSs 200, 202 are simultaneously moved, it is not necessary to group the rotatable support members 86 of the CS-carry-out CS holding device 154 into the upstream-side and downstream-side groups 114, 116.

In the illustrated embodiment, each of the CS-carry-in and CS-carry-out CS holding devices 28, 154 supports the lower surface of each CS, and the main CS-holding device 20 clamps each CS. However, at least one of the three CS holding devices 28, 154, 20 may be replaced by an air-suction device which holds each CS by applying air suction thereto.

In the illustrated embodiment, each of the CS-carry-in and CS-carry-out elevating and lowering devices 30, 156 employ the eccentric cams 46. However, each of the elevating and lowering devices 30, 156 may employ a hydraulic actuator for elevating and lowering a corresponding one of the CS-carry-in and CS-carry-out CS holding devices 28, 154. Since, in particular, the CS-carry-in elevating and lowering device 30 can more greatly accelerate and/or decelerate the upward and downward movements of the CS holding device 28 than the CS-carry-out elevating and lowering device 156, it is more advantageous for the elevating and lowering devices 30 to employ a hydraulic actuator in place of the eccentric cams 46.

In the illustrated embodiment, the CC mounting position is different from the CS mounting position and the CS removing position, and accordingly the main CS-holding device 20 must be able to move in the horizontal direction. However, the the CC mounting position may coincide with at least one of the CS mounting position and the CS removing position. In the latter case, at least one of the CS mounting device 26 and the CS removing device 152 is provided with a moving device which moves the CS holding device 28, 154 thereof to, and away from, the CC mounting or removing position.

In the illustrated embodiment, the CC mounting device 10 is provided with only the single camera 23 which reads the fiducial marks of each CS. However, two or more cameras 23 may be employed. In the case where two or more cameras 23 are provided in a direction parallel to the CS carrying direction, the cameras 23 can concurrently read the fiducial marks of two or more CSs, respectively. In the case where two or more cameras 23 are provided in a direction perpendicular to the CS carrying direction, the cameras 23 can simultaneously read two or more fiducial marks of each CS, respectively. In any case, the present CC mounting system 8 can read the fiducial mark or marks of each CS in a reduced time, and accordingly can shorten the time needed for mounting CCs on each CS.

The control manners or patterns shown in FIGS. 9, 11, and 12 are just examples. The present CC mounting system 8 can be operated according to different control patterns.

Figure 13:
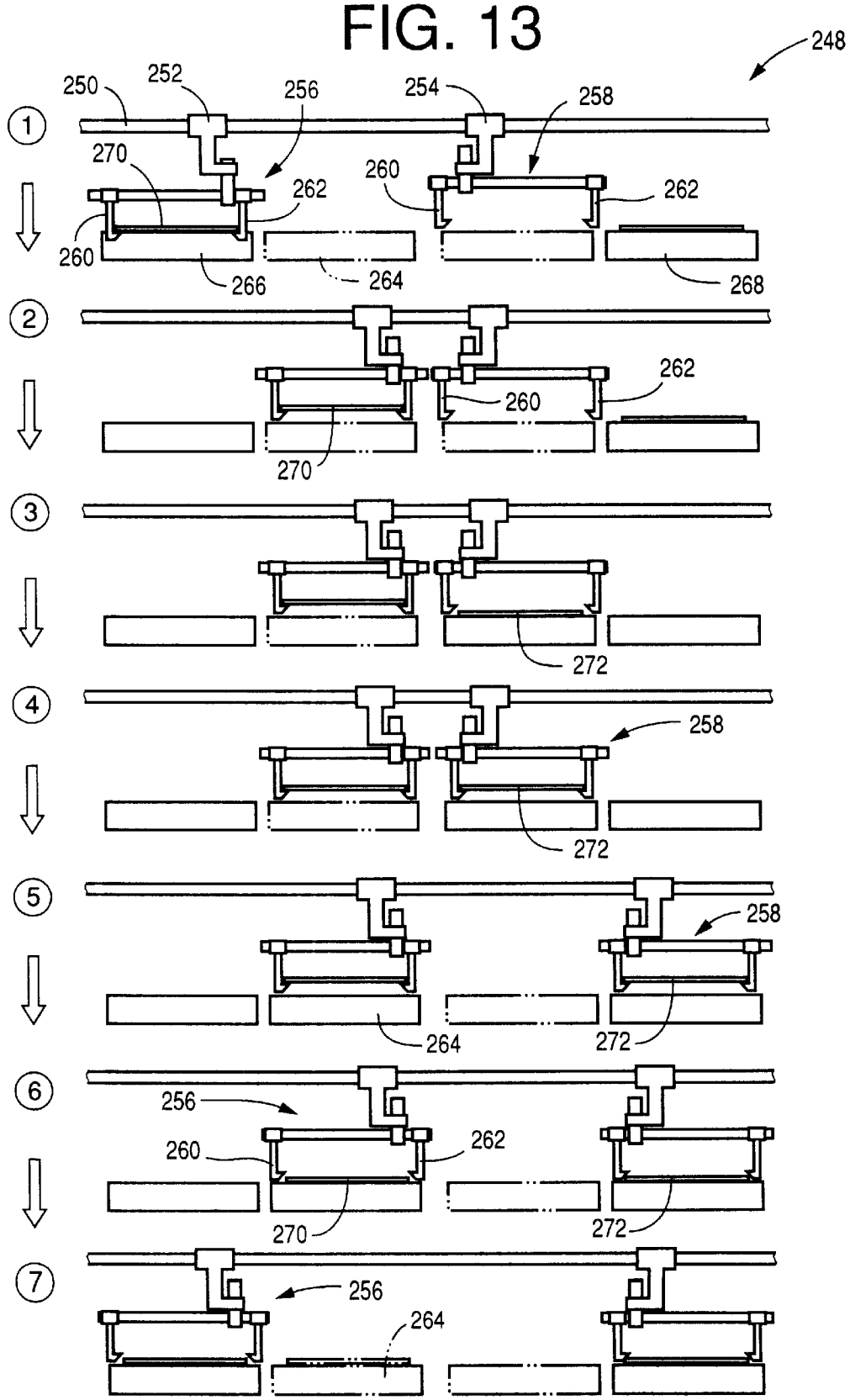
FIG. 13 is a view showing various steps of a CS transferring operation of another CC mounting system as a second embodiment of the present invention.

FIG. 13 shows a second embodiment of the present invention, which also relates to a CC mounting system. In the present CC mounting system 248, a CC carry-in device 250, 252 includes an elevating and lowering device for elevating and lowering a CS-carry-in CS holding device 256, and a CC carry-out device 250, 254 includes an elevating and lowering device for elevating and lowering a CS-carry-out CS holding device 258. However, a CS supporting device 264 does not include an elevating and lowering device for elevating and lowering a main CS-holding device (not shown) thereof. In addition, each of the CS-carry-in CS holding device 256 and the CS-carry-out CS holding device 258 is switchable to its CS holding state and its CS releasing state by utilizing horizontal movement, unlike the first embodiment wherein the pivotal motion of the pivotable members 82 is utilized for the same purpose. Moreover, the carrying-in of each CS in a horizontal direction parallel to the plane of the CS, and the mounting of the CS in a vertically downward direction perpendicular to the plane of the CS are performed by the single CS-carry-in CS holding device 256, and the removing of the CS in a vertically upward direction, and the carrying-out of the CS in the horizontal direction are performed by the single CS-carry-out CS holding device 258.

The instant CC mounting system 248 includes a guide member 250 which extends in a CS Carrying direction, and two sliders 252, 254 each of which is guided by the guide member 250. The first slider 252 supports an end portion of the CS-carry-in CS holding device 256, such that the CS holding device 256 is movable upward and downward, and the second slider 254 supports an end portion of the CS-carry-out CS holding device 258, such that the CS holding device 258 is movable upward and downward.

Each of the CS-carry-in CS holding device 256 and the CS-carry-out CS holding device 258 includes a pair of holding members 260, 262 which are movable relative to each other in a horizontal direction. Each pair of holding members 260, 262 are movable toward each other to their CS holding position where respective holding hands thereof cooperate with each other to support a lower surface of a CS 270 and thereby hold the CS, and are movable away from each other to their CS releasing position where the two holding hands release the CS. Thus, each of the two CS holding devices 256, 258 is switchable to its CS holding and releasing positions. The distance between each pair of movable holding members 260, 262 positioned at their CS holding position is easily adjustable, depending upon the dimension of the CS in the CS carrying direction. Thus, each of the CS-carry-in and CS-carry-out CS holding devices 256, 258 can hold various sorts of CSs having different dimensions in the CS carrying direction. Thus, the adjusting of the distance between each pair of movable holding members 260, 262 positioned at their CS holding position, and the switching of each pair of movable holding members 260, 262 between their CS holding and releasing positions can be performed by a single drive source, which leads to reducing the production cost of the present CC mounting system 248.

Each of the CS-carry-in CS holding device 256 and the CS-carry-out CS holding device 258 can be elevated and lowered between its CS carrying height position where the CS is carried in the horizontal direction parallel to the plane thereof, and its CS transferring height position where the CS is transferred to, or from, the CS supporting device 264. Reference numerals 266, 268 designate a CS supplying device and a CS discharging device, respectively. The CS holding device 256 is horizontally moved between a CS receiving position and a CS mounting position, and the CS holding device 258 is horizontally moved between a CS removing position and a CS discharging position.

The CS supporting device 264 includes a main CS-holding device and a main-holding-device moving device (not shown) which are similar to the main CS-holding device 20 and the main-holding-portion moving device 22 of the first CC mounting system 8. The main CS-holding device of the device 264 is horizontally moved between the CC mounting position, the CS mounting position, and the CS removing position. The CS supporting device 264 does not include a device for elevating and lowering the main CS-holding device thereof, as described above.

In the first, second, and third steps shown in FIG. 13, the CS-carry-in CS holding device 256 holding the CS 270 is moved to the CS mounting position in the horizontal direction parallel the plane of the CS 270. Thus, the CS 270 is carried in from the CS supplying device 266. At the CS mounting position, the CS holding device 256 waits while holding the CS 270, i.e., waits in a state in which the CS holding device 256 is ready for mounting the CS 270 on the CS supporting device 264.

In addition, the CS-carry-out CS holding device 258 waits, at the CS removing position, in a state in which the CS holding device 258 is ready for removing the CS 270 from the CS supporting device 264, i.e., the pair of movable holding members 260, 262 are kept at their CS releasing position. Meanwhile, a CS 272 on which CCs have been mounted is moved to the CS removing position in a horizontal direction parallel to the plane of the CS 272.

In the fourth and fifth steps, the CS-carry-out CS holding device 258 is quickly moved downward to the CS removing height position, and the two movable holding members 260, 262 are moved toward each other to their CS holding position. CS clamping members (not shown) of the CS supporting device 264 are switchable to their CS releasing position. The CS holding device 258 removes, from the CS supporting device 264, the CS 272 in the direction of thickness thereof. Subsequently, the CS holding device 258 is slowly elevated, and the CS supporting device 264 is quickly moved to the CS mounting position in a horizontal direction. Before the CS supporting device 264 is moved horizontally, the CS holding device 258 is moved upward for preventing the holding members 260, 262 from interfering with the horizontal movement of the main CS-holding device of the supporting device 264.

In the sixth step, the CS-carry-in CS holding device 256 is slowly moved downward to the CS mounting height position, and the two movable holding members 260, 262 are moved away from each other to their CS releasing position. The clamp members of the CS supporting device 264 are switched to their CS clamping position. The CS holding device 256 mounts, on the CS supporting device 264, the CS 270 in the direction of thickness thereof. Subsequently, the CS holding device 256 is quickly elevated.

In addition, the CS-carry-out CS holding device 258 is moved horizontally to the CS discharging position, and the CS 272 is transferred from the CS holding device 258 to the CS discharging device 268, which then carries out the CS 272.

In the seventh step, the CS-carry-in CS holding device 256 is moved horizontally to the CS supplying position, and the CS supporting device 264 is moved horizontally to the CC mounting position.

As is apparent from the foregoing description, in the second embodiment shown in FIG. 13, the mounting and removing of the CSs 270, 272 are performed in the direction of thickness thereof, which contributes to reducing the overall time needed for transferring the CSs 270, 272. Since the CS supporting device 264 is not provided with a device for elevating and lowering the main CS-holding device thereof, as described above, the overall time needed for the second CC mounting system 248 to transfer the CSs 270, 272 may involve the time needed for lowering and elevating the CS-carry-in CS holding device 256 holding the CS 270 and the CS-carry-out CS holding device 258 holding the CS 272, and accordingly may be greater as such than that needed for the first CC mounting system 8 to perform the same operation. However, the transferring of the CSs 270, 272 is performed in the direction of thickness of each CS 270, 272, the second system 248 can receive the CS 270 and transfer the CS 272 in a still shorter time than that needed for the known CC mounting system 500 to perform the same operation. In addition, the carrying-in of the CS 270 in the horizontal direction and the mounting of the CS 270 in the direction of thickness thereof are performed by the single CS-carry-in CS holding device 256, and the removing of the CS 272 in the direction of thickness thereof and the carrying-out of the CS 272 in the horizontal direction are performed by the single CS-carry-out CS holding device 258. This arrangement leads to simplifying the construction of the CC mounting system 248.

In the second embodiment, the pair of holding members 260, 262 of each of the two CS holding devices 256, 258 hold the opposite end portions of each CS 270, 272, respectively, in the CS carrying direction. However, it is possible that each of the two CS holding devices 256, 258 be provided with a pair of holding members which hold the width-wise opposite end portions of each CS 270, 272. In addition, it is possible that at least one of the two CS holding devices 256, 258 be provided with a pair of pivotable CS-holding members which are similar to the pivotable members 82 of the first CC mounting system 8. The main CS-holding device of the CS supporting device 256 may be modified to support the lower surface of each CS 270, 272, in place of employing the CS clamping members which are similar to the clamp members 90 of the first system 8. In the latter case, the CS holding device 256 can mount each CS 70 on the main CS-holding device of the supporting device 264, by releasing the CS and thereby allowing the same to fall on the device 264. The CS supporting device 264 may be provided with a device for elevating and lowering the main CS-holding device thereof. In this case, the overall time needed for the second system 248 to transfer the CSs 270, 272 can be shortened to the same degree as that needed for the first system 8 to do so. In addition, in the last case, the two CS holding devices 256, 258 may be supported by the two sliders 252, 254, respectively, such that each CS holding device 256, 258 is not movable upward or downward.

In each of the first and second embodiments, each of the CS carry-in device 14, 250, 252, the CS carry-out device 16, 250, 254, the CS supporting device 12, 264, and the CC mounting device 10 may be modified as needed.

Referring next to FIGS. 14 to 38, there will be described a third embodiment of the present invention, which also relates to a CC (circuit component) mounting system and a CC mounting method.

In FIG. 14, reference numerals 310, 312, and 314 designate a CS (circuit substrate) carrying device, a CC mounting device, and a CC supplying device, respectively. The CC supplying device 314 includes two CC supplying tables 320, 322 each of which supports a plurality of CC supplying units (not shown). The two CC supplying tables 320, 322 are moved on guide rails 328 by two feeding-screw mechanisms 324, 326, respectively. Each CC supplying table 320, 322 is moved to a CC supplying position where CCs are supplied one by one from an appropriate one of the CC supplying units supported thereby to the CC mounting device 312. Each CC supplying unit includes a cartridge which holds a tape to which CCs are adhered, and a tape feeding device which feeds the tape such that the CCs are supplied one by one to the CC mounting device 312. More specifically described, the CC mounting device 312 includes an intermittently rotatable index table, and each CC supplying unit can supply CCs one by one to the CC mounting device 312 in synchronism with the intermittent rotation of the index table. In the present embodiment, a lot of CCs and/or various sorts of CCs can be continuously supplied to the CC mounting device 312, because the two CC supplying tables 320, 322 can be simultaneously used.

At a CC mounting position, the CC mounting device 312 mounts the CCs on a CS supported by a CS supporting device 330. The CC mounting device 312 includes a plurality of suction heads each of which can hold a CC by applying suction thereto and can mount the CC on the CS.

Those suction heads are attached to the index table that is intermittently rotatable about a vertical axis line, such that the suction heads are equiangularly spaced from each other about the axis line. As the index table is intermittently rotated, the suction heads suck, one by one, the CCs supplied from the CC supplying device 314 on one hand while mounting the sucked CCs on the CS on the other hand. That is, the CC mounting device 312 concurrently receives the CCs and mounts the CCs.

The CC mounting device 312 is provided with a fiducial-mark reading camera 332. The camera 332 reads a fiducial mark fixed to each CS, before CCs are mounted on the CS. The camera 332 is of a type which reads one fiducial mark at one time. However, the camera 332 may be replaced with another type which can simultaneously read two or more fiducial marks. The latter camera is advantageous for the case where two or more CSs are simultaneously supported by the CS supporting device 330, because the time needed for mounting the CCs on the CSs can be reduced.

The CS carrying device 310 includes a CS carry-in device 336 and a CS carry-out device 338 which are provided on a CS carrying route. The CS carry-in device 336 includes a CS horizontal-carry-in (HCI) device 340 which carries in the CS supplied by a CS supplying device (not shown), by moving the CS in a horizontal direction substantially parallel to the plane of the CS; and a CS mounting device 342 which receives the CS carried in by the CS HCI device 340, in a vertically upward direction substantially perpendicular to the plane of the CS, and which mounts the CS on the CS supporting device 430, in a vertically downward direction. The CS carry-out device 338 includes a CS horizontal-carry-out (HCO) device 346 which carries out the CS on which the CCs have been mounted, by moving the CS in the horizontal direction; and a CS removing device 348 which removes the CS from the CS supporting device 330, in the vertically upward direction, and which transfers the CS to the CS HCO device 346 in the vertically downward direction.

The CS HCI device 340 and the CS HCO device 346 are provided on a base member 350 (FIG. 16) of the present CC mounting system 308, such that the two devices 340, 346 are spaced from each other in a CS carrying direction, i.e., an X direction. The CS HCI device 340 includes a pair of main members 352, 354 which extend in the X direction. One 352 of the two main members 352, 354 is a fixed member, and the other main member 354 is a movable member which is movable toward, and away from, the fixed main member 352. Similarly, the CS HCO device 346 includes a pair of main members 356, 358 which extend in the X direction. One 356 of the two main members 356, 358 is a fixed member, and the other main member 358 is a movable member which is movable toward, and away from, the fixed main member 356. The CS mounting device 342 and the CS removing device 348 have a common fixed main member 360 which extends in the X direction, and have respective movable members 362, 364 which extend in the X direction. That is, the CS mounting device 342 has the pair of fixed and movable main members 360, 362, and the CS removing device 348 has the pair of fixed and movable main members 360, 364. The common fixed main member 360 is attached to the respective fixed main members 352, 356 of the CS HCI device 340 and the CS HCO device 346, and the respective movable main members 362, 364 are fixed to the respective movable main members 354, 358 of the CS HCI device 340 and the CS HCO device 346. Thus, the distance between the fixed main members 352, 360, 356 and the movable main members 354, 362, 364, 358 can be adjusted by moving the movable main members 354, 362, 364, 358 as a unit, in a manner which will be described later. This distance may be adjusted depending upon the width of the CS to be carried by the CS carrying device 310. This distance will be referred to as the "CS-carrying width", if appropriate.

As shown in FIGS. 15 to 18, the CS HCI device 340 includes, in addition to its main members 352, 354, a side frame 370, a main-member supporting device 372 which supports the main members 352, 354, a CS-carrying-width adjusting device 374, a horizontal-direction CS-moving device 376, a CS-support-plate elevating and lowering device 378, and a CS-horizontal-movement stopping device 380.

Figure 18:
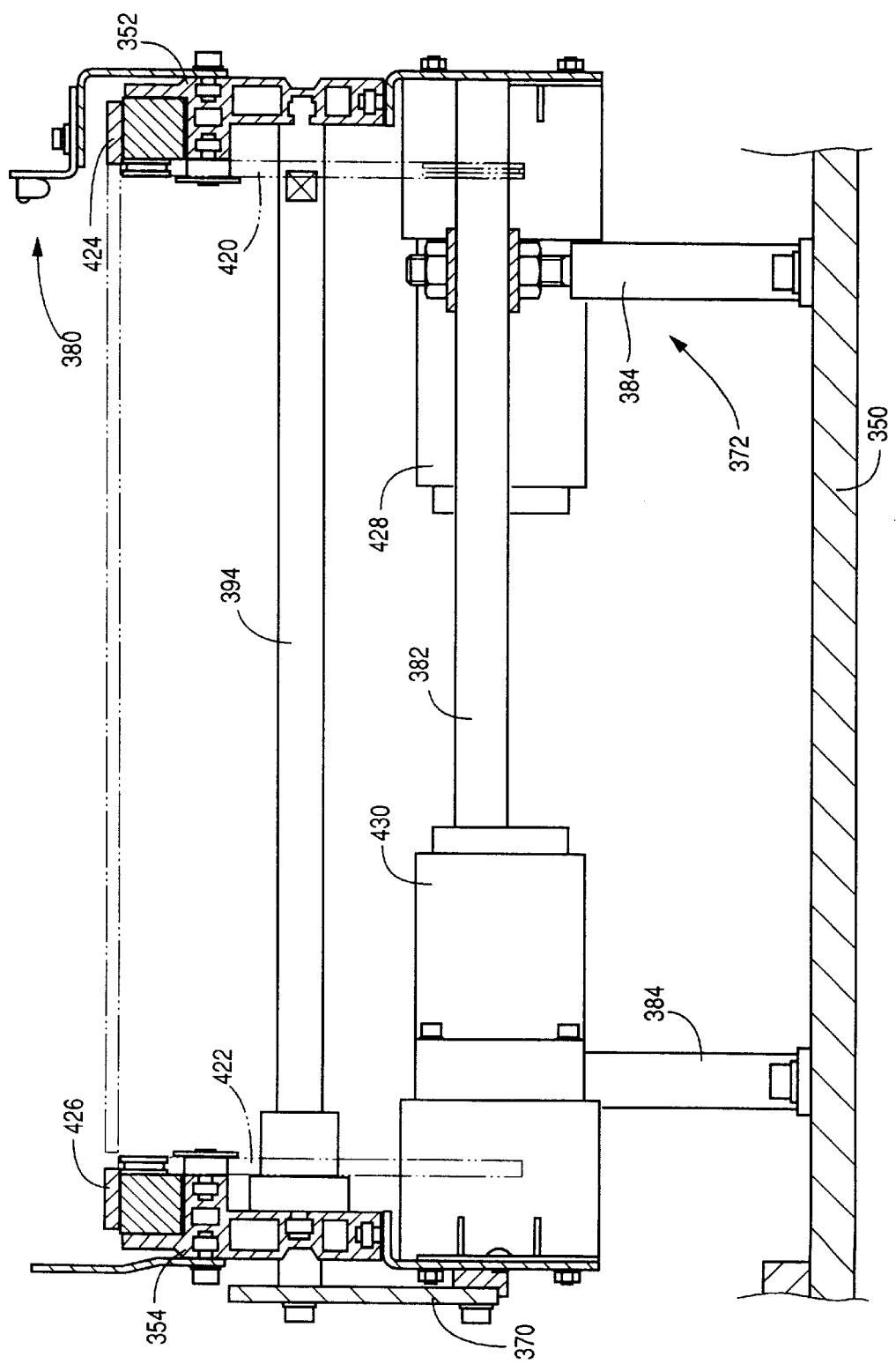
FIG. 18 is a cross-section view of an important part of the CS HCI device taken along line, B—B, in FIG. 15.

As shown in FIGS. 15 and 18, the main-member supporting device 372 includes two bar-like rods 382 which extend, below the main members 352, 354, in a Y direction perpendicular to the X direction; and four props 384 two of which support one of the two rods 382 and the other two of which support the other rod 382. The props 384 are fixed to the base 350. Each rod 382 is fixed at one end thereof to the fixed main member 352, and is fixed at the other end thereof to the side frame 370. The respective heights of the props 384 are adjustable, and the height position where the CS is carried in is adjustable by adjusting the heights of the props 84.

As shown in FIG. 15, the CS-carrying-width adjusting device 374 includes two feeding-screw mechanisms 388, 390 and two guide rods 392, 394. A rotation transmitting device 398 transmits the rotation of a handle 396 which is provided as part of the CS HCO device 346, to the feeding-screw mechanisms 388, 390.

As shown in FIG. 14, the rotation transmitting device 398 includes chains and sprockets which cooperate with one another to transmit the rotation of the handle 396 to the first feeding-screw mechanism 388, and the rotation transmitted to the first feeding-screw mechanism 388 is further transmitted to the second feeding-screw mechanism 390 by two sprockets 404, 406 and a chain 408. The rotations thus transmitted to the feeding-screw mechanisms 388, 390 cause the movable main member 354 to move toward, and away from, the fixed main member 352 by being guided by the guide rods 392, 394. As described previously, when the handle 396 is rotated by an operator, the respective CS carrying widths of the CS HCO device 346, the CS HCI device 340, the CS mounting device 342, and the CS removing device 348 are simultaneously adjusted. In the present embodiment, the handle 396 provided as part of the CS HCO device 346 functions as a drive source of the CS-carrying-width adjusting device 374.

As shown in FIG. 18, the horizontal-direction CS-moving device 376 includes two carry-in belts 420, 422 each as a CS support member, two guide plates 424, 426, and two electric motors 428, 430. The first carry-in belt 420 is wound on two pulleys which are rotatably attached to the fixed main member 352, and the second carry-in belt 422 is wound on two pulleys which are rotatably attached to the movable main member 354. Each belt 420, 422 is driven when the corresponding two pulleys are rotated by the corresponding electric motor 428, 430. Thus, the CS supported on the two belts 420, 422 is carried in by being moved in the horizontal direction while being guided by the guide plates 424, 426. Since the electric motors 428, 430 are driven in synchronism with each other, the two belts 420, 422 are started and stopped at substantially the same time and are moved at substantially the same speed.

Figure 17:
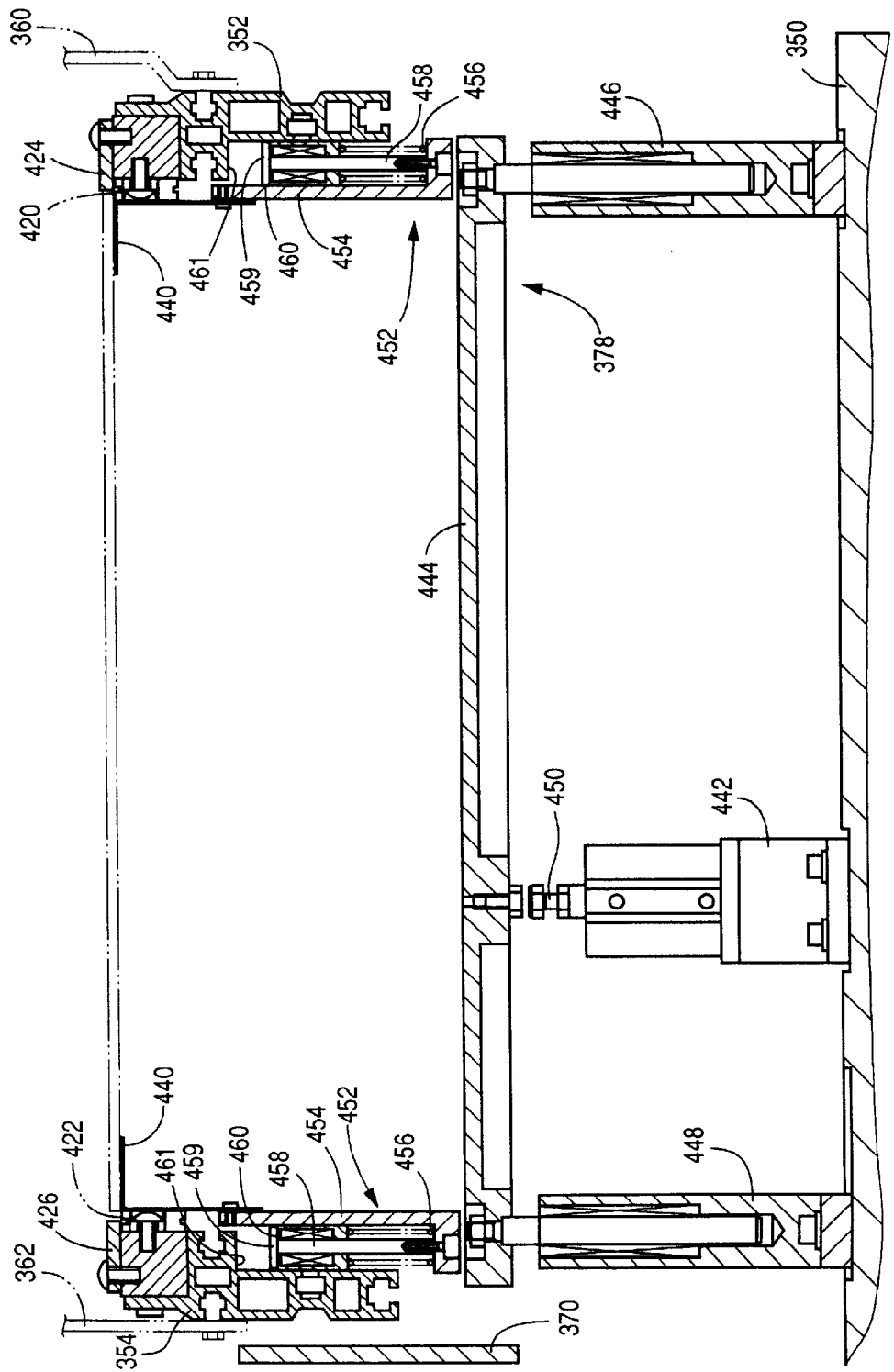
FIG. 17 is a cross-section view of the CS HCI device taken along A—A in FIG. 15.

As shown in FIG. 17, the CS-support-plate elevating and lowering device 378 elevates and lowers two CS support plates 440 each as a CS support member, and includes an air-operated cylinder device 442 and a CS-support-plate elevating and lowering member 444. The elevating and lowering device 378 is provided in a downstream portion of the CS HCI device 340 as viewed in the CS carrying direction.

The elevating and lowering member 444 extends in the Y direction, and opposite end portions thereof are supported by two guide devices 446, 448, respectively, such that an intermediate portion thereof is opposed to a piston rod 450 of the air cylinder 442.

The elevating and lowering member 444 is movable vertically upward and downward between its uppermost position defined by an uppermost position of the piston rod 450 of the air cylinder 442, and its lowermost position defined by a lowermost position of the piston rod 450 where a stopper fixed to the top end of the rod 450 butts a housing of the air cylinder 442.

The two CS support plates 440 are provided by two plate-like members which extend in the CS carrying direction and which are attached to the two main members 352, 354, respectively, via respective plate guiding devices 452 which are provided above the CS-support-plate elevating and lowering member 444 with respective clearances being left therebetween. Each plate guiding device 452 includes a plate support member 454 which supports the corresponding CS support plate 440, a spring 456 which is provided between the plate support member 454 and the corresponding main member 352, 354, and a guide rod 458 which extends parallel to the spring 456. The spring 456 biases the plate support member 454 downward. A stopper 459 which is fixed to an upper end portion of each guide rod 458 is buttable on a lower stepped surface 460 and an upper stepped surface 461 of the corresponding main member 352, 354. The downward and upward movements of the CS support plates 440 are limited by the butting of the stoppers 459 on the lower and upper stepped surfaces 460, 461 of the main members 352, 354, respectively.

Since the two CS support plates 440 are provided between the two carry-in belts 420, 422, the two plates 440 are prevented from being interfered with by the two belts 420, 422, when the plates 440 are moved upward and downward. In addition, since the two plates 440 support respective inside portions of the CS which are inside the opposite end portions thereof which are supported by the two belts 420, 422, the plates 440 do not interfere with the CS mounting device 342, when the mounting device 342 holds the CS.

When the piston rod 450 is moved upward by the operation of the air cylinder 442, the CS-support-plate elevating and lowering member 444 is moved upward while being guided by the guiding devices 446, 448. When the elevating and lowering member 444 is moved upward, the CS-support-plate support members 454 are moved upward against the biasing forces of the springs 456, while the support members 454 are guided by the guide rods 458. Thus, the CS support plates 440 are moved upward.

When the piston rod 450 is moved downward, the CS support plates 440 and the CS-support-plate elevating and lowering member 444 are moved downward by the biasing forces of the springs 456.

Figure 16:
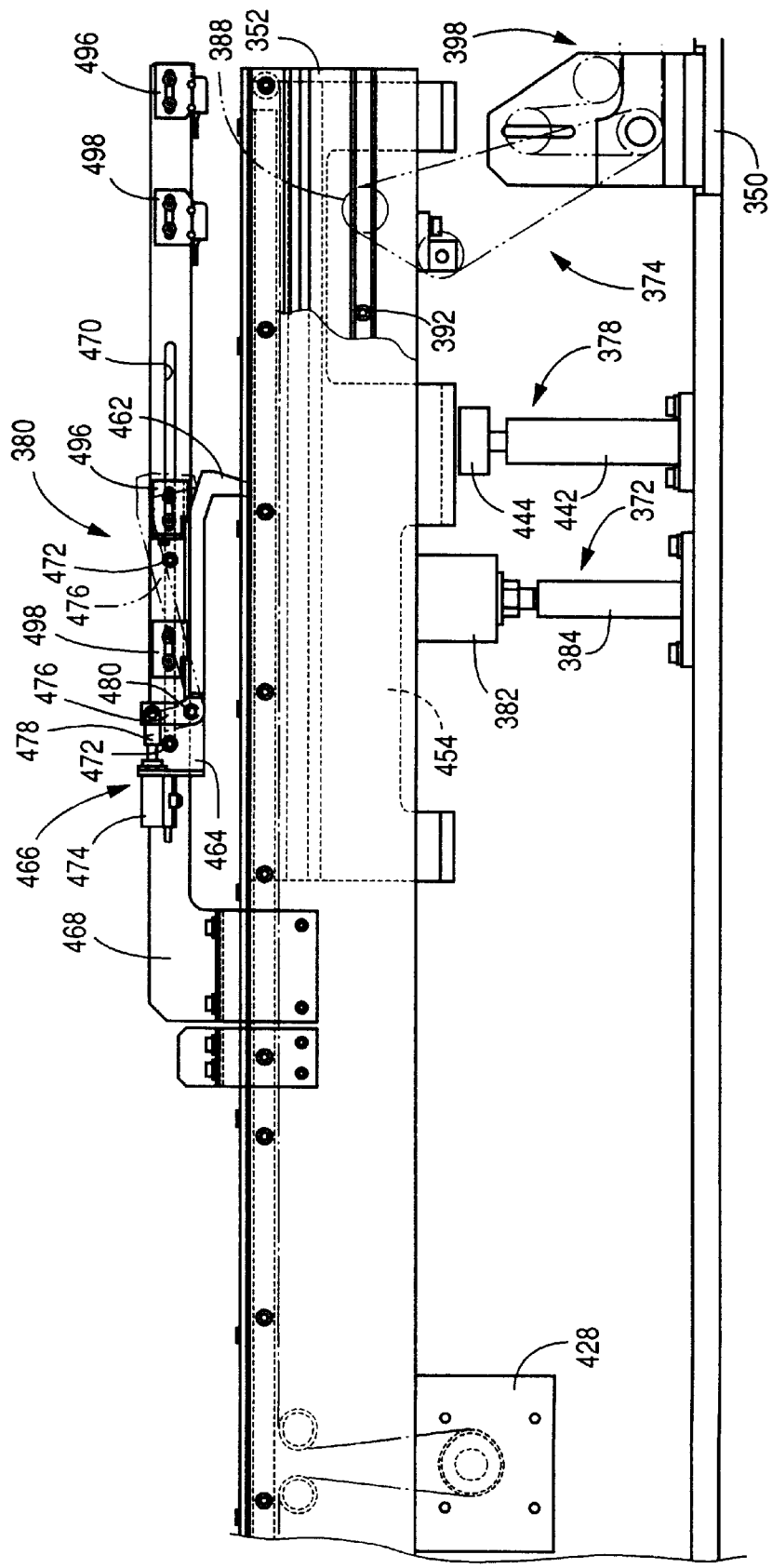
FIG. 16 is a front elevation view of the CS HCI device of FIG. 15.

As shown in FIG. 16, the CS-horizontal-movement stopping device 380 can stop the CS at an intermediate position between an upstream end a downstream end of the CS HCI device 340 in the CS carrying direction. More specifically described, in the case where two or more CSs are simultaneously carried in, the stopping device 380 stops the second CS, or each of the second and following CSs, at a predetermined intermediate position. In the present embodiment, the position where the stopping device 380 is attached to the CS HCI device 340 is adjustable in the CS carrying direction. Thus, the second CS can be stopped at a desired intermediate position, and accordingly an appropriate distance or space can be provided between the first and second CSs, the second and third CSs, and so on.

The CS-horizontal-movement stopping device 380 includes an intermediate stopper 462, a stopper support plate 464 which supports the stopper 462, and a stopper moving device 466 which is attached to the stopper support plate 464 and which moves the stopper 462 between its operative and inoperative positions. The support plate 464 is attached, with attaching devices 472 each of which includes a bolt and a nut, to an elongate hole 470 formed in a frame 468 which is fixed to the fixed main member 352 of the CS HCI device 340. Thus, the position where the stopping device 380 is attached to the SC HCI device 340 in the CS carrying direction can be adjusted within a range corresponding to the elongate hole 470. This position may be determined depending upon the dimension of the CS in the CS carrying direction.

The stopper moving device 466 includes an air-operated cylinder device 474, and a moving lever 476 which moves the intermediate stopper 462. The moving lever 476 is provided by a generally L-shaped member. The stopper 462 is fixed to one end portion of the lever 476, and a piston rod 478 of the air cylinder 474 is pivotally attached to the other end portion of the lever 476. The lever 476 has an intermediate portion 480 which is pivotally attached to the stopper support plate 464. When the piston rod 478 is positioned at its retracted position, the stopper 462 is positioned at its inoperative position; and as the piston rod 478 is moved to its advanced or extended position, the intermediate portion 480 of the lever 476 is pivoted and the stopper 462 is moved to its operative position.

In the present embodiment, the single stopping device 380 is attached to the CS HCI device 340. However, two or more stopping devices 380 may be attached to the device 340. In the latter case, three or more CSs can be simultaneously carried in, and can be supported on the carry-in belts 420, 422 with an appropriate space being provided between each pair of adjacent CSs.

As shown in FIG. 15, a downstream-end stopper 482 as a fixed stopper is provided at a downstream end of the fixed main member 352 of the CS HCI device 340. The horizontal movement of the first CS that is first carried in is stopped by the downstream-end stopper 482.

When the carry-in movement of CSs is started, the intermediate stopper 462 is positioned at its inoperative position. When the carry-in belts 420, 422 are driven, the first CS is moved in the horizontal direction, until the horizontal movement of the first CS is stopped by the downstream-end stopper 482. Subsequently, the intermediate stopper 462 which is on the upstream side of the downstream-end stopper 482 is moved to its operative position, when the air cylinder 474 is operated. The next CS is moved in the horizontal direction by the carry-in belts 420, 422, and the horizontal movement of the second CS is stopped by the intermediate stopper 462. The first CS is kept stopped in contact with the downstream-end stopper 482. Thus, the two CSs are supported on the carry-in belts 420, 422 in a state in which the space defined by the intermediate stopper 462 is provided between the two CSs.

Figure 36:
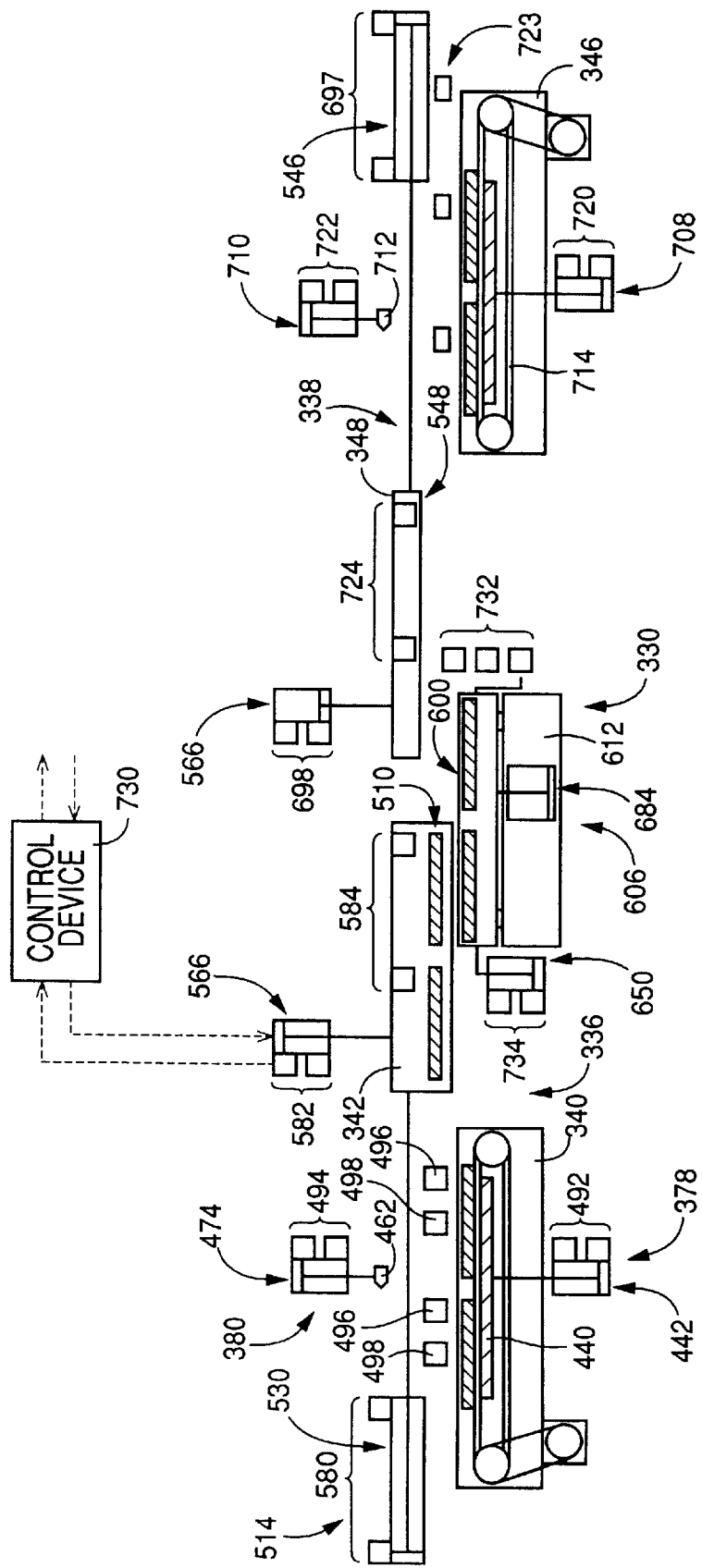
FIG. 36 is an illustrative view of a CS carrying device of the CC mounting system of FIG. 14.

As illustrated in FIG. 36, the CS HCI device 340 includes two plate sensors 492, two stopper sensors 494, two CS-arrival sensors 496, and two CS-low-speed sensors 498. The two plate sensors 492 detect the uppermost and lowermost positions of the CS support plates 440, respectively. The two stopper sensors 494 detect the operative and inoperative positions of the intermediate stopper 462, respectively. The two CS-arrival sensors 496 detect the arrival of the first CS at the downstream-end stopper 482 and the arrival of the second CS at the intermediate stopper 462, respectively. The two CS-low-speed sensors 498 detect that the respective speeds of horizontal movements of the first and second CSs are lower than a predetermined value. The positions where the sensors 496, 498 are attached to the CS MCI device 340 are adjustable depending upon the dimensions of the CSs which are to be carried. In order that the two CSs which move in the horizontal direction butt the two stoppers 482, 462, respectively, at a low speed, the electric motors 428, 430 are so controlled as to decrease the respective speeds of horizontal movements of the two CSs down to the predetermined value. It is noted that FIG. 23 only illustrates the respective functions of the sensors 496, 498 and does not show the actual positions thereof. The plate sensors 492 are not provided on the air cylinder 442, or the stopper sensors 494 are not provided on the air cylinder 474. In fact, those sensors 492 or 494 are provided at respective positions where they can detect the opposite end positions of movement of the member(s) 440 or 462 which is moved as the piston rod of the air cylinder 442, 474 is moved.

As shown in FIG. 19 to 23, the CS mounting device 342 includes, in addition to its main members 360, 362, a CS holding device 510, a connecting device 512, and a CS-holding-device moving device 514. The CS holding device 520 includes a pair of pivot-type holding portions 516, 518 which include respective main members 520, 522 which are engaged with the two main members 360, 362 of the CS mounting device 342, respectively, such that the former main members 520, 522 are movable relative to the latter main members 360, 362 in the CS carrying direction and are not movable in the width-wise direction of the CSs. Since the movable main member 362 is movable toward, and away from, the fixed main member 362, the distance of the two pivot-type holding portions 516, 518 can be adjusted by adjusting the distance of the two main members 360, 362. Thus, the CS mounting device 342 can hold different sorts of CSs having different widths.

Figure 19:
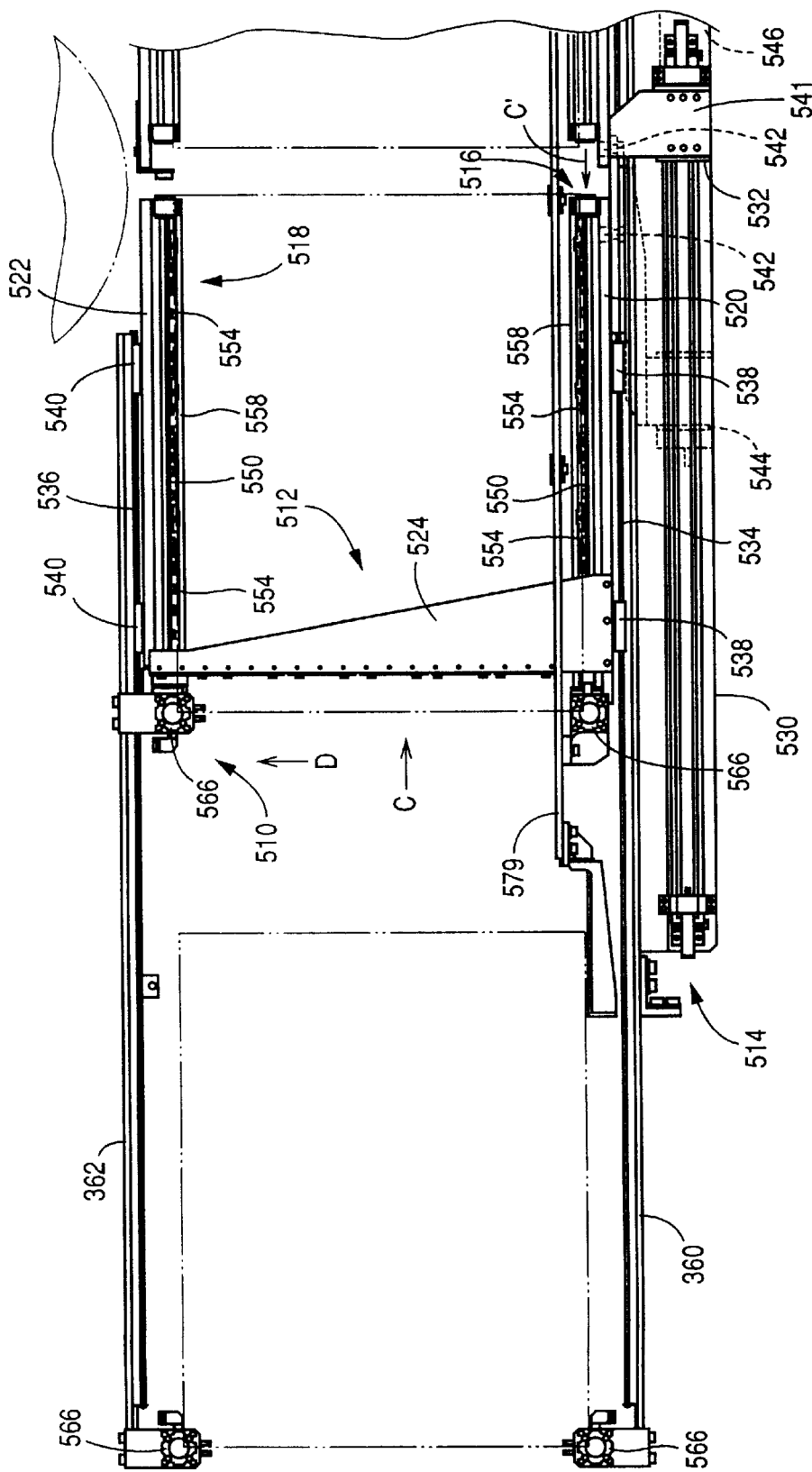
FIG. 19 is a plan view of a CS mounting device of the CC mounting system of FIG. 14.
Figure 20:
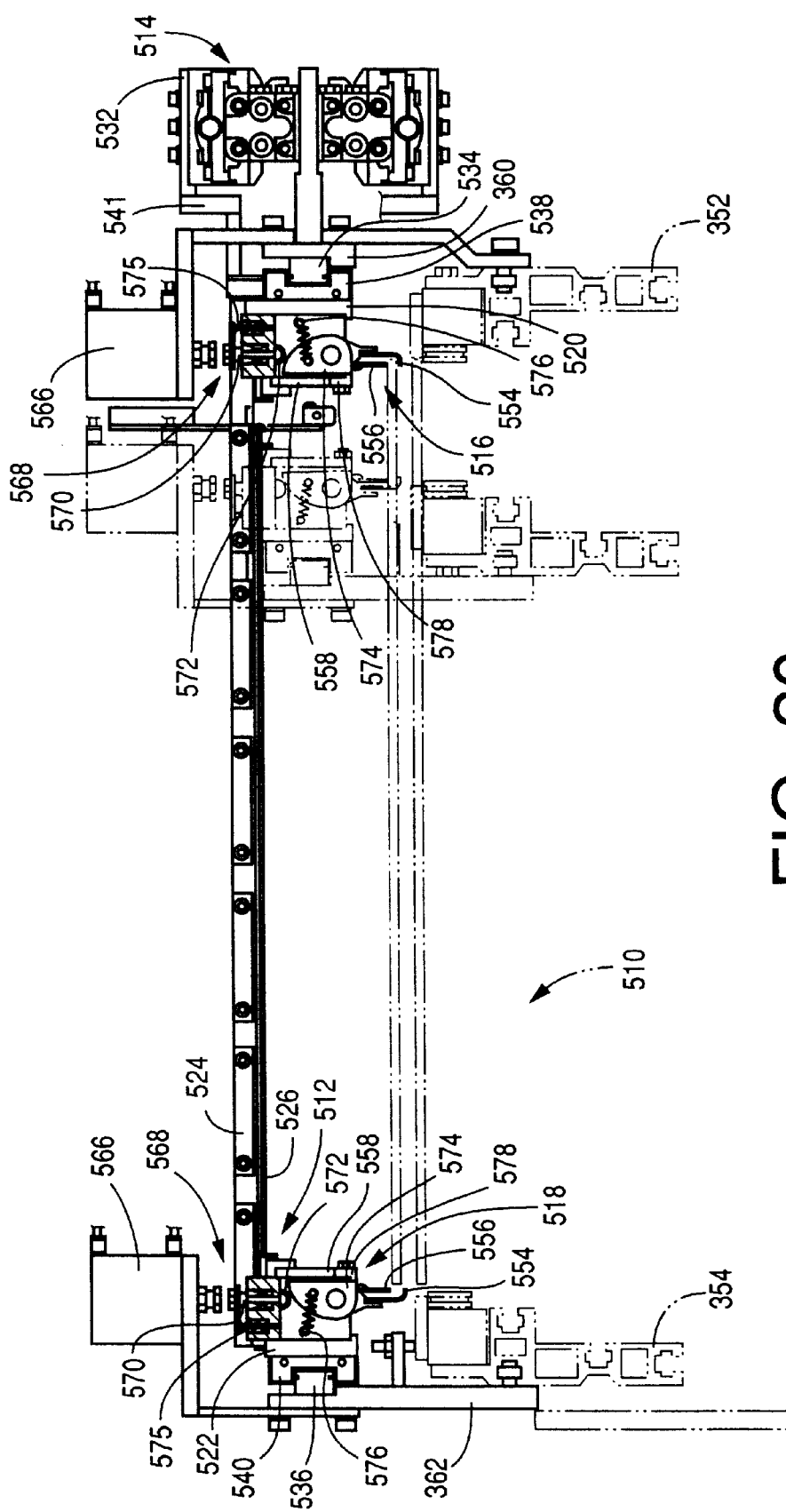
FIG. 20 is an elevation view of an important part of the CS mounting device taken from point, C, in FIG. 19.
Figure 21:
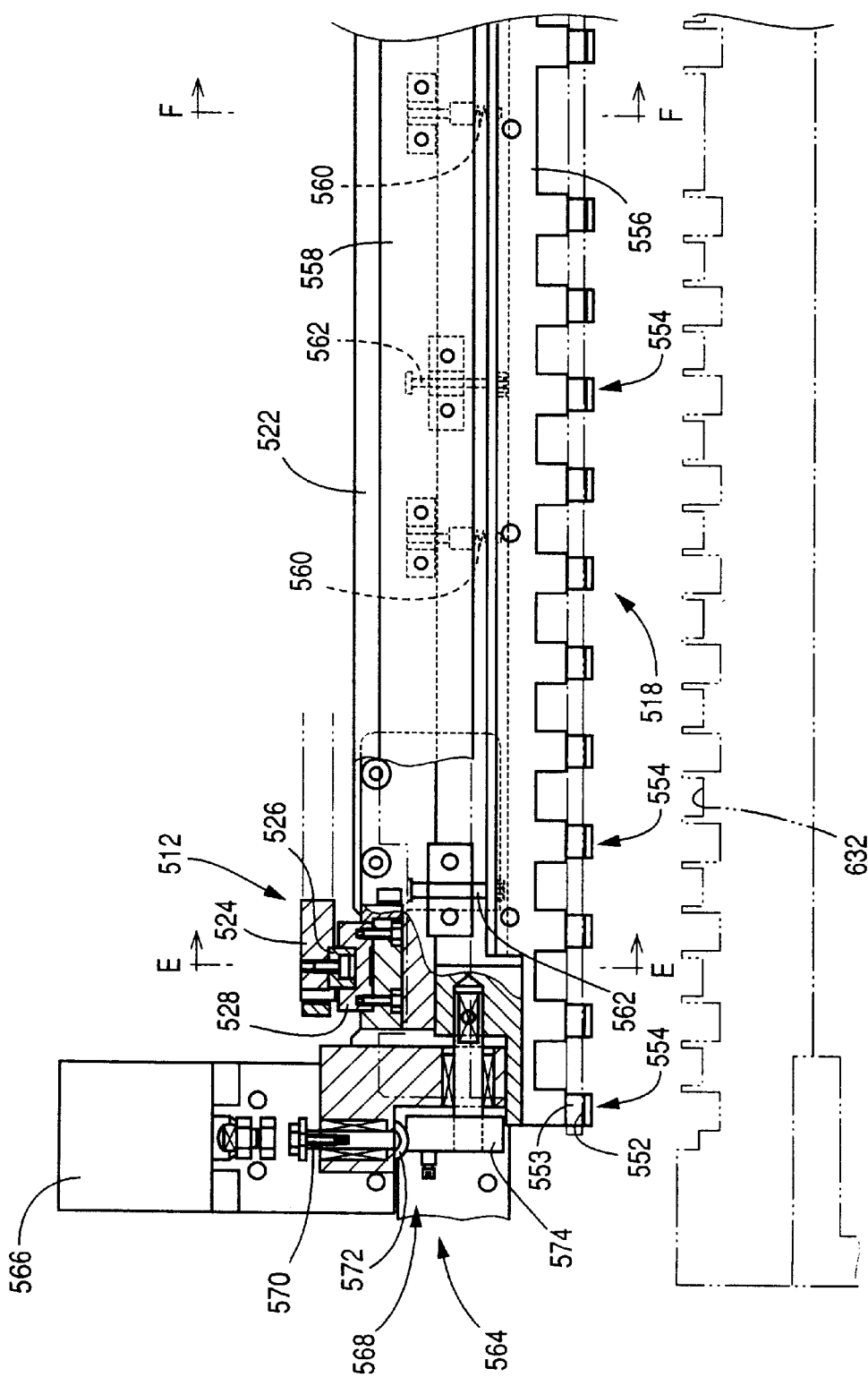
FIG. 21 is an elevation view of an important part of the CS mounting device taken from point, D, in FIG. 19.

As shown in FIG. 21, the connecting device 512 includes a connecting member 524 which connects the respective main members 520, 522 of the two pivot-type holding portions 516, 518. With the connecting device 512, the two main members 520, 522 are connected to each other such that the movable main member 522 is movable in the width-wise direction relative to the main member 520 and such that the two main members 520, 522 are not movable relative to each other in the CS carrying direction. As shown in FIG. 19, the connecting member 524 has a generally triangular shape in its plan view, and is fixed at its one side to the main member 520. A guide rail 526 which extends in the width-wise direction is attached to a lower surface of the connecting member 524, and a slider 528 which is fixed to the movable main member 522 is engaged with the guide rail 526. Thus, the main member 522 is movable in the width-wise direction. Since the guide rail 526 extends in the width-wise direction perpendicular to the CS carrying direction, the two main members 520, 522 are prevented from being moved relative to each other in the CS carrying direction.

Figure 23:
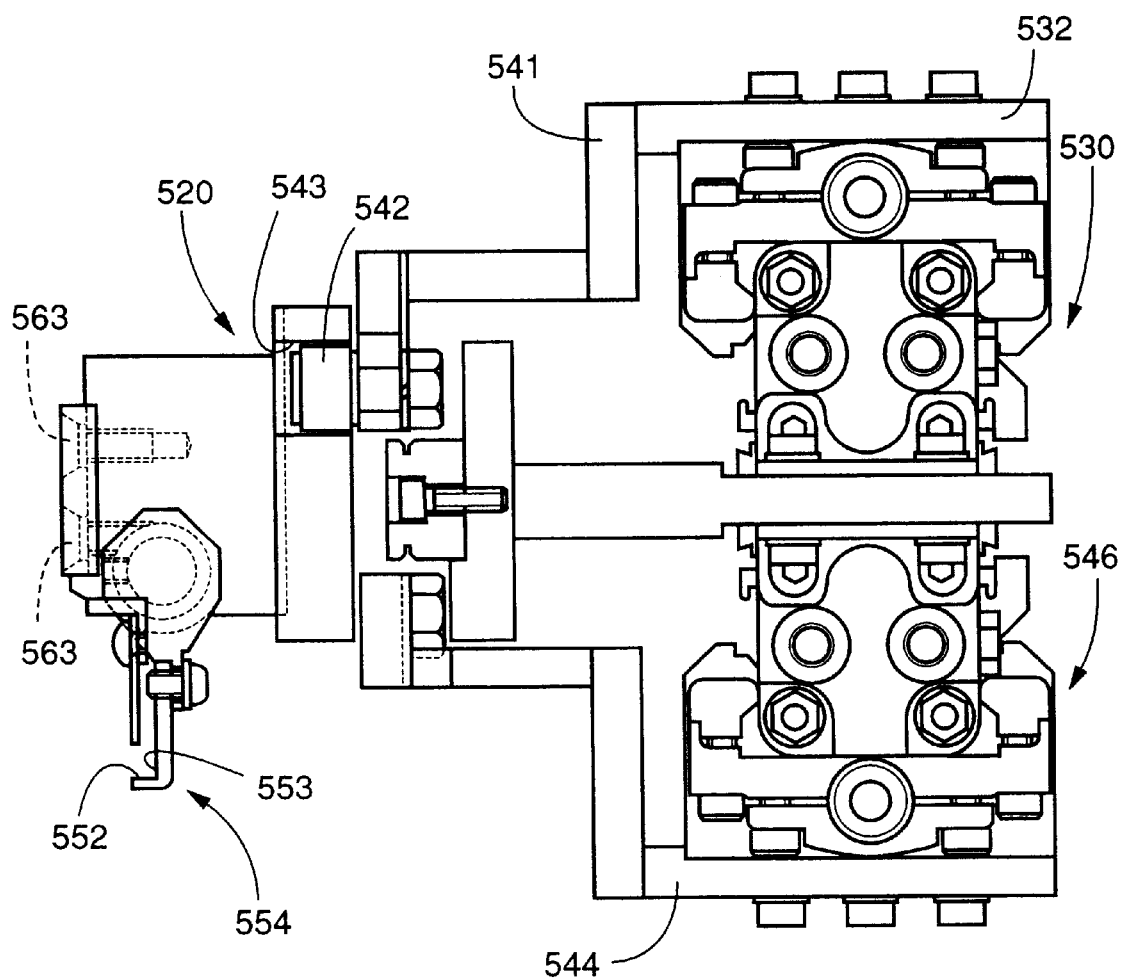
FIG. 23 is an elevation view of the CS mounting device taken from point, C', in FIG. 19.

As shown in FIG. 19, the CS-holding-device moving device 514 includes an air-operated cylinder device 530; a driver-side slider 532; two holder-side guide rails 534, 536 which are provided inside the main members 360, 362, respectively; two holder-side sliders 538 which are fixed to the main member 520 and which are engaged with the holder-side guide rail 534 fixed to the fixed main member 360, and two holder-side sliders 540 which are fixed to the movable main member 522 and which are engaged with the holder-side guide rail 536 fixed to the movable main member 362; and a connecting member 541. The air cylinder 530 is a "rodless" cylinder which does not have a piston rod, and the driver-side slider 532 is movable, as a unit, with a piston of the air cylinder 530. The connecting member 541 connects the slider 532 and the main member 520 to each other. As shown in FIGS. 19 and 23, the connecting member 541 includes two engagement projections 542 which are engaged with two engagement holes 543 formed in the main member 520. The holes 543 have a vertical dimension slightly greater than that of the projections 542, and the same horizontal dimension as that of the same 542. Accordingly, the slider 532 is engaged with the main member 520 such that the slider 532 is slightly vertically movable relative to the main member 520 and is not horizontally movable relative to the same 520.

When the air cylinder 530 is operated and the piston thereof is moved forward and backward in the CS carrying direction, the driver-side slider 532 is moved forward and backward in the CS carrying direction, so that the main member 520 is moved along the guide rail 534. Since the two main members 520, 522 are connected to each other by the connecting device 512, the main member 522 is also moved with the main member 520. Thus, the CS holding device 510 is moved.

A driver-side slider 544 of the CS removing device 348 is indicated at broken line in FIG. 19 and indicated at solid line in FIG. 23. The slider 544 is fixed to a piston of an air-operated cylinder device 546 of the CS removing device 348. A CS holding device 548 (FIG. 33) of the CS removing device 348 is moved forward and backward in the horizontal direction, in a similar manner.

Figure 22A:
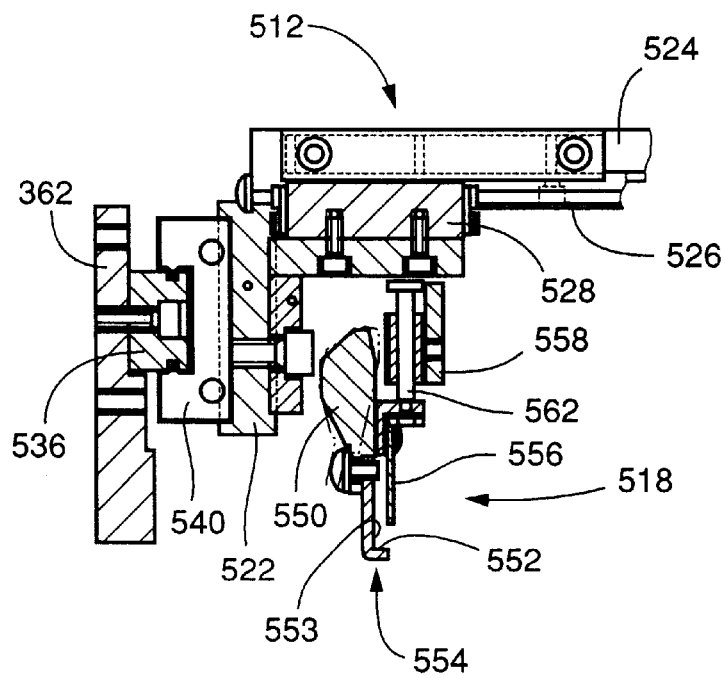
FIG. 22A is a cross-section view of the CS HCI device taken along line, E—E, in FIG. 21.
Figure 22B:
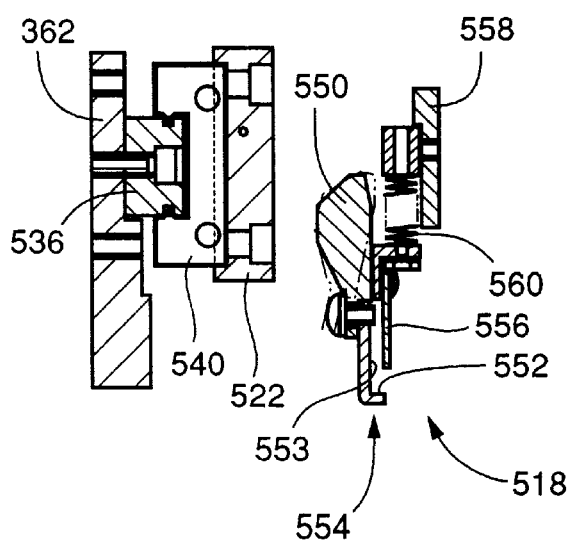
FIG. 22B is a cross-section view of the CS HCI device taken along line, F—F, in FIG. 21.

Since the two pivot-type holding portions 516, 518 of the CS holding device 510 are identical with each other, there will be described the holding portion 518 provided on the movable main member 362, and the description of the holding portion 516 provided on the fixed main member 360 is omitted. As shown in FIGS. 22A and 22B, the holding portion 518 includes, in addition to the main member 522, a pivotable member 550 which is provided on the main member 520 such that the pivotable member 550 is pivotable; a number of holding claws 554 as holding projections which are fixed to the pivotable member 550 at a regular interval of distance and each of which has a CS supporting surface 552 and a CS positioning surface 553; and a CS pressing plate 556 which is provided above the holding claws 554. As shown in FIG. 21, the CS pressing plate 556 is a comb-like member including a number of tooth portions, and is attached to a CS-pressing-member support member 558 via springs 560 and guide rods 562 such that the tooth portions of the plate 556 correspond to the holding claws 554, respectively. The support member 558 is fixed to opposite end portions of the main member 522 with screw members 563 (FIG. 23 shows one screw member 563 used for fixing another CS-pressing-plate support member 558 to the other main member 520). Thus, the CS pressing member 556 is attached to the main member 522 such that the pressing member 556 is vertically movable relative to the main member 522.

The CS is sandwiched by the CS holding claws 554 and the CS pressing plate 556, such that the CS supporting surfaces 552 of the holding claws 554 contact one end portion of the lower surface of the CS and the CS positioning surfaces 553 of the claws 554 contact one side surface of the CS. Thus, the CS is effectively prevented from being moved relative to the CS holding device 510 in the horizontal direction, when the holding device 510 is moved in the horizontal direction. In addition, the CS is effectively prevented from being vibrated in the vertical direction.

The pivotable member 550 of the pivot-type holding portion 518 is pivoted by a pivoting device 564, which includes two air-operated cylinder devices 566, and a motion converting device 568. The motion converting device 568 includes a rod 570 as a cam follower, and a cam 574. In the state in which the rod 570 is opposed to a piston of each of the air cylinders 566, and if the piston is axially moved, the rod 570 is axially moved. The cam 574 is a semi-cylindrical member having a semi-circular cross section, and the rod 570 includes an end portion 572 which is engaged with an outer circumferential surface of the cam 574 such that the end portion 572 is slideable on the outer surface of the cam 574. A generally middle portion of the cam 574 is attached to the pivotable member 550 such that the cam 574 is not rotatable relative to the pivotable member 550. The end portion 572 is formed of silicon, and has a semispherical shape. Thus, the coefficient of friction of the end portion 572 with respect to the cam 574 is very low. A spring 575 which biases the rod 570 upward to its retracted position is supported by the main member 522, such that the spring 575 extends parallel to the rod 570. When the piston of each of the air cylinders 566 is retracted, the rod 570 is retracted by the biasing force of the spring 575. Another spring 576 which biases the cam 574 toward its CS holding position (i.e., its original position shown in FIG. 20) is provided between the cam 574 and the main member 522. A stopper 578 which defines a limit of rotation of the cam 574 is fixed to the CS-pressing-plate support member 558. Thus, the stopper 578 defines a limit of pivotal movement of the pivotable member 550.

The two air cylinders 566 are fixed to two positions of the movable main member 362 of the CS mounting device 342, respectively, which correspond to two operative positions (i.e., a CS receiving position and a CS mounting position) of the CS holding device 510, and the motion converting device 568 is fixed to the main member 522. Similarly, another pair of air cylinders 566 are fixed to two positions of the fixed main member 360 of the CS mounting device 342, respectively, which correspond to the two operative positions of the CS holding device 510, and another motion converting device 568 is fixed to the main member 520. As shown in FIG. 19, the air cylinders 566 corresponding to the CS mounting position are attached to a cylinder support member 579 fixed to a main member (not shown) of the present CC mounting system 308, such that the position where the air cylinders 566 are attached the support member 579 is adjustable in the CS conveying direction.

If the CS holding device 510 is stopped at each of its operative positions, where the respective rods 570 fixed to the main members 520, 522 are opposed to respective piston rods of the corresponding two air cylinders 566, and the air cylinders 566 are operated to advance or extend their piston rods in their axial direction, the rods 570 are moved downward and the end portions 572 contact the respective outer surfaces of the cams 574. Since the end portions 572 can slide on the cams 574 being forcedly rotated, the rods 570 are permitted to further move downward. Accordingly, the pivotable members 550 are pivoted, so that the pivot-type holding portions 516, 518 are switched from their CS holding position where the CS holding claws 554 holds the CS, to their CS releasing position where the claws 554 releases the CS. On the other hand, when the piston rods of the air cylinders 566 are retracted, the cams 574 are returned to their CS holding position by the biasing forces of the springs 576, and the rods 570 are moved upward by the biasing forces of the springs 575.

Since in the present embodiment the air cylinders 566 are fixed to the main members 360, 362 of the CS mounting device 342, the CS holding device 510 enjoys its reduced weight and accordingly is easily movable. The rods 570 of the motion converting devices 568 can be easily operated by just axially aligning the rods 570 with the piston rods of the air cylinders 566 and operating the air cylinders 566. Thus, the air cylinders 566 and the motion converting devices 568 enjoy simple constructions, although the cylinders 566 and the converting devices 568 are provided on separate members, respectively.

Figure 38:
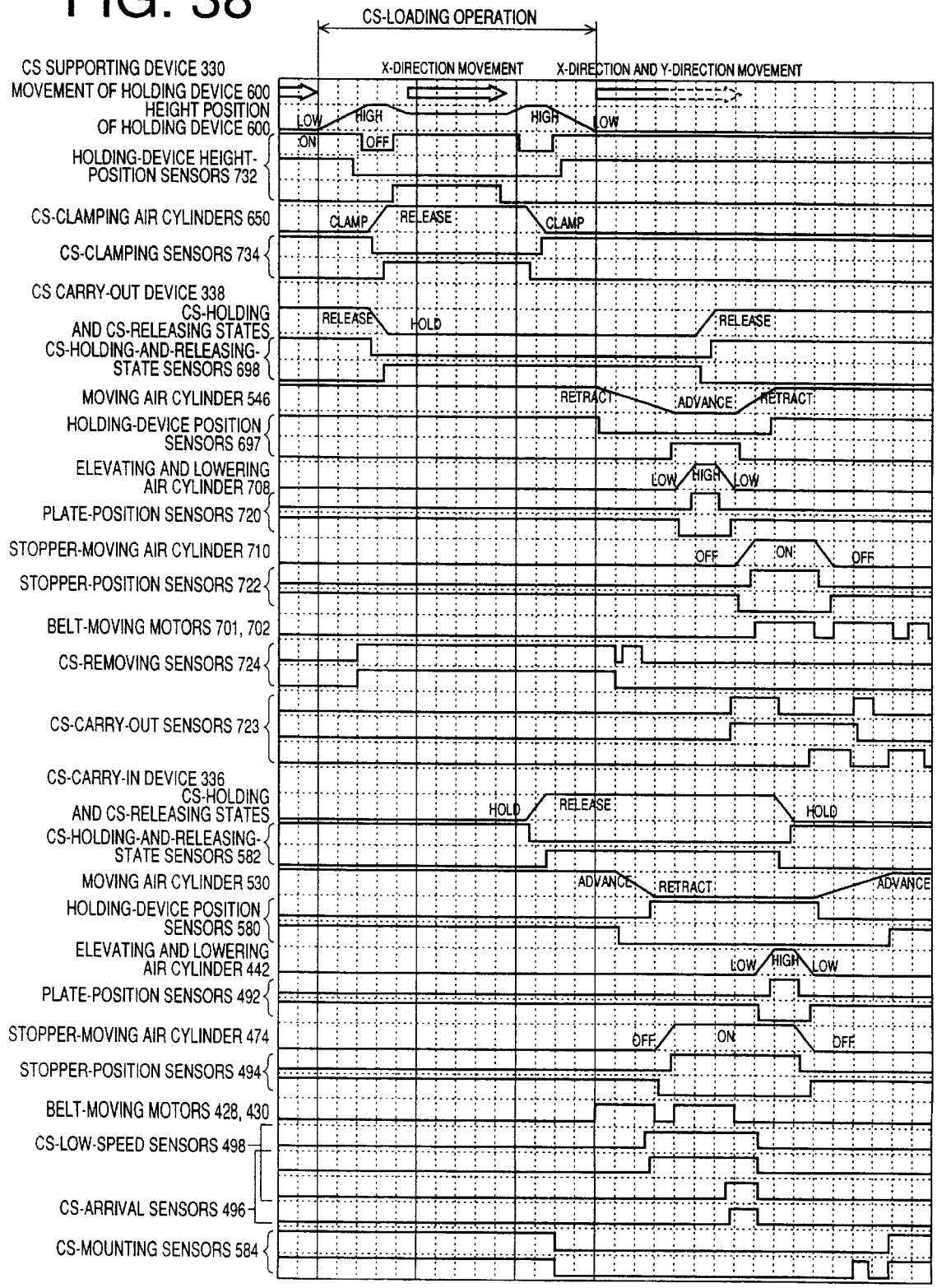
FIG. 38 is a time chart representing respective actions of various elements of the CC mounting system of FIG. 14 during the CS transferring operation thereof.

In the CS mounting device 342, the CS holding device 510 is moved between the CS receiving position where the holding device 510 receives the CS from the CS HCI device 340, and the CS mounting position where the holding device 510 mounts the CS on the CS supporting device 330. The CS receiving and mounting positions correspond to the opposite limits of movement of the driver-side slider 532, that is, the opposite ends of movement of the piston of the air cylinder 530. The CS receiving and mounting positions of the CS holding device 510 are detected by two CS-holding-device position sensors 580 (FIG. 36), respectively. The CS holding and releasing states of the CS holding device 510 are detected by two CS-holding-device state sensors 582, respectively. Two CS recognizing sensors 584 detect whether two CSs are present at a CS-mounting height position at the CS mounting position. The two sensors 584 are provided at respective positions on the main member (not shown) of the CC mounting system 308 which correspond to the downstream and upstream CSs held by the CS holding device 510 at the CS mounting position. Each sensor 584 detects whether a corresponding CS is present, based on whether the sensor 584 can detect the light reflected from the CS. FIG. 38 shows that the sensor 584 corresponding to the upstream CS produces, after normal ON and OFF signals, a short ON signal, because the sensor 584 first detects the first or downstream one of each pair of CSs for a short time when the CS holding device 510 is moved in the horizontal direction, and then detects the second or upstream CS.

As shown in FIGS. 24 to 32, the CS supporting device 330 includes a main CS-holding device 600, a main-holding-device moving device 602, a guiding device 604, and a main-holding-device elevating and lowering device 606. The main-holding-device moving device 602 includes an X-Y table 612 which supports a main member 610 of the CS supporting device 330, and an electric motor 613 which moves the X-Y table 612 in the CS conveying direction (i.e. X direction) and the Y direction perpendicular to the X direction, so that the main member 610 is moved in the X and Y directions.

Figure 24:
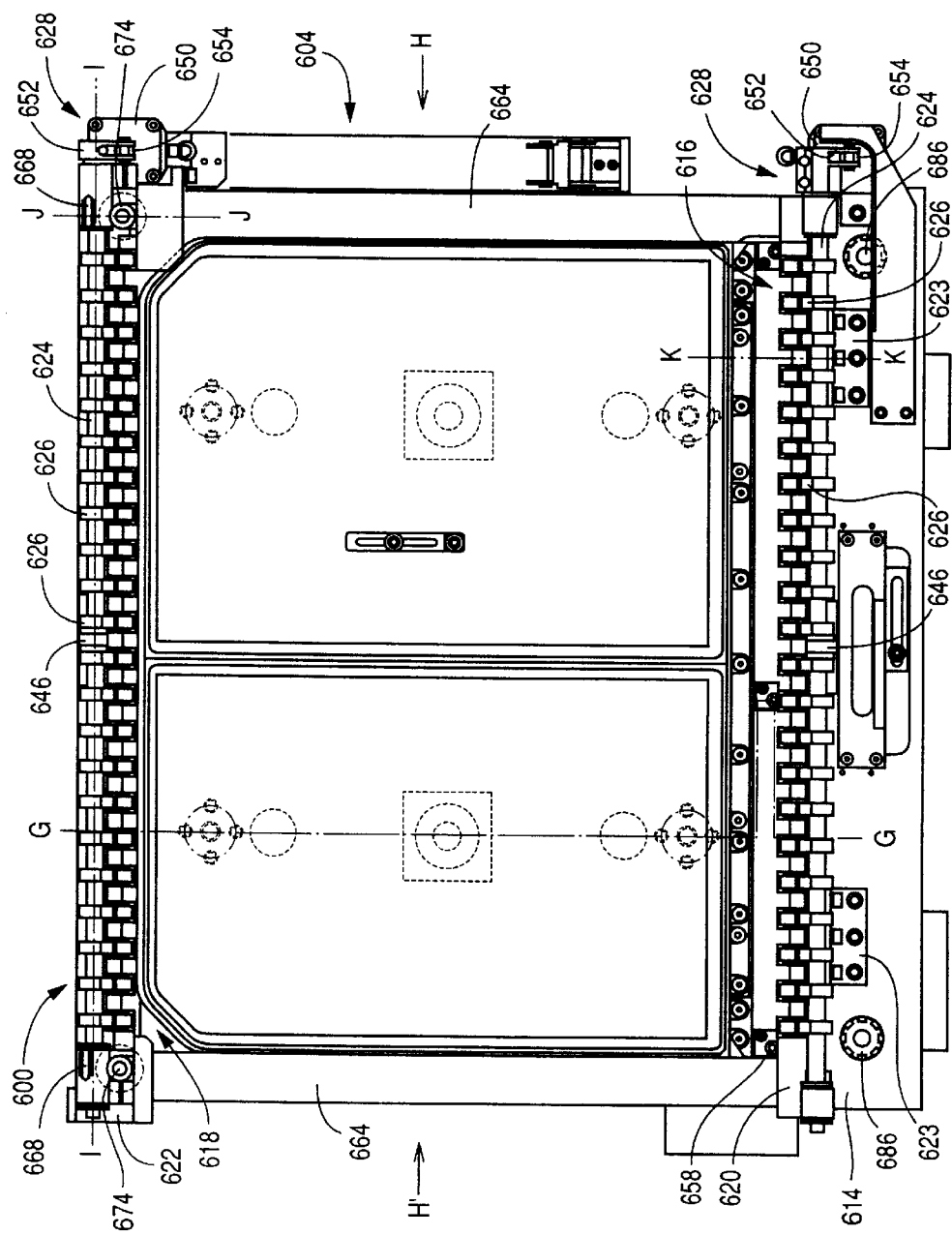
FIG. 24 is a plan view of a CS supporting device of the CC mounting system of FIG. 14.
Figure 25:
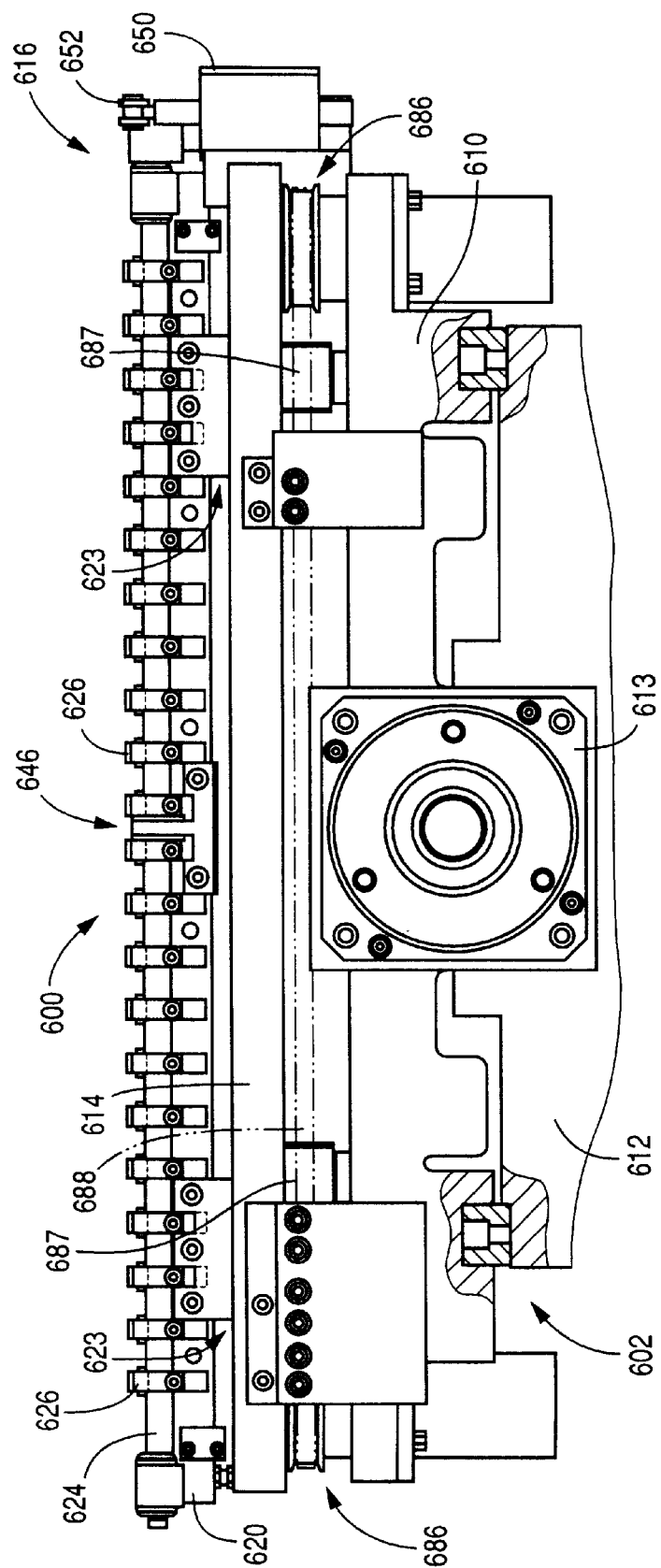
FIG. 25 is a front elevation view of the CS supporting device of FIG. 24.

The main-holding-device elevating and lowering device 606 which is provided on the main member 610 moves a main member 614 of the main CS-holding device 600, upward and downward, relative to the main member 610. The main CS-holding device 600 includes a pair of clamp-type holding portions 616, 618 which include respective main members 620, 622. The main member 620 of the holding portion 616 is fixedly attached to the main member 614, and the main member 622 of the holding portion 618 is movably attached to the same 614. As shown in FIG. 24, the main member 620 is fixed to the main member 614 with two fixing devices 623. Since the clamp-type holding portions 616, 618 belong to the main CS-holding device 600, it can be said that the main members 620, 622 belong to the main CS-holding device 600.

Each of the clamp-type holding portions 616, 618 includes, in addition to the corresponding main member 620, 622, a rotatable axis member 624 which is supported by the corresponding main member 620, 622 such that the axis member 624 is rotatable relative thereto; a number of clamp members 626 which are fixed to the axis member 624 such that the clamp members 626 are provided at a regular interval of distance; and a rotating device 628 which rotates the axis member 624 and thereby drives the clamp members 626. Since the clamp-type holding portions 616, 618 are identical with each other except that the holding portion 616 is fixed to the main member 614 and the holding portion 618 is movable relative to the same 614, there will be described the holding portion 618 movably provided on the side of the main member 622, and the description of the holding portion 616 fixedly provided on the side of the main member 620 is omitted.

The main member 622 of the clamp-type holding portion 618 is a comb-like member extending in the CS carrying direction. As shown in FIGS. 21 and 28 to 31 (however, FIG. 30 shows the clamp-type holding portion 616), the main member 622 has a CS support surface 632 which supports one end portion of the lower surface of the CS; a CS positioning surface 634 which contacts one side surface of the CS and thereby positions the CS in the width-wise direction of the CS; and an axis-member accommodating space 636 in which the axis member 624 is accommodated. The CS is clamped by the CS support surface 632 of the main member 622 and respective clamp claws 644 of the clamp members 626.

The axis member 624 is supported, at its opposite end portions, by the main member 622 such that the axis member 624 is rotatable relative to the main member 622, and is supported, at its generally middle portion, by the same 622 via a bearing 646. The rotating device 628 is provided in association with one of the opposite end portions of the main member 622.

Figure 27:
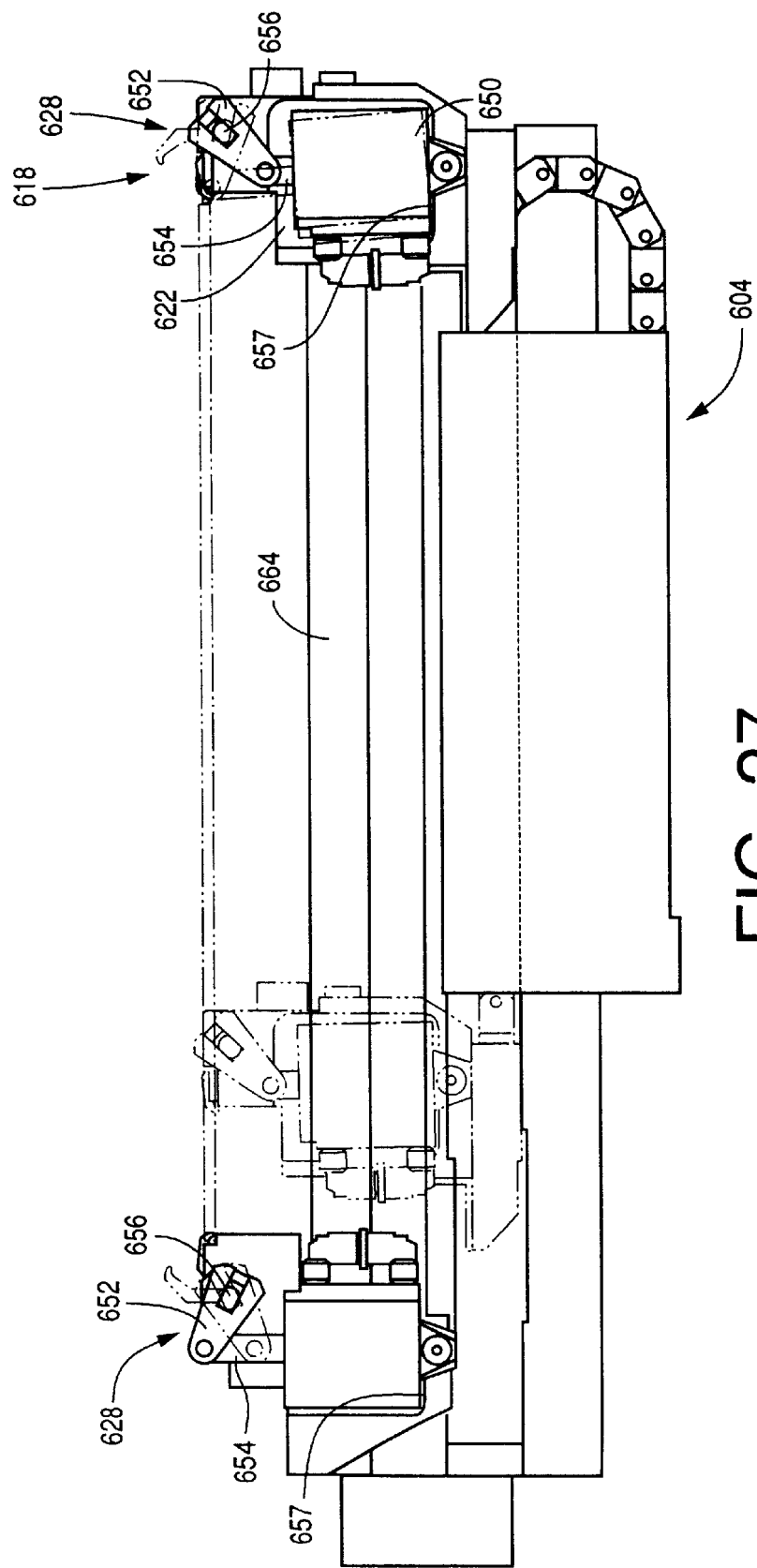
FIG. 27 is a side elevation view of the CS supporting device taken from point, H, in FIG. 24.

As shown in FIG. 27, the rotating device 628 includes an air-operated cylinder device 650 and a drive lever 652. One end portion of the drive lever 652 is pivotally connected to a piston rod 654 of the air cylinder 650, and the other end portion of the lever 652 is engaged with an end portion 656 of the axis member 624. More specifically described, the end portion 656 has two chamfered surfaces which are parallel to each other, and the other end portion of the lever 652 sandwiches the chamfered end portion 656. When the air cylinder 650 is operated and the piston rod 654 is vertically moved, the drive lever 652 is pivoted about the axis member 624, so that the axis member 624 is rotated. Thus, the main CS-holding device 600 is switched between its CS clamping position and its CS releasing or non-clamping position.

The air cylinder 650 is pivotally attached to the main member 622. Accordingly, the clamp-type holding portion 618 can clamp, with a substantially constant force, each of different sorts of CSs having different thickness values. In addition, this arrangement assures that the piston rod 354 is smoothly advanced from, and retracted into, a housing of the air cylinder 650.

As shown in FIGS. 14 and 15, the air cylinder 650 is attached to the main member 622 such that a portion thereof is accommodated in a special space formed in the main member 622. An inner, bottom surface 657 partly defining the special space defines a limit of the pivotal movement of the air cylinder 650.

The clamp members 626 are provided such that the clamp claws 644 face the CS support surface 632 of the main member 622 of the clamp-type holding portion 618. When the CS is transferred from the CS mounting device 342 to the CS supporting device 330, the CS holding device 510 of the CS mounting device 342 is positioned such that the holding claws 554 of the CS holding device 510 are alternate with the clamp claws 644 of the main CS-holding device 600, as shown in FIG. 21. Thus, the holding claws 554 and the clamp claws 644 do not interfere with each other. In addition, since the holding claws 554 and the clamp claws 644 simultaneously hold and clamp the CS, the CS can be transferred with reliability.

The above description is also true for the transferring of the CS from the CS supporting device 330 to the CS removing device 348. Since the clamp claws 644 are alternate with the holding claws 554 of a CS holding device 648 of the CS removing device 348, the CS can be removed from the main CS-holding device 600 with reliability.

Figure 26:
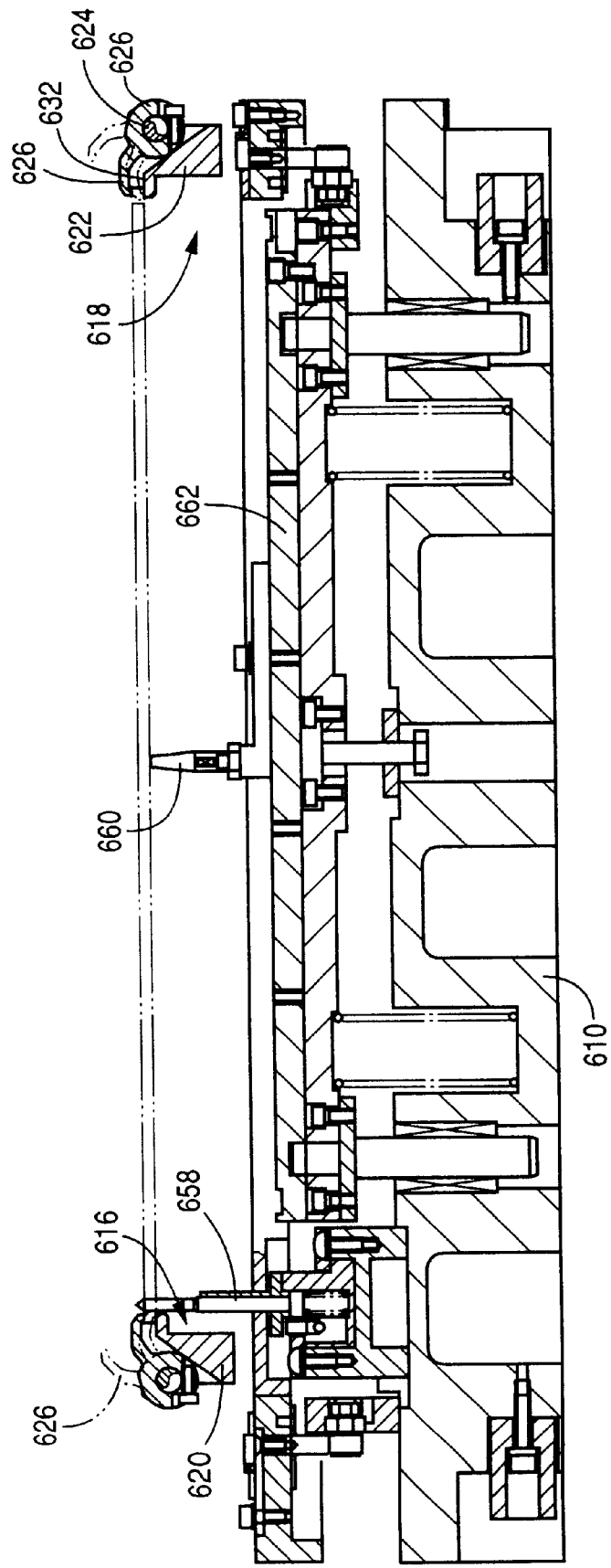
FIG. 26 is a cross-section view of the CS supporting device taken along line, G—G, in FIG. 24.

In the state in which the CS is clamped by the clamp-type holding portions 616, 618, a positioning pin 658 is inserted in a hole formed in the CS as shown in FIG. 26, and a backup pin 660 supports the lower surface of the CS opposite to the upper surface thereof on which the CCs are to be mounted. The backup pin 660 is fixed to a pin support member 662, which is vertically movable.

Figure 28:
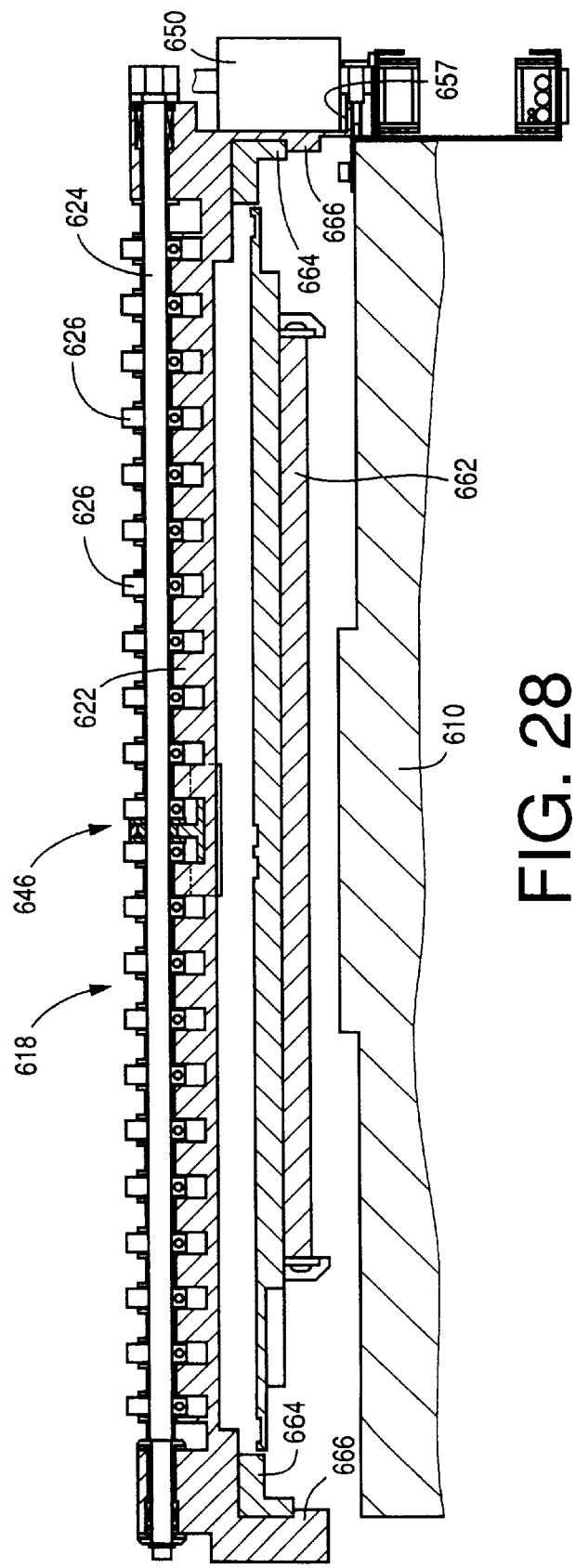
FIG. 28 is a cross-section view of the CS supporting device taken along line, I—I, in FIG. 24.

As shown in FIGS. 27 and 28, the guiding device 604 includes two guide rails 664, and two engagement portions 666. The guide rails 664 are part of the main member 614 of the main CS-holding device 600, and the engagement portions 666 are part of the main member 622 of the pivot-type holding portion 618. As shown in FIG. 18, the main member 622 has two width-adjusting engageable grooves 668 formed in opposite end portions thereof. Meanwhile, the movable main member 364 of the CS removing device 348 has two engageable projections 670 provided on opposite end portions thereof. The grooves 668 and the projections 670 are engageable with each other. At the CS removing position where the CS supported by the CS supporting device 330 is removed by the CS removing device 348, the projections 670 are engageable with the width-adjusting grooves 668. In the state in which the projections 670 are engaged with the grooves 668, the main member 622 is moved toward, and away from, the main member 620, like in the CS HCI device 340, the CS HCO device 346, the CS mounting device 342, and the CS removing device 348.

The adjusting of the CS-carrying width may be performed by causing, e.g., the two guide members 424, 426 of the CS HCI device 340 to contact the width-wise opposite side surfaces of the CS, respectively. This assures that the CS positioning surfaces 553 of the holding claws 554 of the pivot-type holding portions 516, 518 of the CS mounting device 342 or the CS removing device 348 can contact and position the width-wise opposite side surfaces of the CS, and that the CS positioning surfaces 634 of the main members 620, 622 of the clamp-type holding portions 616, 618 of the CS supporting device 330 can contact and position the width-wise opposite side surfaces of the CS. Regarding the CS HCO device 346, the guide members 424, 426 thereof can contact and guide the width-wise opposite side surfaces of the CS, like the CS HCI device 340.

Figure 29:
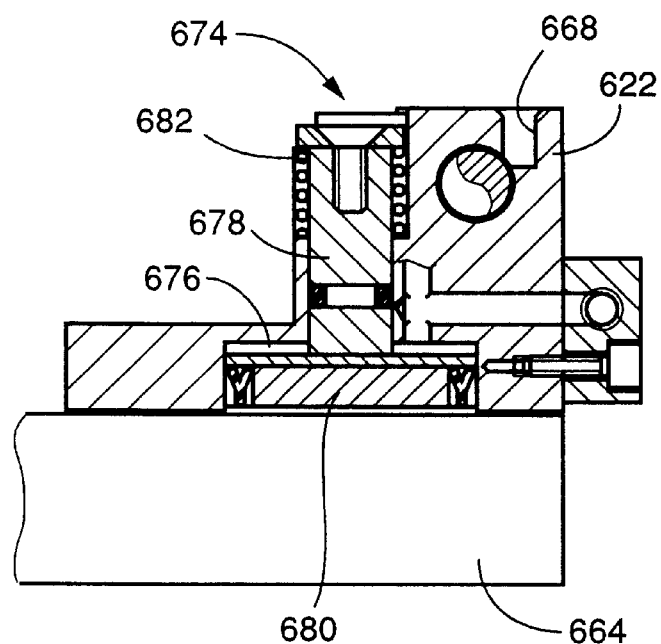
FIG. 29 is a cross-section view of the CS supporting device taken along line, J—J, in FIG. 24.
Figure 30:
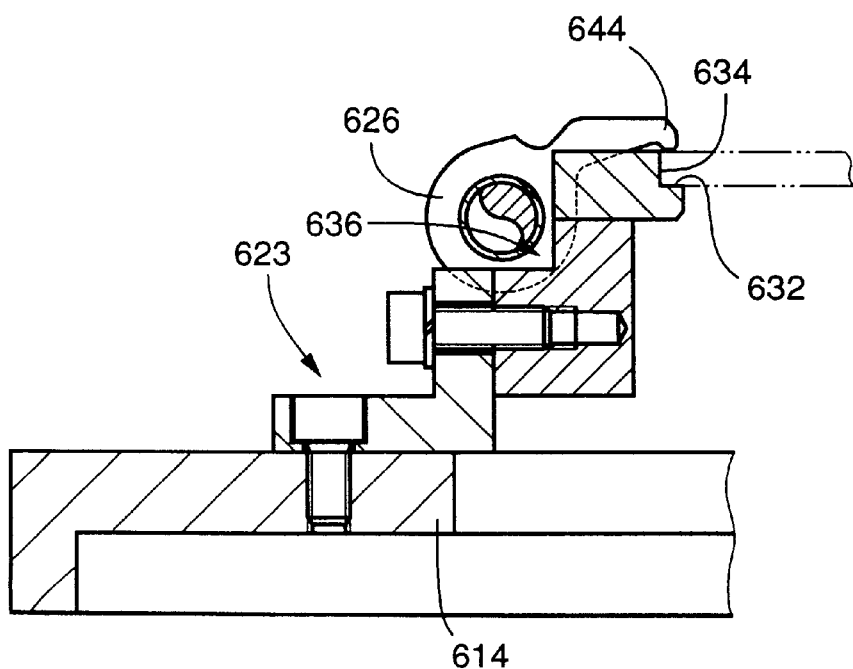
FIG. 30 is a cross-section view of the CS supporting device taken along line, K—K, in FIG. 24.
Figure 31:
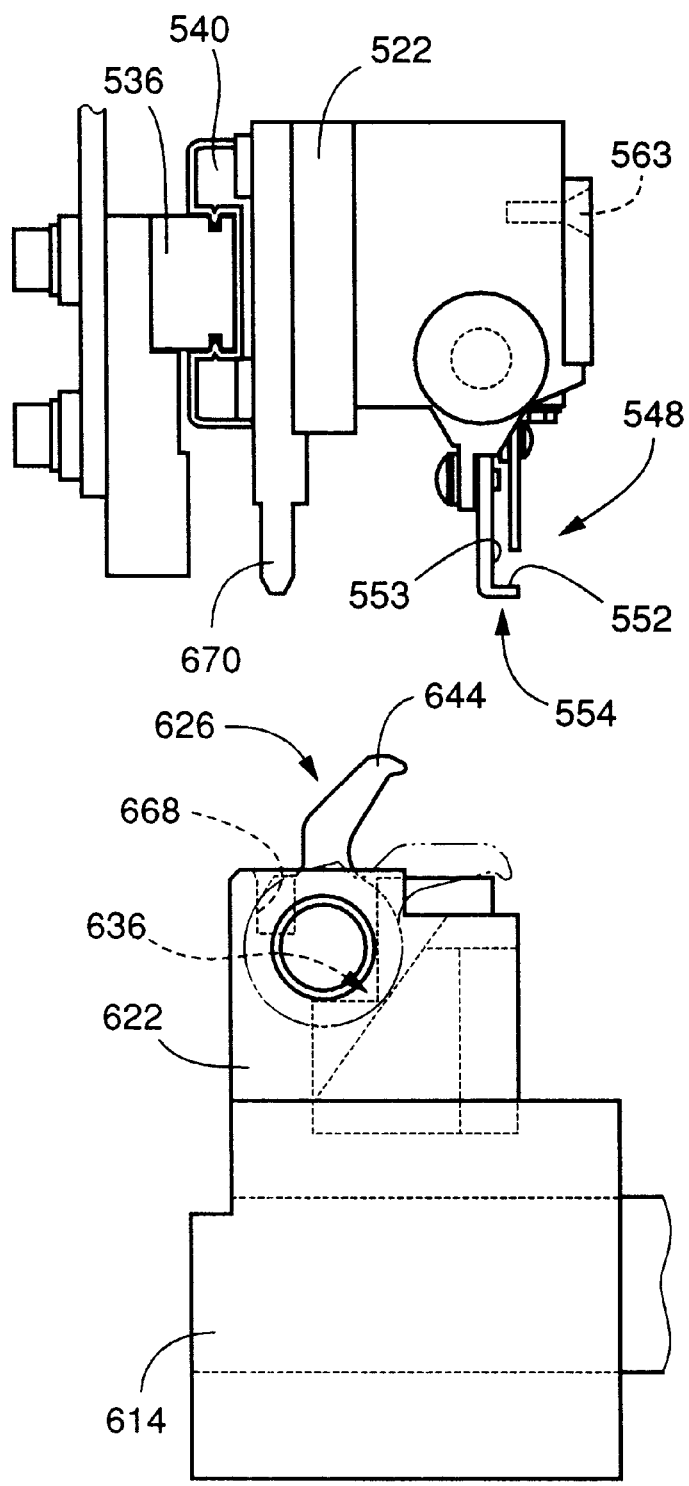
FIG. 31 is a side elevation view of the CS supporting device and a CS removing device of the CC mounting system of FIG. 14.

FIG. 29 shows one of two fixing devices 674 which are provided on the main member 622 of the pivot-type holding portion 618. Each fixing device 674 includes an air-operated cylinder device 676. When the air cylinder 676 is operated, a pressing member 680 fixed to a piston 678 of the cylinder 676 presses the corresponding guide rail 664, so that the main member 622 is fixed at its current position. A spring 682 is provided between the piston 678 and the main member 622. When the air cylinder 676 is deactivated, the piston 678 is moved upward by the biasing force of the spring 682, so that the main member 622 is released.

Figure 32:
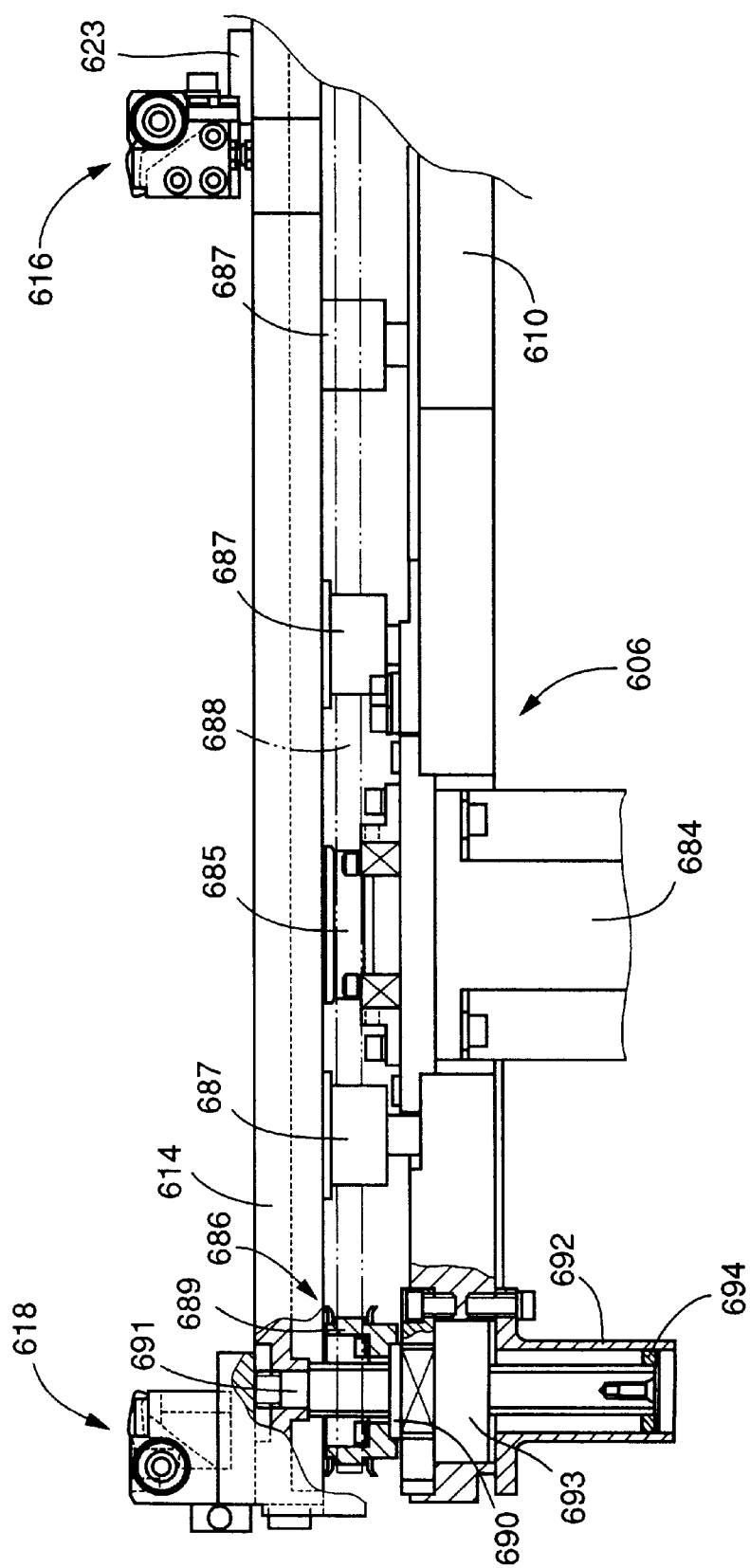
FIG. 32 is a side elevation view of the CS supporting device taken from point, H', in FIG. 24.

As described above, the main-holding-device elevating and lowering device 606 elevates and lowers the main member 614 of the main CS-holding device 600 which supports the clamp-type holding portions 616, 618. In the present embodiment, as shown in FIG. 32, the elevating and lowering device 606 includes an electric motor 684; a drive pulley 685; four feeding-screw devices 686 provided in four corners of the main member 610 of the CS supporting device 330, respectively; a plurality of driven pulleys 687; and a timing belt 688. The driven pulleys 687 are attached to the main member 610 such that the pulleys 687 are rotatable relative to the main member 610. The rotation of the drive pulley 685 is transmitted to the feeding-screw devices 686. Each feeding-screw device 686 includes a driven portion 689 on which the timing belt 688 is wound; a nut 690 which is rotatable with the driven portion 689; and a ball screw 691 which is threadedly engaged with the nut 690. The ball screw 691 is fixed, at an upper end portion thereof, to the main member 614, and a lower portion of the screw 691 is covered by a cover member 692. The nut 690 is attached to a housing 693 via a bearing such that the nut 690 is rotatable relative to the housing 693 and is not movable in an axial direction thereof relative to the same 693. The housing 693 is fixed to the main member 610. When the nut 690 is rotated, the ball screw 691 is moved upward and downward, while a sliding member 694 provided at a lower end portion of the ball screw 691 slides on an inner circumferential surface of the cover member 692.

When the electric motor 684 is operated, the drive pulley 685 is rotated and accordingly the nut 690 of each feeding-screw device 686 is rotated. Thus, the four ball screws 691 are moved upward and downward and accordingly the clamp-type holding portions 616, 618 are moved upward and downward. Since the four feeding-screw devices 686 are simultaneously operated, the main CS-holding device 600 is elevated and lowered while keeping its horizontal attitude.

Figure 33:
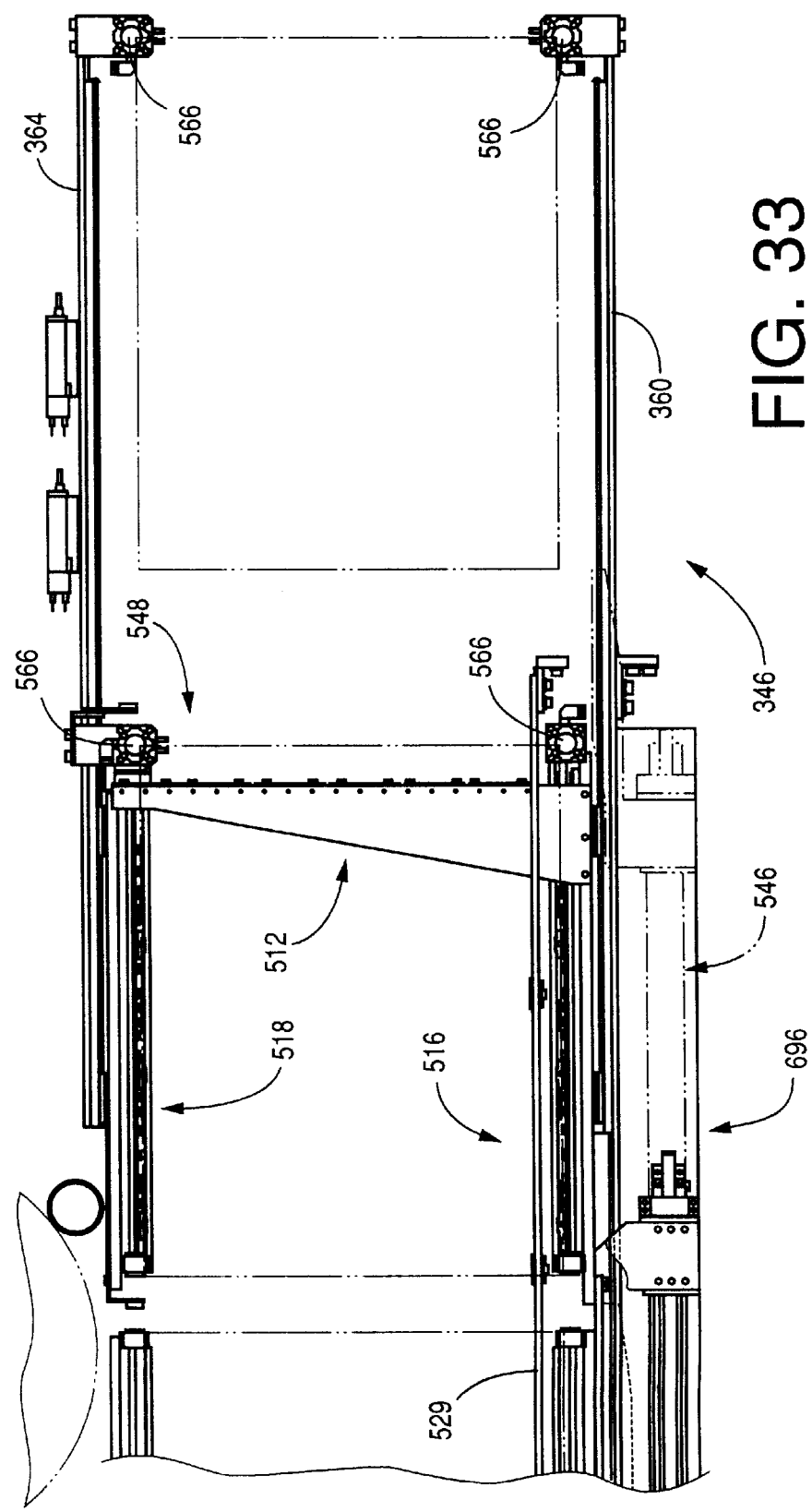
FIG. 33 is a plan view of the CS removing device of FIG. 31.

As shown in FIG. 33, the CS removing device 348 has substantially the same construction as that of the CS mounting device 342. The CS removing device 348 includes the above-mentioned CS holding device 548, and a holding-device moving device 696 including an air-operated cylinder device 546. However, the CS removing device 348 has four air-operated cylinder devices 566 which are provided symmetrically with those of the CS mounting device 342. In addition, as described above, the movable main member 364 of the CS removing device 348 has, at the opposite end portions thereof, the two projections 670 which are engageable with the two width-adjusting grooves 668 of the CS supporting device 330.

Like the CS mounting device 342, the CS removing device 348 is provided with two CS-holding-device position sensors 697 (FIG. 36) which detect that the CS holding device 548 is currently positioned at a CS removing position and a CS transferring position, respectively; and two CS-holding-device state sensors 698 which detect that the CS holding device 548 is currently taking a CS holding state and a CS releasing state, respectively.

Figure 34:
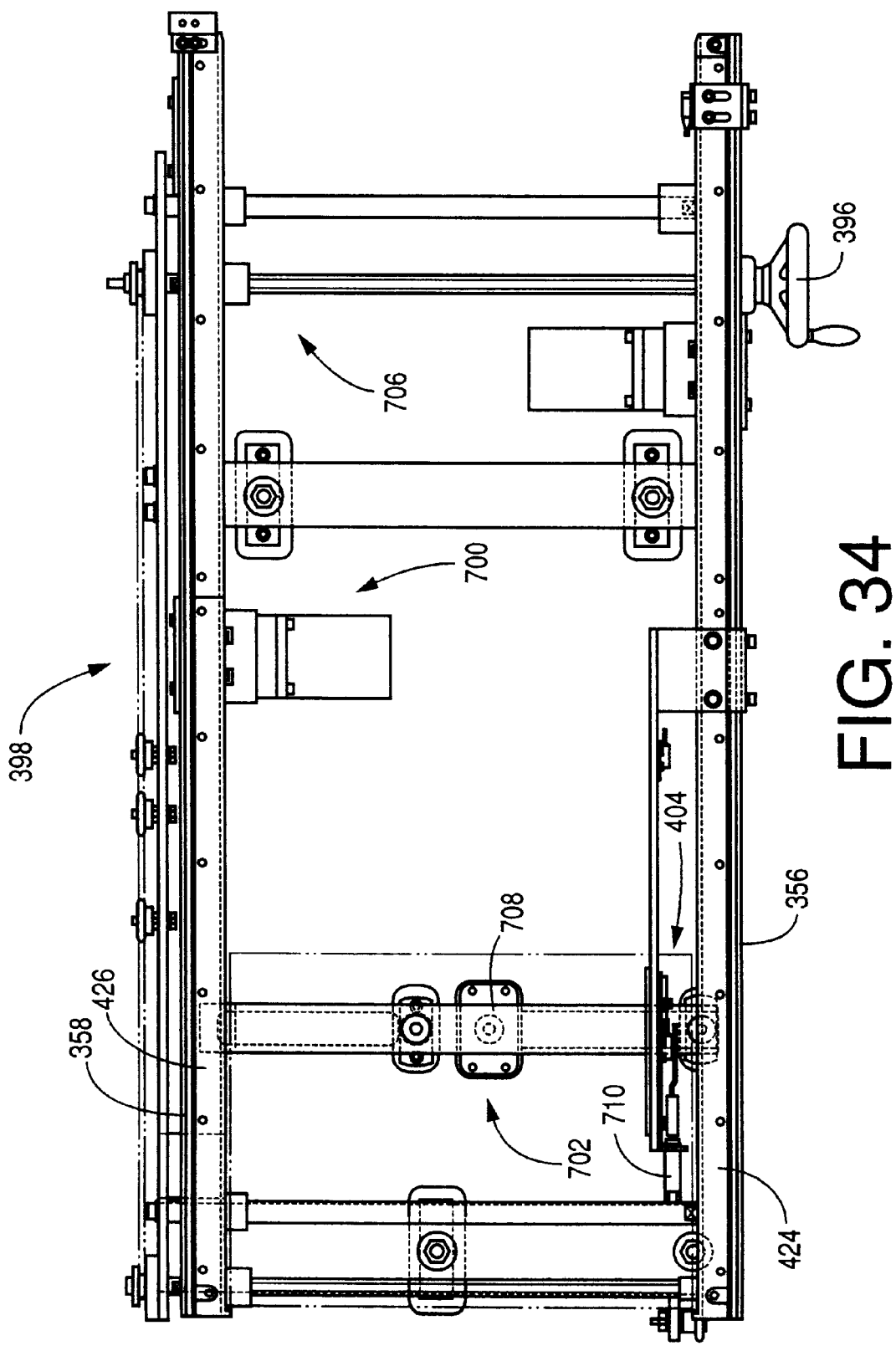
FIG. 34 is a plan view of a CS horizontal-carry-out ("HCO") device of the CC mounting system of FIG. 14.
Figure 35:
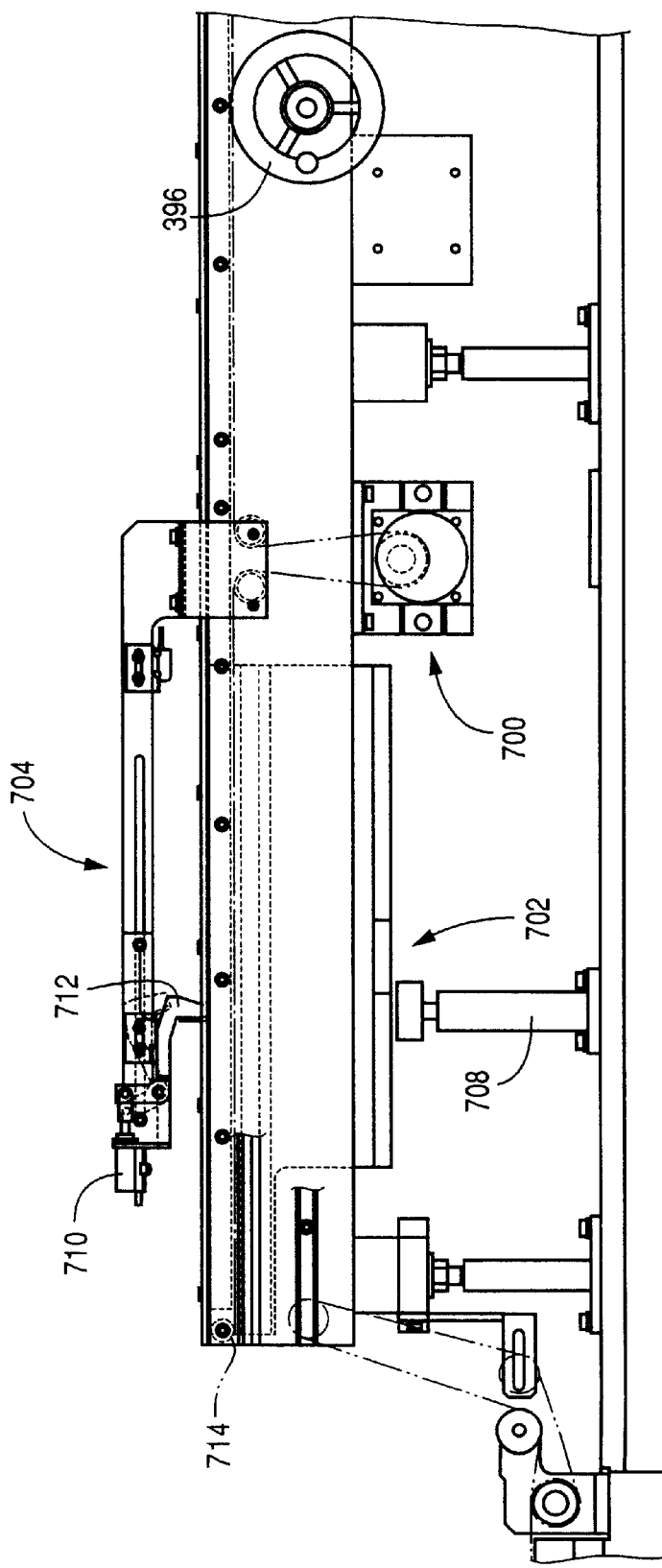
FIG. 35 is a front elevation view of the CS HCO device of FIG. 34.

The CS HCO device 346 is similar to the CS HCI device 340. As shown in FIGS. 34 and 35, the CS HCO device 346 includes a horizontal-direction CS-moving device 700, a CS-support-member elevating and lowering device 703, a CS-horizontal-movement stopping device 704, and a CS-carrying-width adjusting device 706. The horizontal-direction CS-moving device 700 includes two electric motors 701, 702 corresponding to the electric motors 428, 430 of the CS HCI device 340. The CS-carrying-width adjusting device 706 includes the handle 396, as described previously. When the handle 396 is rotated by the operator, the CS-carrying width of the CS carrying device 310 as a whole can be adjusted. The elevating and lowering device 703 includes an air-operated cylinder device 708 which is provided in an upstream-side portion of the CS HCI device 346. The CS-horizontal-movement stopping device 704 is also provided in the upstream-side portion of the CS HCI device 346, and includes an intermediate stopper 712 and an air-operated cylinder device 710 which moves the stopper 712 to its operative and inoperative positions.

After two CSs are transferred from the CS removing device 342 to the CS HCO device 346, the two CSs are supported on two carry-out belts 714. The intermediate stopper 712 is moved to its operative position at a position between the two CSs. When the belts 714 are driven, the downstream CS is carried out but the horizontal movement of the upstream CS is stopped by the stopper 712. Subsequently, when the stopper 712 is moved to its inoperative position, the upstream CS is carried out by being moved in the horizontal direction. Owing to the intermediate stopper 712, the two CSs can be carried out one by one.

Like the CS HCI device 340, the CS HCO device 346 is provided with two plate sensors 720 corresponding to the plate sensors 492; two stopper sensors 722 corresponding to the stopper sensors 494; and a CS-carry-nut sensor 723. The CS-carry-out sensor 723 corresponds to the CS-arrival sensors 496 of the CS HCI device 340, and detects that each CS has passed a predetermined position and accordingly has been carried out. In addition, the CS removing device 348 is provided with two CS recognizing sensors 724 which correspond to the CS recognizing sensors 584 of the CS mounting device 342 and which detect whether two CSs are present at a CS-removing height position at the CS removing position. The two sensors 724 are provided on the main member (not shown) of the CC mounting system 308, in the same manner as that in which the two sensors 584 of the CS mounting device 342 are provided. The two sensors 724 can identify that the two CSs have been actually removed at the CS removing position and are currently held by the CS holding device 548.

The present CC mounting system 308 employs an air supplying device (not shown) which provides an air which is supplied to each of the air cylinders 442, 474, 530, 546, 566, 650, 676, 708, 710 after the pressure of the air has been regulated to a value falling in a predetermined range. In addition, each of the air cylinder 442 or 708 and the air cylinder 474 or 710 of the CS HCI or HCO device 340 or 342, the air cylinders 530, 566 of the CS mounting device 342, and the air cylinders 546, 566 of the CS removing device 348 is supplied with the air whose flow rate has been regulated to control the rate of movement of the corresponding piston.

Regarding the air cylinder 442 of the CS HCI device 340, the flow rate of the air supplied thereto is regulated, when the CS support plates 440 are elevated, so that the rate or speed of upward movement of the plates 440 is low. Since the plates 440 are holding the CS, the speed is controlled to be low. Thus, when the CS is transferred to the CS mounting device 342, the CS contacts the CS pressing plates 556 at the low speed.

Similarly, regarding the air cylinder 708 of the CS HCO device 346, the flow rate of the air supplied thereto is regulated, when the CS support plates 440 are elevated, so that the speed of upward movement of the plates 440 is low. Thus, when the CS HCO device 346 receives the CS from the CS removing device 348, the CS support plates 440 contact the lower surface of the CS at the low speed. The speed of downward movement of the plates 440 may also be low, because the plates 449 are holding the CS when being moved downward.

Regarding the air cylinder 530 of the CS mounting device 342, the speed of forward movement of the CS holding device 510 from the CS receiving position to the CS mounting position is controlled to be low, because the holding device 510 is holding the CS. On the other hand, when the CS holding device 510 is moved backward from the CS mounting position to the CS receiving position, the speed of backward movement of the holding device 510 may he controlled to be high, because the holding device 510 is not holding a CS. Similarly, regarding the air cylinder 546 of the CS removing device 348, the speed of forward movement of the CS holding device 548 from the CS removing position to the CS transferring position is controlled to be low, because the holding device 548 is holding the CS.

Regarding the air cylinder 474 of the CS HCI device 340, the speed of movement of the intermediate stopper 462 from its inoperative position to its operative position is controlled to be low. This is also true with the air cylinder 710 of the CS HCO device 346. Regarding the air cylinder 566 of the CS mounting device 342, the speed of movement of the holding claws 554 from their CS releasing position to their CS holding position is controlled to be higher than that of movement of the same 554 from their CS holding position to their CS releasing position; and regarding the air cylinder 566 of the CS removing device 348, the speed of movement of the holding claws 554 from their CS holding position to their CS releasing position is controlled to be higher than that of movement of the same 554 from their CS releasing position to their CS holding position. Thus, the CS can be transferred more quickly.

The present CC mounting system 308 includes a control device 730 including an input port to which main-holding-device height-position sensors 732 and CS-clamping sensors 734 are connected in addition to the above-described various sensors 492, 494, 496, 498, 580, 582, 584, 697, 698, 720, 722, 723, 724; and an output port to which the electric motors 428, 430, 613, 684, 701, 702 and respective solenoid-operated flow-rate control valves of the air cylinders 442, 474, 530, 546, 566, 650, 676, 708, 710 are connected via respective drive circuits. The main-holding-device height-position sensors 732 detect the current height position of the main CS-holding device 600 of the CS supporting device 330, and the CS-clamping sensors 734 detect or identify whether the CS is clamped by the main CS-holding device 600. The control device 730 controls those motors and cylinders based on the output signals supplied from those sensors. The sensors 732 are photoelectric position sensors which are provided on the main member 610 of the CS supporting device 330 and each of which detects a detectable object which is provided on the main member 614 of the main CS-holding device 600 and accordingly is movable with the same 614. In the present embodiment, three position sensors 732 are employed which identify whether the object is taking any one of three predetermined height positions, i.e., CS-mounting height position (i.e., CS-removing height position), horizontal-movement height position, and CC-mounting height position. More specifically described, the three sensors 732 include a CS-mounting-height-position sensor which produces an OFF signal when the main CS-holding device 600 is taking a position not lower than the CS-mounting height position, and an ON signal when the device 600 is taking a position lower than the CS-mounting height position; a horizontal-movement-height-position sensor which produces an ON signal when the device 600 is taking a position not lower than the horizontal-movement height position, and an OFF signal when the device 600 is taking a position lower than the horizontal-movement height position; and a lowermost-position sensor which produces an ON signal when the device 600 is taking a position not higher than the CC-mounting height position, and an OFF signal when the device 600 is taking a position higher than the CC-mounting height position.

Figure 37:
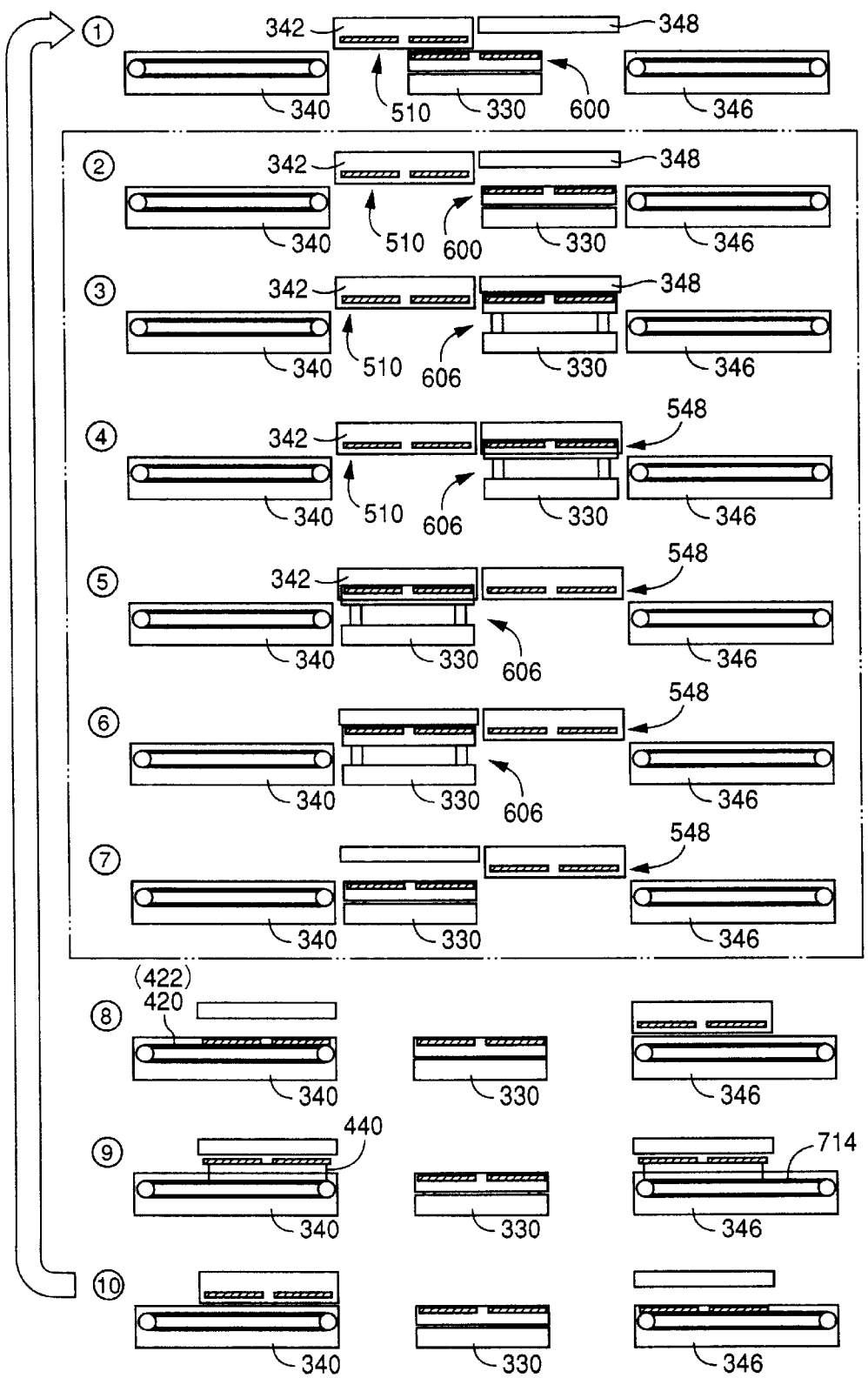
FIG. 37 is a view showing various steps of a CS transferring operation of the CC mounting system of FIG. 14.

Next, there will be described the operation of the CC mounting system 308 by reference to FIGS. 37 and 38.

In the first step, the CCs are mounted on the CSs. In the second step, the main CS-holding device 600 of the CS supporting device 330 is moved, by the X-Y table 612, to the CS removing position where the CS holding device 548 of the CS removing device 348 is waiting in its CS releasing state.

In the third step, the main CS-holding device 600 is moved upward to the CS-removing (i.e., CS-mounting) height position, so that the CSs contact the CS pressing plates 556 of the CS holding device 548. In the fourth step, the air cylinders 650 of the main CS-holding device 600 are operated to rotate the axis members 624 to their CS releasing position, and the air cylinders 566 of the CS holding device 548 are operated to rotate the rotatable members 550 to their CS holding position. Since the clamp claws 644 and the holding claws 554 clamp the CSs such that the clamp claws 644 are alternate with the holding claws 554, the CSs can be transferred from the main CS-holding device 600 to the CS holding device 548. During the first to fourth steps, the CS holding device 510) of the CS mounting device 342 waits, at the CS mounting position, in its CS holding state in which the holding device 510 actually holds another pair of CSs. The fourth step is a CS removing step in which the CSs are removed in the direction of thickness of the CSs from the CS supporting device 330.

That the main CS-holding device 600 has been moved up to the CS removing height position is detected or identified by the main-holding-device height-position sensors 732. That the main CS-holding device 600 has been switched from its CS clamping state to its CS releasing state is identified by the CS-clamping sensors 734. That the CS holding device 548 of the CS removing device 348 has been switched from its CS releasing state to its CS holding state is identified by the CS-holding-state sensors 698. That the CS holding device 548 has removed the CSs at the CS removing position and is holding the CSs is identified by the CS-removing-related CS-recognizing sensors 724. That the CS holding device 510 of the CS mounting device 342 is holding the CSs at the CS mounting position is identified by the CS-mounting-related CS-recognizing sensors 584.

In the fifth step after the CSs are thus removed, the main CS-holding device 600 is moved down to the horizontal-movement height position and then is moved backward to the CS mounting position in a horizontal direction. At the CS removing position, the main CS-holding device 600 and the CS holding device 548 of the CS removing device interfere with each other. Therefore, the main device 600 is moved downward to the height position where those two devices 600, 548 cannot interfere with each other. Since the main device 600 is not holding any CSs, the device 600 can be moved at a high speed to the CS mounting position where the CS holding device 510 of the CS mounting device 342 waits holding another pair of CSs as described above.

In the sixth step, the main CS-holding device 600 is moved up to the CS mounting height position where the axis members 624 are rotated to switch the main device 600 to its CS clamping state and the rotatable members 550 are rotated to switch the CS holding device 510 of the CS mounting device 342 to its CS releasing state. Thus, the CSs are transferred in the direction of thickness thereof from the CS mounting device 342 to the CS supporting device 330. That the CS holding device 510 has been switched from its CS holding state to its CS releasing state is identified by the CS-holding-state sensors 582.

In the seventh step, the main CS-holding device 600 is moved down to the CC-mounting height position. At this time, that the CS holding device 510 is not holding any CSs at the CS mounting position is identified by the CS-mounting-related CS-recognizing sensors 584. This identification means that the CSs have not fallen from the CS mounting device 342 but have been mounted on the CS supporting device 330.

In the eighth step, the main CS-holding device 600 is moved to the CC mounting position where the CC mounting device 310 mounts the CCs on the CSs supported by the main CS-holding device 600.

During the eighth step, the CS holding device 548 of the CS removing device 348 is moved from the CS removing position to the CS transferring position at a low speed. That the CS holding device 548 has been moved to the CS transferring position is identified by the CS-holding-device position sensors 697. That no CS is present at the CS removing position is identified by the CS-removing-related CS-recognizing sensors 724. On the other hand, the CS holding device 510 of the CS mounting device 342 is moved to the CS receiving position at a high speed, and that the CS holding device 510 has been moved to the CS receiving position is identified by the CS-holding-device position sensors 580.

In addition, in the CS HCI device 340, the two electric motors 428, 430 are synchronously operated to drive the two carry-in belts 420, 422, so that two CSs are carried in one by one. After the first CS is stopped by the downstream-end stopper 482, the motors 428, 430 are stopped and the intermediate stopper 462 is switched to its operative position. Then, the motors 428, 430 are resumed to carry in the second CS, so that the second CS is stopped by the intermediate stopper 462. While the second CS is moved in the horizontal direction, the first CS remains stopped in contact with the downstream-end stopper 482 and is not moved in the horizontal direction. When the first or second CS is moved to a predetermined position in the horizontal direction, the rotation speed of the electric motors 428, 430 is lowered to decrease the speed of movement of the CS at which the CS butts the downstream-end or intermediate stopper 482 or 462. That the speed of horizontal movement of the first or second CS has been lowered is identified by the CS-low-speed sensors 498, and that the first or second CS has arrived at the position where the CS butts the stopper 482 or 486 is identified by the CS-arrival sensors 496. That the intermediate stopper 462 has been switched to its operative position is identified by the stopper-operation-state sensors 494.

In the ninth and tenth steps, in the CS HCI device 340, the CS support plates 440 which are supporting the two CSs are moved upward at the CS receiving position. At this time, the CS holding device 510 of the CS mounting device 342 waits in its CS releasing state. The upward movement of the CS support plates 440 causes the CSs to press the CS pressing plates 556, so that the pressing plates 556 are moved upward against the biasing force of the springs 560. When the rotatable members 550 are rotated, the holding device 510 is switched to its CS holding state. When the CS support plates 440 are moved downward, the CS pressing plates 556 press the CSs against the CS support surfaces 552 of the holding claws 554, so that the CSs are held by the holding claws 554. Thus, the two CSs carried in by the CS HCI device 340 are simultaneously transferred in the direction of thickness thereof to the CS mounting device 342. When the CSs are handed from the CS HCI device 340 to the CS mounting device 342, the intermediate stopper 462 may be taking its operative position. In the present embodiment, after this handing, the stopper 462 is returned to its inoperative position. However, it is possible to return the intermediate stopper 462 to its inoperative position after the two CSs have been carried in, i.e., before the CSs are handed to the CS mounting device 342. That the CS support plates 440 have been moved up is identified by the CS-support-plate sensors 492.

Meanwhile, at the CS transferring position, the CS holding device 548 of the CS removing device 348 is holding two CSs. In the CS HCO device 346, the CS support plates 440 are moved upward to butt the lower surfaces of the CSs held by the CS holding device 548, so that the upper surfaces of the CSs push the CS pressing plates 556 upward. Then, the CS holding device 548 is switched to its CS releasing state, and the pressing plates 556 press the CSs on the support plates 440. Thus, the CSs are handed in the direction of thickness thereof to the CS HCO device 346. After the support plates 440 are lowered to the position where the upper surfaces of the plates 440 are lower than those of the carry-out belts 714, the CSs are carried out by the belts 714.

It can be said that the transferring of the CSs in the direction of thickness thereof from the CS removing device to the CS HCO device 346 ends with either the handing of the CSs to the CS support plates 440, or the placing of the CSs on the carry-out belts 714. In either case, the transferring of the CSs is done by using the lower surfaces of the CSs as reference surfaces.

Subsequently, the intermediate stopper 712 is switched to its operative position at an intermediate position between the two CSs placed on the carry-out belts 714. The electric motors 701, 702 are operated, and the downstream CS is carried out. Then, the motors 701, 702 are stopped, and the stopper 712 is switched to its inoperative position. When the motors 701, 702 are resumed, the upstream CS is carried out. Thus, the two CSs placed on the carry-out belts 714 are carried out one by one by being moved in the horizontal direction. That the CSs have been carried out is identified by the CS-carry-out sensor 723. The ninth step is a CS transferring step, and the tenth step is a CC carrying-out step. The eighth to tenth steps are also CC mounting steps.

The present CC mounting system 308 can simultaneously carry three or more CSs on which CCs are to be mounted. In this case, the CS HCI or HCO device 340 or 346 needs two or more CS-horizontal-movement stopping devices 462 or 712. In addition, the present system 308 can carry, at one time, one CS on which CCs are to be mounted. In the last case, the intermediate stoppers 462, 712 are kept at their inoperative position, and is not switched to their operative position.

As is apparent from the foregoing description about the first embodiment of the present invention, the transferring of one or more CSs from the CS HCI device 340 to the CS mounting device 342 and from the CS removing device 348 to the CS HCO device 346 are done in the opposite directions, respectively, both of which are perpendicular to the plane of the CS or CSs, that is, in the direction of thickness of the CS or CSs. Accordingly, the CS holding device 510 or 548 of the CS mounting or removing device 342 or 348 does not have to be able to transfer one or more CSs in a parallel direction parallel to the plane of the CS or CSs. Therefore, the construction of the CS holding device 510 or 548 can be simplified as such and the production cost of the same 510, 548 can be reduced. In addition, since the CS mounting or removing device 342 or 348 does not employ a device for elevating and lowering the CS holding device 510 or 548, the production cost of the same 342, 348 can be reduced as such. Moreover, CSs can be carried in one by one owing to one or more intermediate stoppers 462, and can be carried out one by one owing to one or more intermediate stoppers 712.

In addition, since the present CC mounting system 308 employs the number of air cylinders 442, 474, 530, 546, 566, 650, 676, 708, 710, the system 308 can be produced at a cost lower than that at which the same 308 would be produced by employing a number of electric motors.

In the illustrated embodiment, the control device 730 can change the speed of rotation of the rotatable members 550, the speed of upward and downward movement of the CS support plates 440, and the speed of horizontal movement of each of the CS holding devices 510, 548. However, this is not essentially required. The control device 730 may be adapted to control each of those speeds at a corresponding constant value.

Each of the CS mounting and removing devices 342, 348 may be provided with a device for elevating and lowering a corresponding one of the CS holding devices 510, 548. In this case, both the main CS-holding device 600 and the CS holding device 510, or both the main CS-holding device 600 and the CS holding device 548 can be moved toward each other for transferring one or more CSs. Thus, the time needed for transferring the CSs can be reduced.

The CS holding devices 510, 548 of the CS mounting and removing devices 342, 348 and the main CS-holding device 600 of the CS supporting device 330 may be adapted to hold one or more CSs by applying suction thereto. In this case, too, the CSs can be transferred in the direction of thickness thereof. Each of the pivot-type CS holding devices 510, 548 may be replaced by a horizontal-movement-type CS holding device wherein one or more CS holding member or members is or are moved in a horizontal direction to hold one or more CSs. Each of the rotatable members 550 and the corresponding holding claws 554 may be formed integrally with each other. Each group of holding claws 554 may be replaced by a single holding projection which has a single CS-supporting surface 632 and a single CS-positioning surface 633 which extend over substantially the entire length of the corresponding rotatable member 550. In this case, when the CSs are handed to or from the CS supporting devices 330, the main CS-holding device 600 must clamp respective portions of the CSs which are different from the portions thereof held by the two holding projections. Moreover, it is not essentially required that the CS holding devices 510, 548, 600 hold or clamp the respective portions of the CSs which extend in the CS carrying direction and it is possible that the devices 510, 548, 600 hold or clamp respective portions of the CSs which extend in a direction perpendicular to the CS carrying direction.

The CS-holding air cylinders 566 of the CS mounting or removing device 342, 348 may be provided on the main members 520, 522 of the CS holding device 510 or 548. In this case, two air cylinders 566 suffice for each of the CS mounting and removing devices 342, 348, which leads to reducing the production cost of the present CC mounting system 308. In the case where the two air cylinders 566 are provided on the main members 520, 522, respectively, it can be said that the air cylinders 566 belong to the CS holding device 510 or 548.

Similarly, it is possible that the CS-clamping air cylinders 650 of the CS supporting device 330 be fixed to the main member 610 thereof, or that the drive levers 652 be fixed to the rotatable axis members 624 with the help of pins.

The CS support plates 440 of the CS HCI or HCO device 340 or 346 may be provided by three or more plate-like members which may be separate from one another in the CS carrying direction.

Referring next to FIGS. 39 to 44, there will be described a fourth embodiment of the present invention, which also relates to a CC mounting system and a CC mounting method. In the present CC mounting system 798, a CC-holding-device moving device of a CS mounting device 800 and a CC-holding-device moving device of a CS removing device 802 have a common drive source.

The present CC mounting system 798 is similar to the third CC mounting system 308, except that the CS mounting and removing devices 800, 802 of the fourth system 798 are different from those 342, 348 of the third system 308. The following description relates to only the differences between the third and fourth systems 308, 798.

Figure 39:
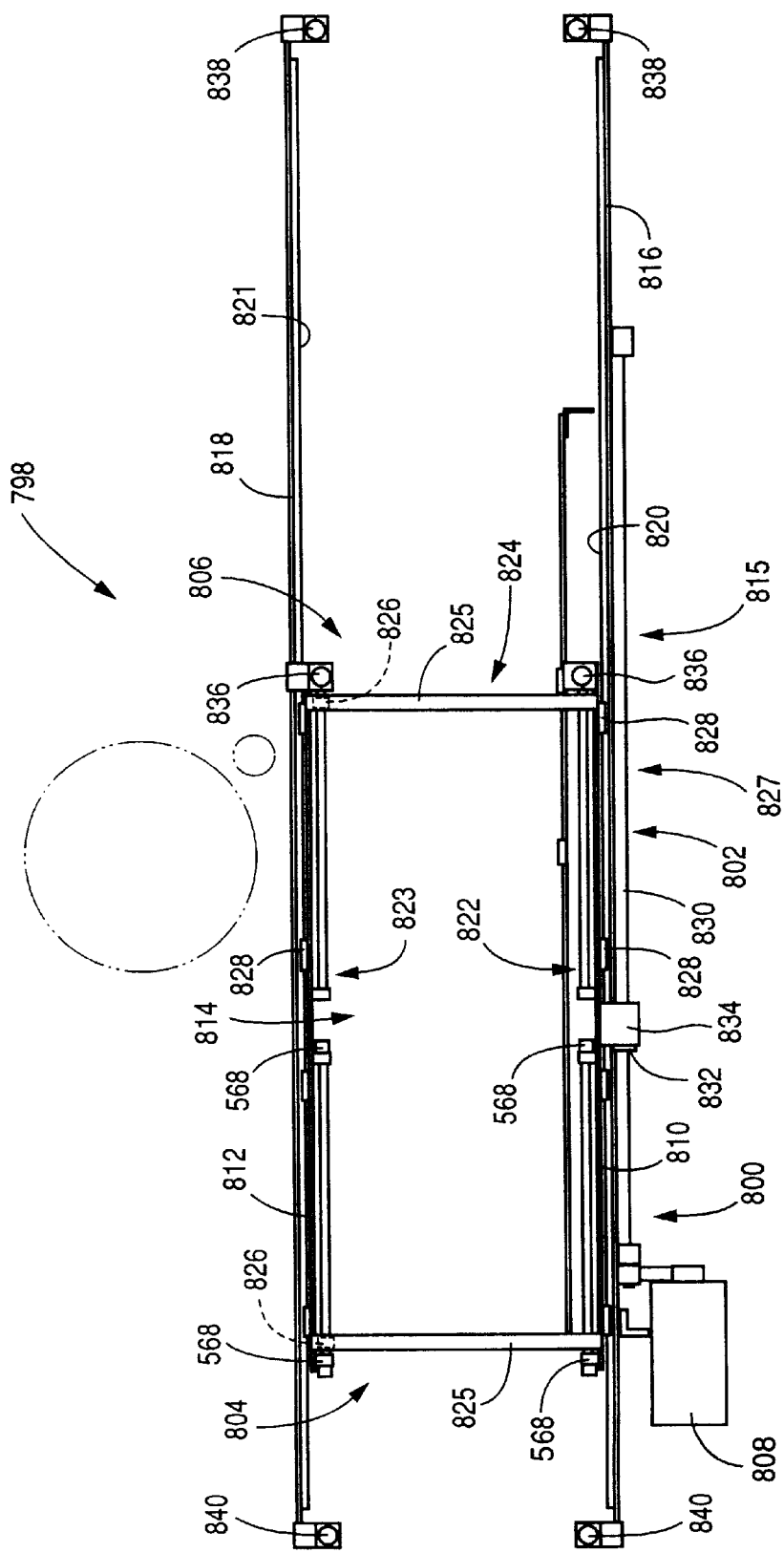
FIG. 39 is a plan view of a CS mounting and removing device of another CC mounting system as a fourth embodiment of the present invention.

As shown in FIG. 39, in the present CC mounting system 798, the CS mounting device 800 and the CS removing device 802 are provided as a Unit such that a CS holding device 804 of the CS mounting device 800 and a CS holding device 806 of the CS removing device 802 are moved as a unit in a horizontal direction when a single electric motor 808 is operated. Since the two CS holding devices 804, 806 have two common main members 810, 812, those devices 804, 806 can be moved as a unit by the operation of the single motor 808. Hereinafter, the two CS holding devices 804, 806 will be referred to as a "united CS-holding device 814", and the CS mounting and removing devices 800, 802 will be referred to as a "CS mounting/removing device 815".

In the present embodiment, not only the two CS holding devices 804, 806 have the common main members 810, 812, but also the CS mounting and removing devices 800, 802 have two common main members 816, 818 on which two guide rails 820, 821 are provided, respectively. The united CS-holding device 814 is moved in the horizontal direction on the guide rails 820, 821.

The united CS-holding device 814 includes two pairs of pivot-type CS-holding portions 822, 823 one of which corresponds to the CS mounting device 800 and the other of which corresponds to the CS removing device 802. Each pair of CS-holding portions 822, 823 are provided on the two main members 810, 812, respectively.

In the present embodiment, the CS holding device 804 of the CS mounting device 800 does not remove any CSs, and the CS holding device 806 of the CS removing device 802 does not mount any CSs. In addition, when one of the two CS holding devices 804, 806 takes its CS holding position, the other doe not simultaneously take its CS releasing position, and vice versa.

The two main members 810, 812 of the united CS-holding device 814 are connected to each other by a connecting device 824 such that one 812 of the main members 810, 812 is movable toward, and away from, the other main member 810 in a width-wise direction of CSs and such that the two main members 810, 812 are not movable relative to each other in a CS carrying direction. The connecting device 824 includes two connecting members 825 and two sliders 826. The reason why the two connecting members 825 are employed is that the united CS-holding device 814 has a great dimension in the CS carrying direction.

A CS-holding-device moving device 827 which moves the united CS-holding device 814 in opposite directions parallel to the plane of the CSs includes, in addition to the electric motor 808 and the guide rails 820, 821, a plurality of sliders 828 which are engaged with the guide rails 820, 821, a driver-side rail 830, and a driver-side slider 832 which is connected to the main member 810 by a driver-side connecting member 834. When the electric motor 808 is operated, the driver-side slider 832 is moved along the driver-side rail 830, so that the united CS-holding device 814 is moved. Thus, in the present embodiment, the two CS holding devices 804, 806 are driven by the common CS-holding-device moving device 827 including the common drive source 808.

The united CS-holding device 814 is movable to a CS receiving position where the CS holding device 804 of the CS mounting device 800 receives CSs from a CS HCI device 340; a CS mounting position where the holding device 804 mounts the CSs on a CS supporting device 330; a CS removing position where the CS holding device 806 of the CS removing device 802 removes the CSs from the CS supporting device 330; and a CS transferring position where the CS holding device 806 transfers the CSs to a CS HCO device 346. In the present CC mounting system 798, the CS mounting and removing positions are the same position. However, the united CS-holding device 814 must be moved between the two positions.

In a state shown in FIG. 39, the CS holding device 806 of the CS removing device 802 is switchable between its CS holding state and its CS releasing state, for removing the CSs from the CS supporting device 330. This switching is done by an intermediate pair of air-operated cylinder devices 836 via a pair of motion converting devices 568 which, however, are not shown in FIG. 39. Each motion converting device 568 converts the axial movement of the piston of the corresponding air cylinder 836 into the pivotal movement of a pivotable member of the corresponding pivot-type CS-holding portion 822, 823. in a state in which another pair of motion converting devices 568 which are provided on a carry-out-side end of the CS holding device 804 of the CS mounting device 800 are aligned with the intermediate pair of air cylinders 836, respectively, the CS holding device 804 is switchable between its CS holding and releasing states, for mounting the CSs on the CS supporting device 330, by the pair of air cylinders 836 via the second pair of motion converting devices 568. Thus, the intermediate air cylinders 836 are utilized by both the two CS holding devices 804, 806.

A carry-out-side pair of air-operated cylinder devices 838 are operated when the CS holding device 806 of the CS removing device 802 transfers the CSs to the CS HCO device 346; and a carry-in-side pair of air-operated cylinder devices 840 are operated when the CS holding device 804 of the CS mounting device 800 receives the CSs from the CS HCI device 340. In the last case, a carry-in-side or third pair of motion converting devices 568 are utilized for switching the CS holding device 804 between its CS holding and releasing states.

Figure 40:
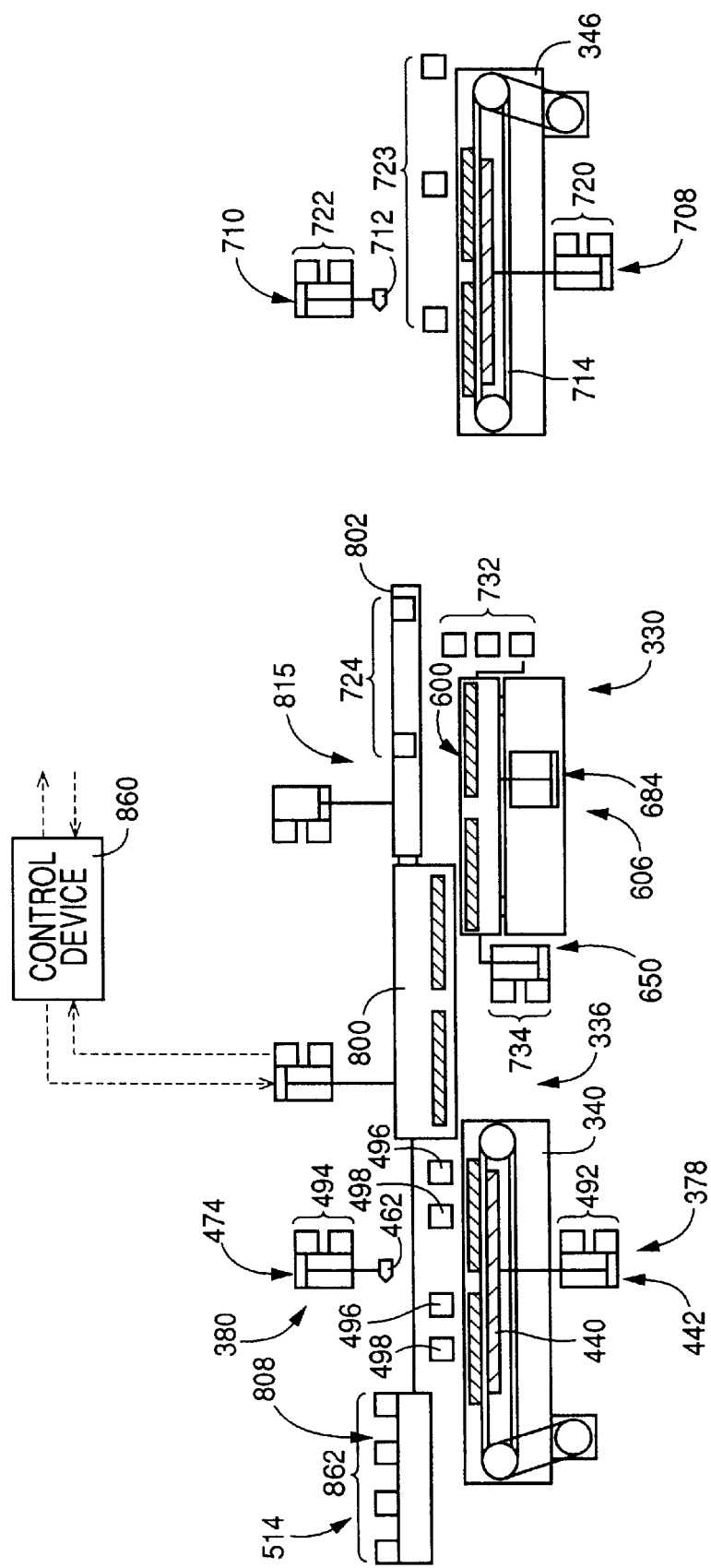
FIG. 40 is an illustrative view of a CS carrying device of the CC mounting system of FIG. 39.

In FIG. 40, a single air-operated cylinder device is connected to each of the two CS holding devices 804, 806. However, in fact, the two pairs of air cylinders 836, 838 are used for the CS holding device 804, and the two pairs of air cylinders 836, 840 are used for the CS holding device 806.

Since in the present embodiment the intermediate pair of air cylinders 836 are utilized by the CS holding device 804 of the CS mounting device 800 via the second pair of motion converting devices 568 provided at the carry-outside end of the CS holding device 804, it is not needed to provide an additional pair of air cylinders at respective positions where the third pair of motion converting devices 568 provided at the carry-in-side end of the CS holding device 804 are positioned when the CS holding device 804 is positioned at the CS mounting position.

Although in the present embodiment the two pairs of motion converting devices 568 are provided on the CS holding device 804 of the CS mounting device 800, it is possible to provide two pairs of motion converting devices 568 on the CS holding device 806 of the CS removing device 802.

The present CC mounting system 798 includes a control device 860, shown in FIG. 40, which controls the CS transferring operation of the system 798.

When the united CS-holding device 814 is moved by the electric motor 808, a CS-holding-device position sensor 862 detects that the united CS-holding device 814 is moved to each of the CS receiving, mounting, removing, and transferring positions in the CS carrying direction. The description of the manner of operation of the sensor 862 is omitted.

Figure 41:
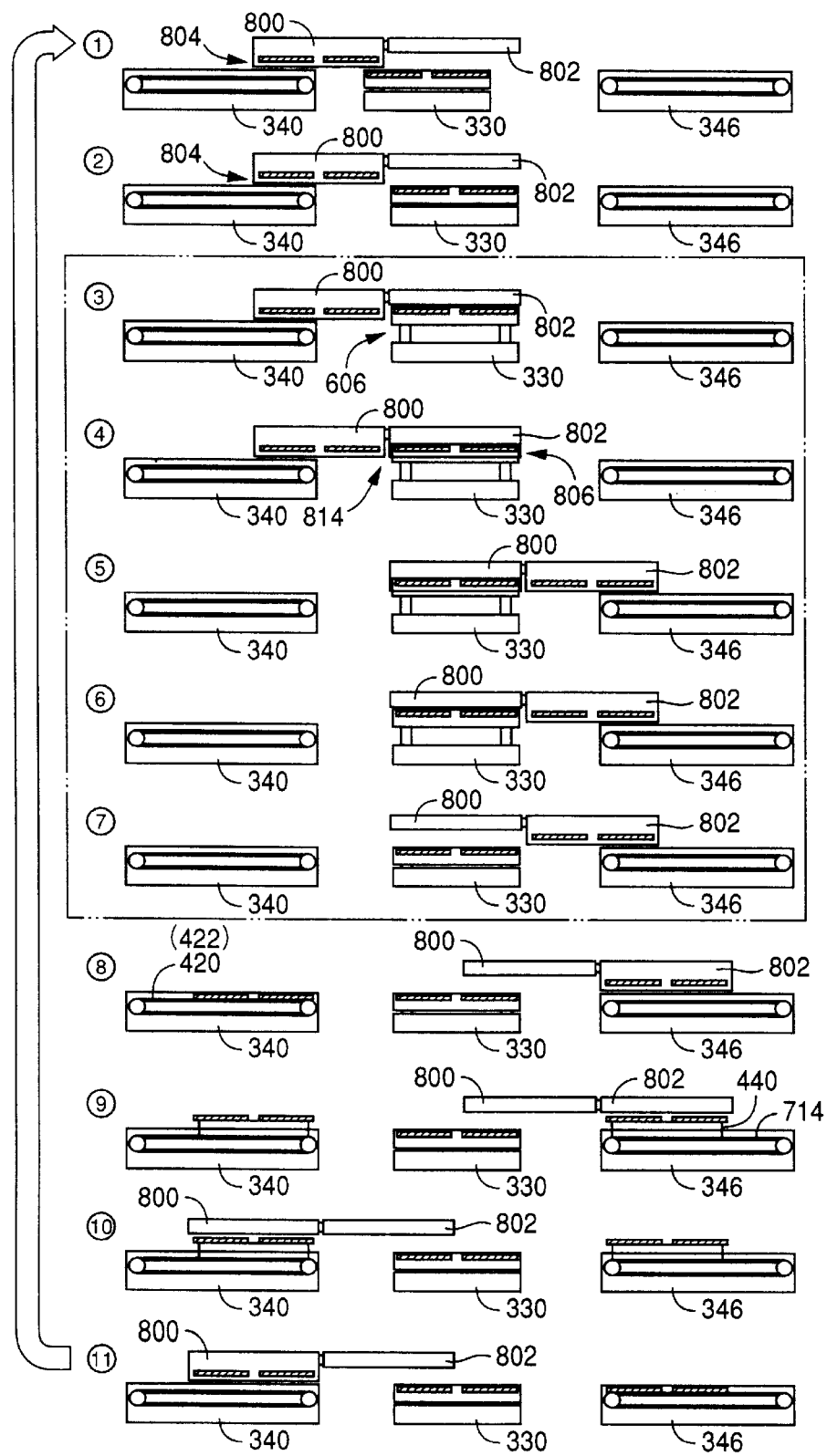
FIG. 41 is a view showing various steps of a CS transferring operation of the CC mounting system of FIG. 39.
Figure 42:
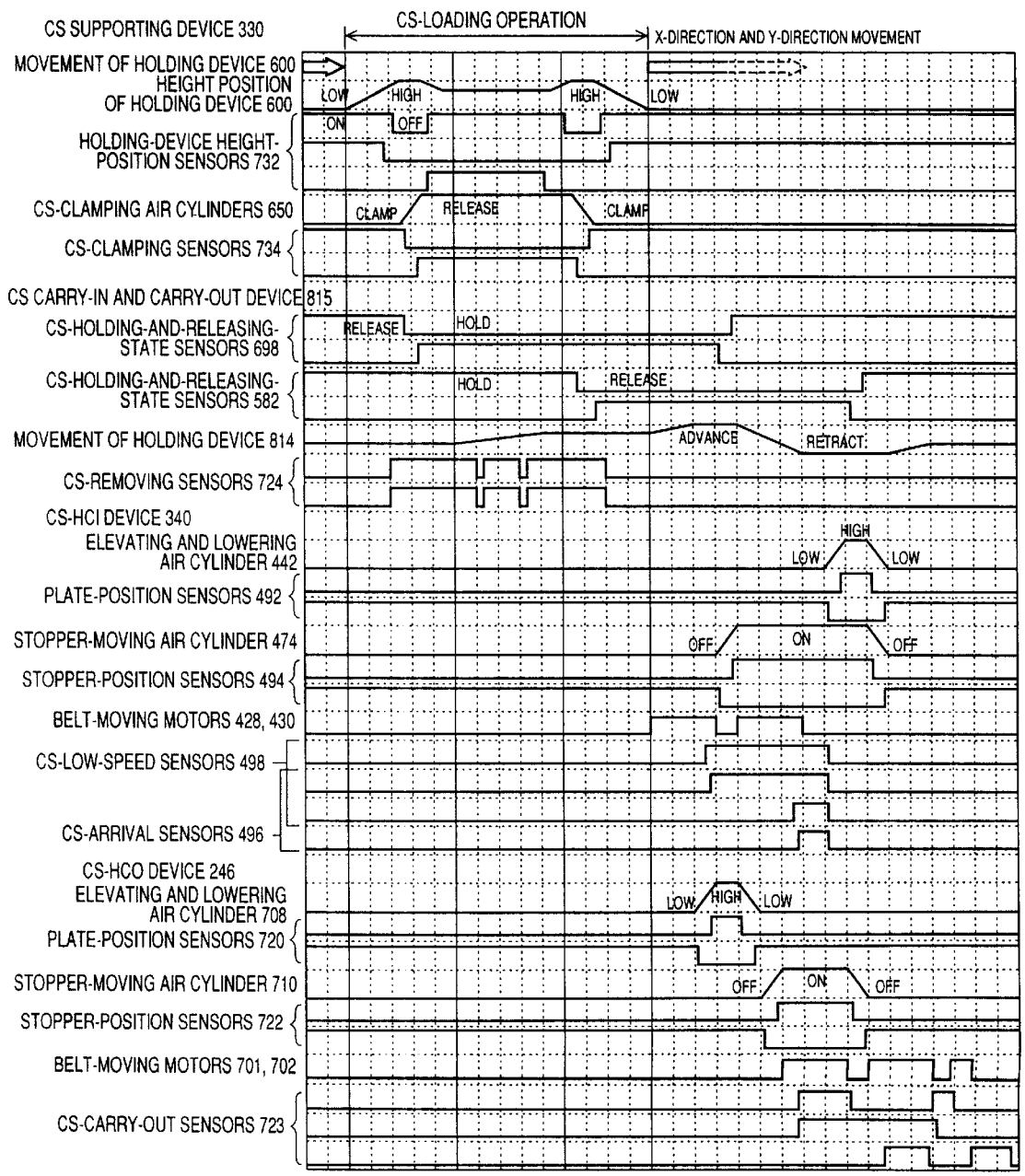
FIG. 42 is a time chart representing respective actions of various elements of the CC mounting system of FIG. 39 during the CS transferring operation thereof.

Hereinafter, there will be described the operation of the CC mounting system 798 by reference to FIGS. 41 and 42.

In the present embodiment, the respective CS holding devices 804, 806 of the CS mounting and removing devices 800, 802 are moved as a unit by being driven by the electric motor 808. The control device 860 controls this operation of the motor 808, which is not performed in the third CC mounting system 308. On the other hand, the control device 860 controls the respective flow rates of the air cylinders 836, 838, 840 in the same manner as described above for the air cylinders 442, 474, 530, 546, 566, 650, 676, 708, 710 of the third system 308.

In the first to fourth steps, the united CS-holding device 814 is moved such that the CS holding device 806 is moved to the CS removing position where the CS holding device 806 removes two CSs from the CS supporting device 330. In the fifth step, the united CS-holding device 814 is moved such that the CS holding device 804 is moved to the CS mounting position where, like in the third system 308, a main CS-holding device 600 is held at its horizontal-movement height position lower than its CS-mounting height position, so as not to interfere with the movement of the CS-holding device 804. In the sixth and seventh steps, the CSs held by the CS holding device 804 are mounted on the CS supporting device 330, and the main CS-holding device 600 is moved down to its CC-mounting height position and is further moved to a CC mounting position.

In the present CC mounting system 798, the CS mounting position and the CS removing position are the same position. However, the position of the united CS-holding device 814 relative to the stationary members of the system 798 when the CS holding device 804 is positioned at the CS mounting position is different from that when the holding device 806 is positioned at the CS removing position. Therefore, the united CS-holding device 814 must be moved between the CS mounting and removing positions.

In the present embodiment, the main CS-holding device 600 of the CS supporting device 330 may be immovable in the CS carrying direction, and is movable in only opposite directions perpendicular to the CS carrying direction.

Subsequently, in the eighth and ninth steps, the CS holding device 806 is moved to the CS transferring position where the CS holding device 806 transfers the CSs to the CS HCO device 346. In the tenth step, the CS holding device 804 is moved to the CS receiving position. The tenth step is the step which is not performed in the third system 308 and results from the feature that the two CS holding devices 804, 806 are provided as the united CS-holding device 814. The movement from the CS transferring position at the ninth step to the CS receiving position at the tenth step is the longest stroke of the united CS-holding device 814. However, since neither of the two CS holding devices 804, 806 holds any CSs, the united CS-holding device 814 can be moved at a high speed, that is, in a short time. In addition, since the longest-stroke movement is done while CCs are mounted on the CSs supported on the CS supporting device 330, it does not adversely influence the CC-mounting efficiency of the present system 798. In the eleventh step, the CS mounting device 800 receives another pair of CSs from the CS HCI device 340.

Since in the present embodiment the two CS holding devices 804, 806 are driven by the common electric motor 808, the present system 798 can be produced at lower cost than in the case where the two devices 804, 806 would be driven by respective exclusive electric motors. In addition, the present system 798 can reduce the total number of air cylinders 836, 838, 840 employed, as described above. Moreover, in the case where the main CS-holding device 600 of the CS supporting device 330 is immovable in the CS carrying direction, the production cost of the present system 798 can be reduced as such.

Figure 43:
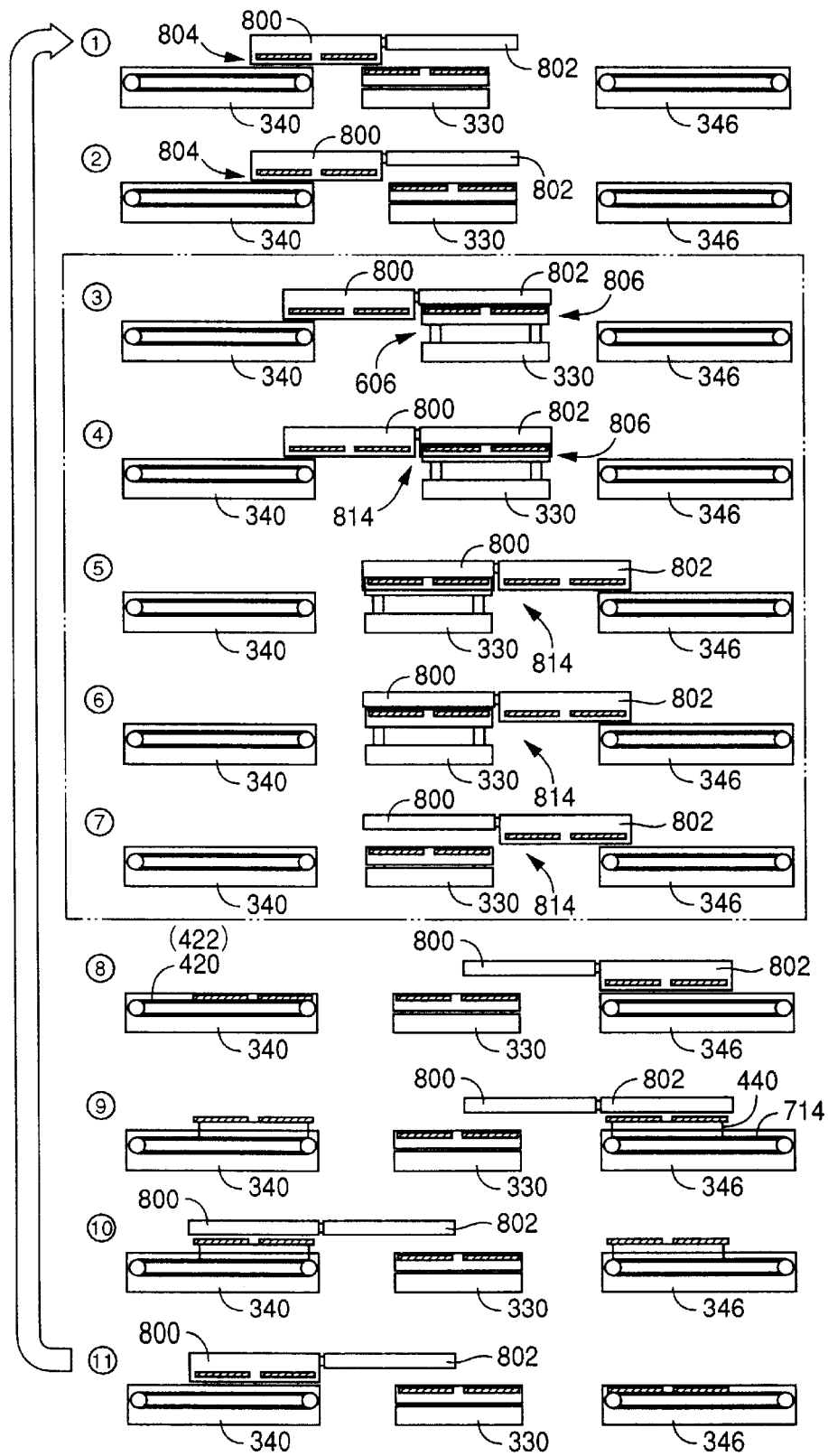
FIG. 43 is a view showing various steps of a CS transferring operation of another CC mounting system as a fifth embodiment of the present invention.
Figure 44:
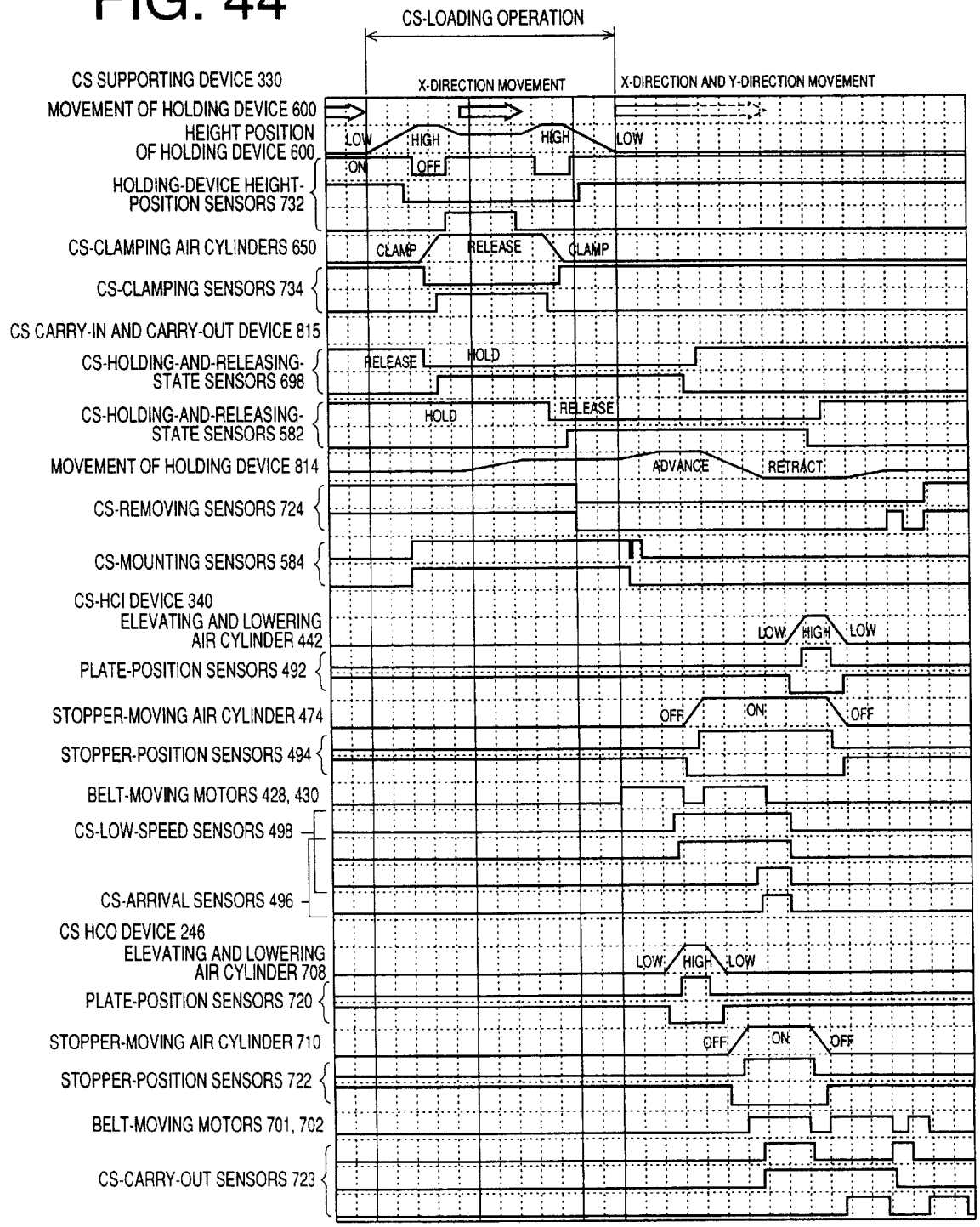
FIG. 44 is a time chart representing respective actions of various elements of the CC mounting system of FIG. 43 during the CS transferring operation thereof.
Figure 45:
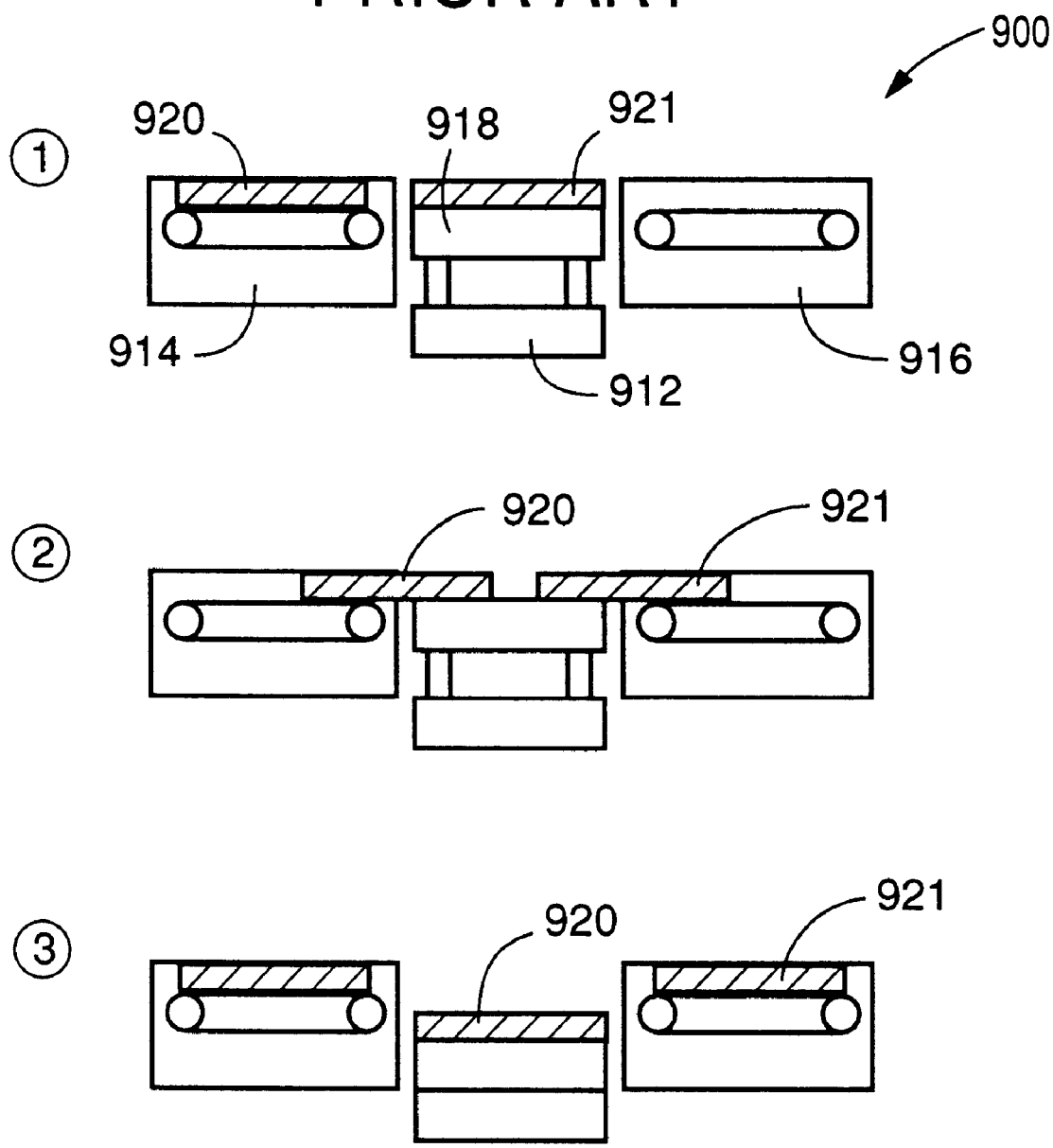
FIG. 45 is a view showing various steps of a CS transferring operation of a known CC mounting system.
Figure 46:
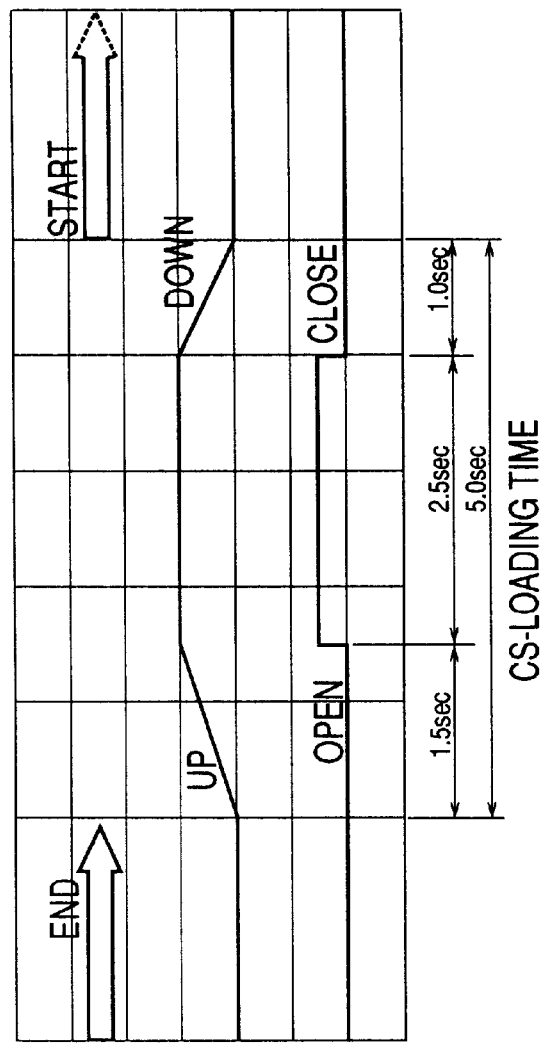
FIG. 46 is a time chart representing the steps of the operation of the known CC mounting system of FIG. 45.

FIGS. 43 and 44 illustrates another manner of operation of the present CC mounting system 798 in which the main CS-holding device 600 of the CS supporting device 330 is movable in the CS carrying direction. In the fifth step, the main CS-holding device 600 is moved toward the CS holding device 804 while the united CS-holding device 814 is moved. This manner leads to reducing the time needed for moving the united CS-holding device 814 from the CS removing position to the CS mounting, and accordingly reducing the time needed for transferring CSs.

This manner of operation requires the CC mounting system 798 to employ, in place of the intermediate pair of air-operated cylinder devices 836, two pairs of air-operated cylinder devices at respective positions which correspond to the CS mounting and removing positions, respectively. However, the present system 798 need not employ the two pairs of motion converting devices 568 for one of the two CS holding devices 804, 806, but needs to employ just one pair of motion converting devices 568 for each of the two CS holding devices 804, 806.

In the CC mounting system 798, the two CS holding devices 804, 806 have the common pair of main members 810, 812. However, the two devices 804, 804 may have respective exclusive pairs of main members. In this case, the system 798 may employ a drive-force transmitting and switching device which includes two driver-side sliders one of which is connected to the exclusive pair of main members of the CS holding device 804 and the other of which is connected to the exclusive pair of main members of the CS holding device 806; and a clutch which is switchable to a first state in which the clutch transmits the drive force of the common electric motor 808 to both of the two driver-side sliders, to a second state in which the clutch transmits the drive force to one of the two driver-side sliders, a third state in which the clutch transmits the drive force to the other driver-side slider, and a fourth state in which the clutch does not transmit the drive force to either of the two driver-side sliders. In this case, it is impossible to simultaneously move the two CS holding devices 804, 806 in the opposite directions, respectively, but it is possible to simultaneously move the two devices 804, 806 in the same direction, or to move one of the two devices 804, 806 while stopping the other device 804, 806. Thus, the tenth step of each of FIGS. 41 and 43 can be omitted.

It is to be understood that the present invention may be embodied with other changes, improvements, and modifications that may occur to the person skilled in the art without departing from the scope and spirit of the invention defined in the appended claims.

What is claimed is:

1. A system for mounting circuit components on a circuit substrate, comprising:

a circuit-substrate carrying device which carries the circuit substrate on a circuit-substrate carrying route;

a circuit-substrate supporting device which supports a lower surface of the circuit substrate which is substantially horizontal;

a circuit-component mounting device which is provided at a first position higher than a position where the circuit-substrate supporting device is provided, and which mounts, at a circuit-component mounting position offset from the circuit-substrate carrying route in a substantially horizontal direction, the circuit components on an upper surface of the circuit substrate supported by the circuit-substrate supporting device;

the circuit-substrate carrying device comprising a circuit-substrate carry-out device which removes, at a circuit-substrate removing position on the circuit-substrate carrying route, the circuit substrate on which the circuit components have been mounted by the circuit-component mounting device, from the circuit-substrate supporting device, and carries out the circuit substrate; and a supporting-device moving device which moves the circuit-substrate supporting device to the circuit-substrate removing position on the circuit-substrate carrying route and to the circuit-component mounting position offset from the circuit-substrate carrying route in said substantially horizontal direction, the circuit-substrate carry-out device comprising a circuit-substrate removing device which is provided at a second position higher than said position where the circuit-substrate supporting device is provided, and which removes, at the circuit-substrate removing position, the circuit substrate from the circuit-substrate supporting device, and a parallel-direction carry-out device which is provided at a position lower than said position where said removing device is provided, and which receives the circuit substrate from the circuit-substrate removing device and carries out the circuit substrate in a parallel direction substantially parallel to said upper surface of the circuit substrate, wherein the circuit substrate is transferred from the circuit-substrate supporting device to the circuit-substrate removing device in an upward direction substantially perpendicular to said upper surface of the circuit substrate, and is transferred from the circuit-substrate removing device to the parallel-direction carry-out device in a downward direction substantially perpendicular to said upper surface of the circuit substrate.

2. The system according to claim 1, further comprising:
a parallel-direction carry-in device which carries in said circuit substrate in the parallel direction; and
a circuit-substrate mounting device which mounts, on the circuit-substrate supporting device, the circuit substrate carried in by the parallel-direction carry-in device,
wherein the circuit substrate is transferred from the parallel-direction carry-in device to the circuit-substrate mounting device in said upward direction, and is transferred from the circuit-substrate mounting device to the circuit-substrate supporting device in said downward direction.

3. The system according to claim 2, wherein at least one of the circuit-substrate removing device and the circuit-substrate mounting device comprises a holding device which holds the circuit substrate; and a holding-device moving device which moves the holding device in the parallel direction.

4. The system according to claim 3, wherein the holding-device moving device comprises a speed control device which controls a speed a parallel-direction movement of the holding device.

5. The system according to claim 2, wherein at least one of the circuit-substrate removing device and the circuit substrate mounting device comprises a holding device which comprises (a) at least one main member, (b) a first holding member and a second holding member which include respective holding portions and which are supported by the at least one main member such that the first and second holding members are opposed to each other and at least one of the first and second holding members is movable relative to the other holding member, and (c) a holding-member moving device which moves said at least one of the first and second holding members relative to said other holding member such that the holding portion of said one holding member is moved toward, and away from, one of said holding members in a movement direction in which the first and second holding members are opposed to each other, and wherein the respective holding portions of the first and second holding members have respective circuit-substrate supporting surfaces which are positioned away from opposite end portions of the circuit substrate, respectively, in said movement direction, in a state in which the first and second holding members are positioned away from each other, and are positioned below the opposite end portions of the circuit substrate, respectively, in a state in which the first and second holding members are positioned near to each other.

6. The system according to claim 5, wherein the respective holding portions of the first and second holding members additionally have respective circuit-substrate positioning surfaces which cooperate with each other to position the circuit substrate in said movement direction, by contacting opposite side surfaces of the circuit substrate, respectively, in the state in which the first and second holding members are positioned near to each other.

7. The system according to claim 5, wherein the holding portion of the first holding member includes a plurality of first holding claws which are arranged in a direction perpendicular to the movement direction, and the holding portion of the second holding member includes a plurality of second holding claws which are arranged in an array in the direction perpendicular to said movement direction.

8. The system according to claim 5, wherein the first and second holding members comprise respective pivotable holding members which are supported by the at least one main member such that each of the pivotable holding members is pivotable about an axis line parallel to said upper surface of the circuit substrate.

9. The system according to claim 8, wherein the holding device further comprises at least one pivoting device which pivots the pivotable holding members to a holding position thereof where the pivotable holding members cooperate with each other to hold the circuit substrate and to a releasing position thereof where the pivotable holding members release the circuit substrate, wherein the at least one pivoting device comprises (a) at least one fluid-operated cylinder device which includes a housing and a piston axially movable relative to the housing, and (b) at least one motion converting device which converts an axial movement of the piston into rotation and transmits the rotation to said each of the pivotable holding members.

10. The system according to claim 2, wherein at least one of the parallel-direction carry-out device and the parallel-direction carry-in device comprises:
a pair of main members having respective inside surfaces opposed to each other;
a pair of first circuit-substrate supporting members which are attached to the respective inside surfaces of the pair of main members and which support, for a parallel-direction movement of the circuit substrate, opposite end portions of the circuit substrate, respectively, which extend parallel to a circuit-substrate carrying direction in which the circuit substrate is carried;
at least one second circuit-substrate supporting member which is provided inside the pair of first circuit-substrate supporting members, and which is movable upward and downward relative to the pair of main members; and
at least one elevating and lowering device which moves the second circuit-substrate supporting member upward and downward.

11. The system according to claim 10, wherein the at least one elevating and lowering device comprises a speed control device which controls a speed of an upward and downward movement of the at least one second circuit-substrate supporting member.

12. The system according to claim 2, wherein at least one of the parallel-direction carry-out device and the parallel-direction carry-in device comprises at least one stopping device which stops a parallel-direction movement of the circuit substrate, and wherein the at least one stopping device comprises (a) an intermediate stopper which is provided between an upstream end and a downstream end of said circuit-substrate carrying route on which the circuit substrate is carried, and which stops the parallel-direction movement of the circuit substrate, (b) a stopper supporting member which supports the intermediate stopper such that the intermediate stopper is movable to an operative position thereof where the stopper can stop the circuit substrate and to an inoperative position thereof where the stopper cannot stop the circuit substrate, and (c) a stopper moving device which moves the intermediate stopper relative to the stopper supporting member and thereby moves the intermediate stopper to each of the operative and inoperative positions thereof.

13. The system according to claim 12, wherein the at least one of the parallel-direction carry-out device and the parallel-direction carry-in device further comprises main member, and wherein the at least one stopper supporting member of the at least one stopping device is attached to the at least one main member such that a position where the stopper supporting member is attached to the main member is changeable along the circuit-substrate carrying route.

14. The system according to claim 3, wherein the holding device comprises at least one pressing member which presses said upper surface of the circuit substrate, and at least one supporting device which supports the at least one pressing member such that the at least one pressing member is movable upward and downward.

15. The system according to claim 1, wherein the circuit-substrate supporting device comprises: at least one main member; a main holding device which includes (a) at least one axis member supported by the at least one main member such that the at least one axis member is rotatable about an axis line parallel to said upper surface of the circuit substrate and (b) a plurality of clamping members which are provided on the at least one axis member such that the clamping members are not rotatable relative to the at least one axis member and each of the clamping members includes a clamping claw; and at least one rotating device which rotates the at least one axis member to a clamping position thereof where the respective clamping claws of the clamping members clamp the circuit substrate and a non-clamping position thereof where the clamping claws do not clamp the circuit substrate.

16. The system according to claim 15, wherein the at least one rotating device comprises at least one fluid-operated cylinder device which is supported by the at least one main member such that the at least one fluid-operated cylinder device is rotatable relative to the main member and which includes a piston rod; and at least one drive lever which is rotatably connected at one end portion thereof to the piston rod of the fluid-operated cylinder device and is engaged at another end portion thereof to an end portion of the at least one axis member.

17. The system according to claim 1, wherein each of the circuit-substrate supporting device and the circuit-substrate carry-out device supports opposite end portions of the lower surface of the circuit substrate that are opposite to each other in a direction perpendicular to the circuit-substrate carrying route.

18. A system for mounting circuit components on a circuit substrate, comprising:

a circuit-substrate carrying device which carries the circuit substrate on a circuit-substrate carrying route;

a circuit-substrate supporting device which supports a lower surface of the circuit substrate which is substantially horizontal;

a circuit-component mounting device which is provided at a position higher than a position where the circuit-substrate supporting device is provided, and which mounts, at a circuit-component mounting position offset from the circuit-substrate carrying route in a substantially horizontal direction, the circuit components on an upper surface of the circuit substrate supported by the circuit-substrate supporting device;

the circuit-substrate carrying device comprising a circuit-substrate carry-in device which carries in the circuit substrate and mounts, at a circuit-substrate mounting position on the circuit-substrate carrying route, the circuit substrate on the circuit-substrate supporting device;

the circuit-substrate carrying device further comprising a circuit-substrate carry-out device which removes, at a circuit-substrate removing position on the circuit-substrate carrying route, the circuit substrate on which the circuit components have been mounted by the circuit-component mounting device, from the circuit-substrate supporting device, and carries out the circuit substrate; and a supporting-device moving device which moves the circuit-substrate supporting device to the circuit-substrate mounting position on the circuit-substrate carrying route, to the circuit-substrate removing position on the circuit-substrate carrying route, and to the circuit-component mounting position offset from the circuit-substrate carrying route in said substantially horizontal direction, the circuit-substrate carry-in device comprising (A) a parallel-direction carry-in device which carries in the circuit substrate in a parallel direction substantially parallel to said upper surface of the circuit substrate, and (B) a circuit-substrate mounting device including (b1) a first holding device which is provided at a position higher than a position where the parallel-direction carry-in device is provided, and which holds the circuit substrate in a state in which the circuit substrate can be transferred in each of an upward direction substantially perpendicular to said upper surface of the circuit substrate and a downward direction substantially perpendicular to said upper surface of the circuit substrate, and (b2) a first-holding-device moving device which moves the first holding device in said parallel direction, wherein the first holding device receives, at a circuit-substrate receiving position on the circuit-substrate carrying route, the circuit substrate carried in by the parallel-direction carry-in device, in said upward direction, and mounts the circuit substrate on the circuit-substrate supporting device, in said downward direction, at the circuit-substrate mounting position distant from the circuit-substrate receiving position in said parallel direction, the circuit-substrate carry-out device comprising (C) a parallel-direction carry-out device which carries out the circuit substrate on which the circuit components have been mounted by the circuit-component mounting device, by moving the circuit substrate in said parallel direction, and (D) a circuit-substrate removing device including (d1) a second holding device which is provided at a position higher than a position where the parallel-direction carry-out device is provided, and which holds the circuit substrate in a state in which the circuit substrate can be transferred in each of said upward and downward directions, and (d2) a second-holding-device moving device which moves the second holding device in said parallel direction, wherein the second holding device removes, at the circuit-substrate removing position, the circuit substrate from the circuit-substrate supporting device, in said upward direction, and transfers the circuit substrate to the parallel-direction carry-out device, in said downward direction, at a circuit-substrate transferring position distant from the circuit-substrate removing position in said parallel direction on the circuit-substrate carrying route, wherein the first-holding-device moving device and the second-holding-device moving device comprise a common drive source which produces a drive force to move each of the first holding device and the second holding device.

19. The system according to claim 18, wherein each of the circuit-substrate supporting device, the circuit-substrate carry-in device, and the circuit-substrate carry-out device supports opposite end portions of the lower surface of the circuit substrate that are opposite to each other in said direction perpendicular to the circuit-substrate carrying route.

* * * * *